United States Patent
Watanabe et al.

(10) Patent No.: US 9,589,887 B2
(45) Date of Patent: Mar. 7, 2017

(54) SEMICONDUCTOR DEVICE

(71) Applicant: Renesas Electronics Corporation, Tokyo (JP)

(72) Inventors: Shinpei Watanabe, Tokyo (JP); Shinichi Uchida, Tokyo (JP); Tadashi Maeda, Tokyo (JP); Kazuo Henmi, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 14/863,264

(22) Filed: Sep. 23, 2015

(65) Prior Publication Data

US 2016/0093570 A1 Mar. 31, 2016

(30) Foreign Application Priority Data

Sep. 29, 2014 (JP) ................................. 2014-199405

(51) Int. Cl.
*H01L 23/522* (2006.01)
*H01L 23/31* (2006.01)
(Continued)

(52) U.S. Cl.
CPC ......... *H01L 23/5227* (2013.01); *H01F 38/14* (2013.01); *H01L 23/3107* (2013.01);
(Continued)

(58) Field of Classification Search
None
See application file for complete search history.

(56) References Cited

U.S. PATENT DOCUMENTS 8,378,470 B2   2/2013 Nakashiba et al.
2007/0158849 A1* 7/2007 Higashi ............... G06F 17/5068
                                                    257/758

(Continued)

FOREIGN PATENT DOCUMENTS

JP    H 11-219824 A    8/1999
JP    2011-054800 A    3/2011

OTHER PUBLICATIONS

Extended European Search Report dated Mar. 23, 2016.

*Primary Examiner* — Khaja Ahmad
(74) *Attorney, Agent, or Firm* — McGinn IP Law Group, PLLC.

(57) ABSTRACT

Dielectric breakdown is prevented between opposing two semiconductor chips, to improve the reliability of a semiconductor device. A first semiconductor chip has a wiring structure including a plurality of wiring layers, a first coil formed in the wiring structure, and an insulation film formed over the wiring structure. A second semiconductor chip has a wiring structure including a plurality of wiring layers, a second coil formed over the wiring structure, and an insulation film formed over the wiring structure. The first semiconductor chip and the second semiconductor chip are stacked via an insulation sheet with the insulation film of the first semiconductor chip and the insulation film of the second semiconductor chip facing each other. The first coil and the second coil are magnetically coupled with each other. Then, in each of the first and second semiconductor chips, wires and dummy wires are formed at the uppermost-layer wiring layer.

20 Claims, 39 Drawing Sheets

(51) Int. Cl.

| | |
|---|---|
| *H01L 23/495* | (2006.01) |
| *H01L 23/528* | (2006.01) |
| *H01L 25/065* | (2006.01) |
| *H04B 5/00* | (2006.01) |
| *H01F 38/14* | (2006.01) |
| *H01L 23/48* | (2006.01) |
| *H01L 23/00* | (2006.01) |
| *H01L 25/16* | (2006.01) |

(52) U.S. Cl.
CPC ........ *H01L 23/48* (2013.01); *H01L 23/49575* (2013.01); *H01L 23/528* (2013.01); *H01L 24/05* (2013.01); *H01L 24/73* (2013.01); *H01L 25/0657* (2013.01); *H01L 25/16* (2013.01); *H01L 25/162* (2013.01); *H04B 5/0031* (2013.01); *H04B 5/0081* (2013.01); *H01L 2224/02166* (2013.01); *H01L 2224/04042* (2013.01); *H01L 2224/05554* (2013.01); *H01L 2224/32145* (2013.01); *H01L 2224/32245* (2013.01); *H01L 2224/45147* (2013.01); *H01L 2224/48091* (2013.01); *H01L 2224/48247* (2013.01); *H01L 2224/48465* (2013.01); *H01L 2224/49171* (2013.01); *H01L 2224/73215* (2013.01); *H01L 2224/73265* (2013.01); *H01L 2224/92147* (2013.01); *H01L 2224/92247* (2013.01); *H01L 2225/06527* (2013.01); *H01L 2924/13055* (2013.01); *H01L 2924/181* (2013.01)

(56) References Cited

U.S. PATENT DOCUMENTS

| | | | |
|---|---|---|---|
| 2008/0121881 A1* | 5/2008 | Kaneko | H01L 23/585 257/48 |
| 2011/0040909 A1 | 2/2011 | Abdulla | |
| 2011/0049693 A1* | 3/2011 | Nakashiba | H01L 23/48 257/676 |
| 2012/0212919 A1* | 8/2012 | Mano | H05K 1/185 361/782 |

* cited by examiner

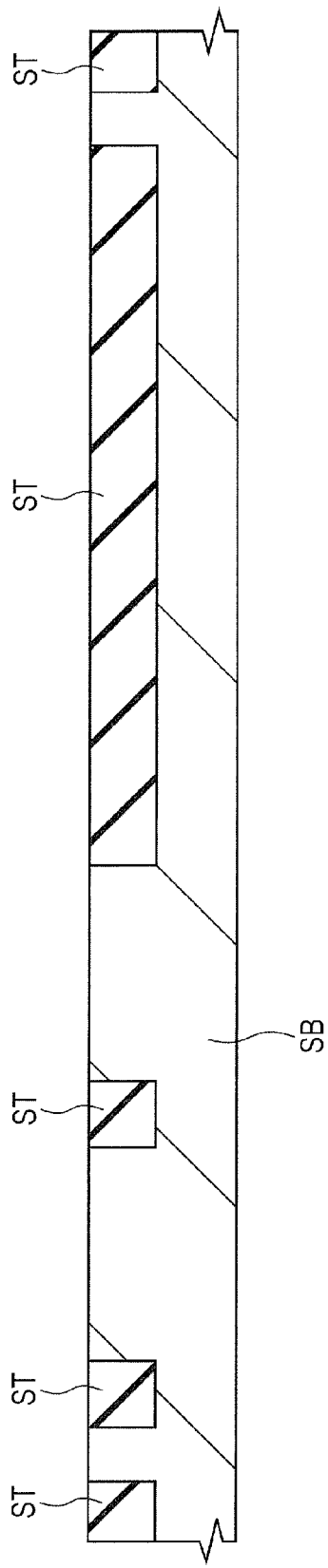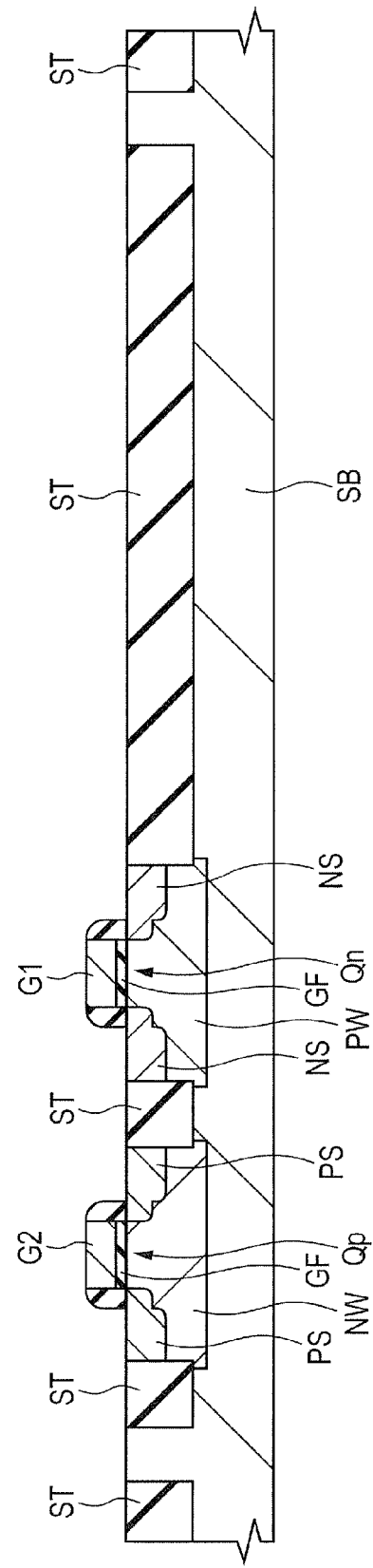

SEMICONDUCTOR DEVICE

CROSS-REFERENCE TO RELATED APPLICATIONS

The disclosure of Japanese Patent Application No. 2014-199405 filed on Sep. 29, 2014 including the specification, drawings and abstract is incorporated herein by reference in its entirety.

BACKGROUND

The present invention relates to a semiconductor device, and is preferably applicable to, for example, a semiconductor device formed of oppositely arranged two semiconductor chips each having an inductor formed therein.

As a technology of transmitting electric signals between two circuits different in potential of an electric signal to be inputted from each other, there is a technology using a photocoupler. The photocoupler has a light emitting element such as a light emitting diode, and a light receiving element such as a phototransistor. Thus, the photocoupler converts the received electric signal into a light at the light emitting element, and returns the light to an electric signal at the light receiving element, thereby to transmit electric signals.

In contrast, development has been done on a technology of establishing a magnetic coupling (inductive coupling) between two inductors, and thereby transmitting electric signals.

Japanese Unexamined Patent Application Publication No. Hei 11(1999)-219824 (Patent Document 1) discloses a technology regarding a surface mounting type balance transformer.

In Japanese Unexamined Patent Application Publication No. 2011-54800 (Patent Document 2), there is disclosed a technology regarding a semiconductor device in which inductors are formed in a first semiconductor chip and a second semiconductor chip, respectively, and signal transmission between the chips is performed using inductive coupling of the inductors. Then, in Patent Document 2, it is described that an insulating adhesive layer may also be provided between the two semiconductor chips.

PATENT DOCUMENTS

Patent Document 1

Japanese Unexamined Patent Application Publication No. Hei 11(1999)-219824

Patent Document 2

Japanese Unexamined Patent Application Publication No. 2011-54800

SUMMARY

In a semiconductor device in which two semiconductor chips each including an inductor formed therein are arranged opposite to each other, and electric signals are transmitted by magnetic coupling, dielectric breakdown may be caused between the chips.

Other objects and novel features will be apparent from the description of this specification and the accompanying drawings.

In accordance with one embodiment, a semiconductor device has a first semiconductor chip and a second semiconductor chip stacked one over another via an insulation sheet. The first semiconductor chip has a first wiring structure including one or more layers of wiring layers, a first coil formed in the first wiring structure, and a first insulation film formed over the first wiring structure. The second semiconductor chip has a second wiring structure including one or more layers of wiring layers, a second coil formed in the second wiring structure, and a second insulation film formed over the second wiring structure. The first semiconductor chip and the second semiconductor chip are stacked one over another via the insulation sheet with the first insulation film of the first semiconductor chip and the second insulation film of the second semiconductor chip facing each other. The first coil and the second coil are magnetically coupled with each other. Then, first wires and first dummy wires are formed at a first uppermost-layer wiring layer of the uppermost-layer wiring layer of the first wiring structure; and second wires and second dummy wires are formed at a second uppermost-layer wiring layer of the uppermost-layer wiring layer of the second wiring structure.

In accordance with one embodiment, it is possible to improve the reliability of a semiconductor device.

BRIEF DESCRIPTION OF THE DRAWINGS

FIG. 20 is a cross sectional view of the semiconductor chip of one embodiment during a manufacturing step;

FIG. 21 is a cross sectional view of the semiconductor chip during a manufacturing step following FIG. 20;

DETAILED DESCRIPTION

Figure 1:
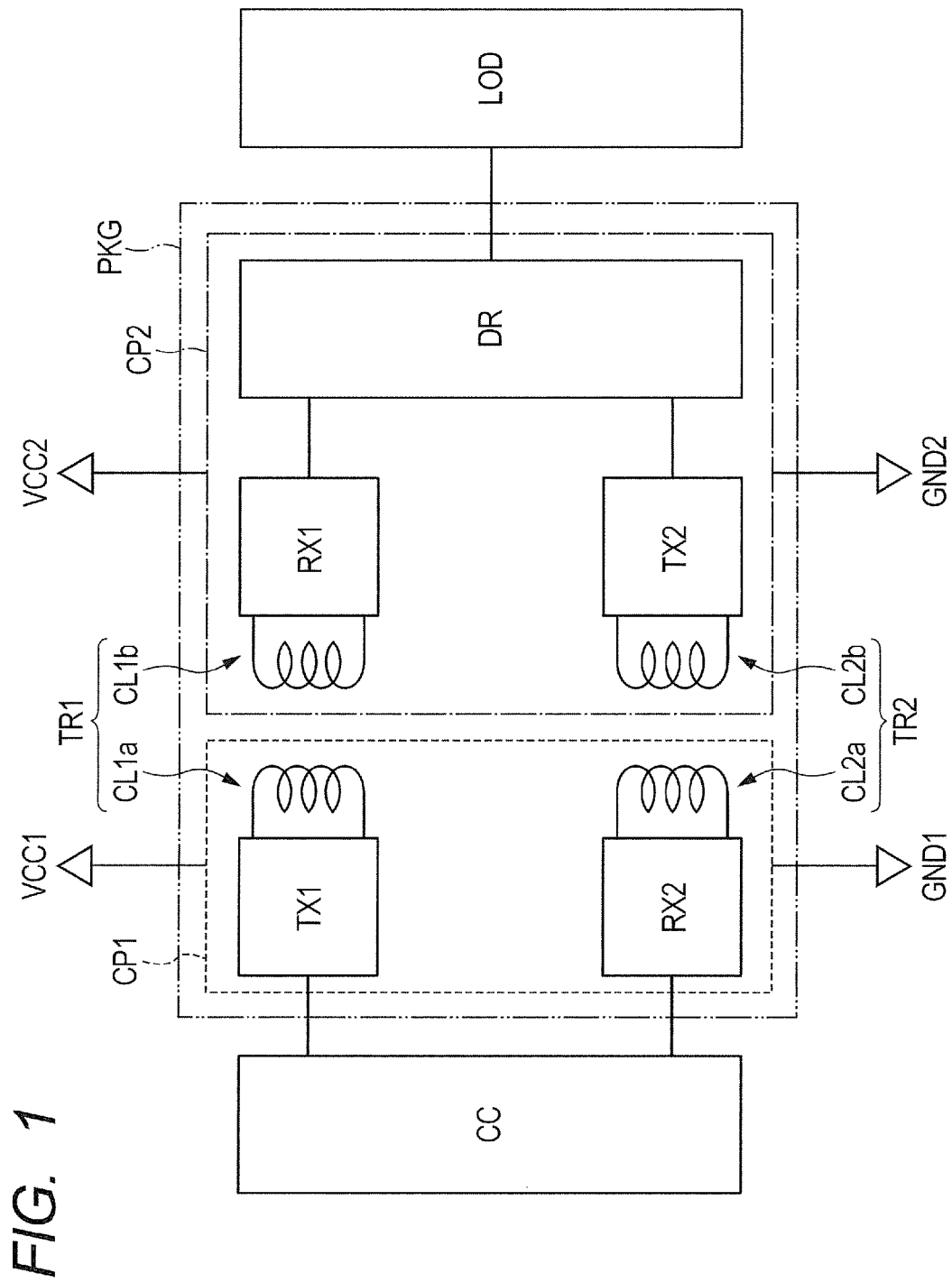
FIG. 1 is a circuit diagram showing one example of an electronic device using a semiconductor device of one embodiment.

In description of the following embodiment, the embodiment may be described in a plurality of divided sections or embodiments for convenience, if required. However, unless otherwise specified, these are not independent of each other, but are in a relation such that one is a modified example, details, a complementary explanation, or the like of a part or the whole of the other. Further, in the following embodiments, when a reference is made to the number of elements, and the like (including number, numerical value, quantity, range, or the like), the number of elements, or the like is not limited to the specific number, but may be greater than or less than the specific number, unless otherwise specified, except for the case where the number is apparently limited to the specific number in principle, or except for other cases. Further, in the following embodiments, it is needless to say that the constitutional elements (including element steps, or the like) are not always essential, unless otherwise specified, and except for the case where they are apparently considered essential in principle, or except for other cases. Similarly, in the following embodiments, when a reference is made to the shapes, positional relationships, or the like of the constitutional elements, or the like, it is understood that they include ones substantially analogous or similar to the shapes or the like, unless otherwise specified, and unless otherwise considered apparently in principle, or except for other cases. This also applies to the foregoing numerical values and ranges.

Below, the embodiments will be described in details by reference to the accompanying drawings. Incidentally, in all the drawings for describing the following embodiments, those having the same function are given the same reference signs and numerals, and a repeated description thereon is omitted. Further, in the following embodiments, a description on the same or similar part will not be repeated in principle unless otherwise required.

Further, in drawings for use in the embodiments, hatching may be omitted even in cross section for ease of understanding of the drawing. Whereas, hatching may be added even in plan view for ease of understanding of the drawing.

First Embodiment

Regarding Circuit Configuration

FIG. 1 is a circuit diagram showing one example of an electronic device (semiconductor device) using a semiconductor device of one embodiment. Incidentally, in FIG. 1, the portion surrounded by a dotted line is formed in a semiconductor chip CP1, the portion surrounded by an alternate long and short dash line is formed in a semiconductor chip CP2, and the portion surrounded by a two-dot chain line is formed in a semiconductor package PKG.

The electronic device shown in FIG. 1 includes a semiconductor package (semiconductor device) PKG internally including semiconductor chips (semiconductor devices) CP1 and CP2. In the semiconductor chip CP1, a transmission circuit TX1 and a reception circuit RX2 are formed. In the semiconductor chip CP2, a reception circuit RX1, a transmission circuit TX2, and a driving circuit DR are formed. Further, the electronic device shown in FIG. 1 also has a control circuit CC. The control circuit CC is formed in a separate semiconductor chip provided outside the semiconductor package PKG.

The transmission circuit TX1 and the reception circuit RX1 are each a circuit for transmitting a control signal from the control circuit CC to the driving circuit DR. Whereas, the transmission circuit TX2 and the reception circuit RX2 are each a circuit for transmitting a signal from the driving circuit DR to the control circuit CC. The control circuit CC controls or drives the driving circuit DR. The driving circuit DR drives a load LOD. The semiconductor chips CP1 and CP2 are internally included in the semiconductor package PKG. The load LOD is provided outside the semiconductor package PKG.

The circuits in the semiconductor chip CP1 including the transmission circuit TX1 and the reception circuit RX2 are supplied with a power supply voltage VCC1, and are grounded by a ground voltage GND1. Whereas, the circuits in the semiconductor chip CP2 including the transmission circuit TX2 and the reception circuit RX1 are supplied with a power supply voltage VCC2, and are grounded by a ground voltage GND2. The power supply voltage VCC1 and the power supply voltage VCC2 may be an equal voltage to each other, or may be different voltages. The ground voltage GND1 and the ground voltage GND2 may also be similarly an equal voltage to each other, or may also be different voltages.

A transformer (transducer, magnetic coupling element, or electromagnetic coupling element) TR1 formed of magnetically coupled (inductively coupled) coils (inductors) CL1a and CL1b is interposed between the transmission circuit TX1 and the reception circuit RX1. Thus, a signal can be transmitted from the transmission circuit TX1 to the reception circuit RX1 via the transformer TR1 (i.e., via the magnetically coupled coils CL1a and CL1b). As a result, the reception circuit RX1 in the semiconductor chip CP2 can receive the signal transmitted from the transmission circuit TX1 in the semiconductor chip CP1. Therefore, the control circuit CC can transmit a signal (control signal) to the driving circuit DR via the transmission circuit TX1, the transformer TR1, and the reception circuit RX1.

Of the coils CL1a and CL1b forming the transformer TR1, the coil CL1a is formed in the semiconductor chip CP1, and the coil CL1b is formed in the semiconductor chip CP2. Namely, the transformer TR1 is formed of the coil CL1a formed in the semiconductor chip CP1, and the coil CL1b formed in the semiconductor chip CP2. The coil CL1a and the coil CL1b can also be each regarded as an inductor. Whereas, the transformer TR1 can also be regarded as a magnetic coupling element.

Further, a transformer (transducer, magnetic coupling element, or electromagnetic coupling element) TR2 formed of magnetically coupled (inductively coupled) coils (inductors) CL2a and CL2b is interposed between the transmission circuit TX2 and the reception circuit RX2. Thus, a signal can be transmitted from the transmission circuit TX2 to the reception circuit RX2 via the transformer TR2 (i.e., via the magnetically coupled coils CL2b and CL2a). As a result, the reception circuit RX2 in the semiconductor chip CP1 can receive the signal transmitted from the transmission circuit TX2 in the semiconductor chip CP2. Therefore, the driving circuit DR can transmit a signal to the control circuit CC via the transmission circuit TX2, the transformer TR2, and the reception circuit RX2.

Of the coils CL2b and CL2a forming the transformer TR2, the coil CL2a is formed in the semiconductor chip CP1, and the coil CL2b is formed in the semiconductor chip CP2. Namely, the transformer TR2 is formed of the coil CL2a formed in the semiconductor chip CP1, and the coil CL2b formed in the semiconductor chip CP2. The coil CL2b and the coil CL2a can also be each regarded as an inductor. Whereas, the transformer TR2 can also be regarded as a magnetic coupling element The transformer TR1 is formed of the coil CL1a formed in the semiconductor chip CP1, and the coil CL1b formed in the semiconductor chip CP2. The coil CL1a and the coil CL1b are not connected by a conductor, but are magnetically coupled with each other. For this reason, when a current passes through the coil CL1a, an induced electromotive force is generated in the coil CL1b according to a change in the current, so that an induced current passes therethrough. The coil CL1a is a primary coil, and the coil CL1b is a secondary coil. Using this, a signal is transmitted from the transmission circuit TX1 to the coil CL1a (primary coil) of the transformer TR1, thereby to pass a current. The induced current (or the induced electromotive force) generated accordingly in the coil CL1b (secondary coil) of the transformer TR1 is detected (received) by the reception circuit RX1. As a result, a signal in response to the signal transmitted from the transmission circuit TX1 can be received by the reception circuit RX1.

Whereas, the transformer TR2 is formed of the coil CL2b formed in the semiconductor chip CP2, and the coil CL2a formed in the semiconductor chip CP1. The coil CL2b and the coil CL2a are not connected by a conductor, but are magnetically coupled with each other. For this reason, when a current passes through the coil CL2b, an induced electromotive force is generated in the coil CL2a according to a change in the current, so that an induced current passes therethrough. The coil CL2b is a primary coil, and the coil CL2a is a secondary coil. Using this, a signal is transmitted from the transmission circuit TX2 to the coil CL2b (primary coil) of the transformer TR2, thereby to pass a current. The induced current (or the induced electromotive force) generated accordingly in the coil CL2a (secondary coil) of the transformer TR2 is detected (received) by the reception circuit RX2. As a result, a signal in response to the signal transmitted from the transmission circuit TX2 can be received by the reception circuit RX2.

Through the path from the transmission circuit TX1 via the transformer TR1 to the reception circuit RX1, and the path from the transmission circuit TX2 via the transformer TR2 to the reception circuit RX2, transmission and reception of signals are performed between the semiconductor chip CP1 and the semiconductor chip CP2. Namely, the signal transmitted by the transmission circuit TX1 is received by the reception circuit RX1. The signal transmitted from the transmission circuit TX2 is received by the reception circuit RX2. As a result, transmission and reception of signals can be performed between the semiconductor chip CP1 and the semiconductor chip CP2. As described above, for the transmission of a signal from the transmission circuit TX1 to the reception circuit RX1, the transformer TR1 (i.e., the magnetically coupled coils CL1a and CL1b) is interposed. Whereas, for the transmission of a signal from the transmission circuit TX2 to the reception circuit RX2, the transformer TR2 (i.e., the magnetically coupled coils CL2b and CL2a) is interposed. The driving circuit DR can drive the load LOD in response to the signal transmitted from the semiconductor chip CP1 to the semiconductor chip CP2 (i.e., the signal transmitted from the transmission circuit TX1 via the transformer TR1 to the reception circuit RX1). The loads LOD include various loads according to the intended use. Examples thereof may include a motor, and an inverter for motor driving.

The semiconductor chip CP1 and the semiconductor chip CP2 are different in voltage level (reference potential) from each other. For example, the semiconductor chip CP1 is coupled to a low voltage region having a circuit (e.g., the control circuit CC) operated or driven with a low voltage (e.g., several V to several tens V) via a wire BW, a lead LD, and the like described later. Whereas, the semiconductor chip CP2 is coupled with a high voltage region having a circuit (e.g., the load LOD) operated or driven with a higher voltage (e.g., 100 V or more) than the low voltage via a wire BW, a lead LD, and the like described later. However, the transmission of signals between the semiconductor chips CP1 and CP2 is performed through the transformers TR1 and TR2. This enables the transmission of signals between different voltage circuits.

In the transformer TR1 or TR2, a large potential difference may be caused between the primary coil and the secondary coil. Conversely, a large potential difference may be caused, and hence, a primary coil and a secondary coil not connected by a conductor, but magnetically coupled with each other are used for the transmission of signals. For this reason, the dielectric breakdown voltage between the coil CL1$a$ and the coil CL1$b$ is maximized for the formation of the transformer TR1. This is important for improving the reliability of the semiconductor package PKG internally including the semiconductor chips CP1 and CP2 therein, or an electronic device using the same. Whereas, the dielectric breakdown voltage between the coil CL2$b$ and the coil CL2$a$ is maximized for the formation of the transformer TR2. This is important for improving the reliability of the semiconductor package PKG internally including the semiconductor chips CP1 and CP2 therein, or an electronic device using the same.

Incidentally, FIG. 1 shows the case where the control circuit CC is internally included in a semiconductor chip other than the semiconductor chips CP1 and CP2. However, as another form, the control circuit CC can also be internally included in the semiconductor chip CP1. Further, FIG. 1 shows the case where the driving circuit DR is internally included in the semiconductor chip CP2. However, as another form, the driving circuit DR can also be internally included in a semiconductor chip other than the semiconductor chips CP1 and CP2.

<Regarding Signal Transmission Example>

Figure 2:
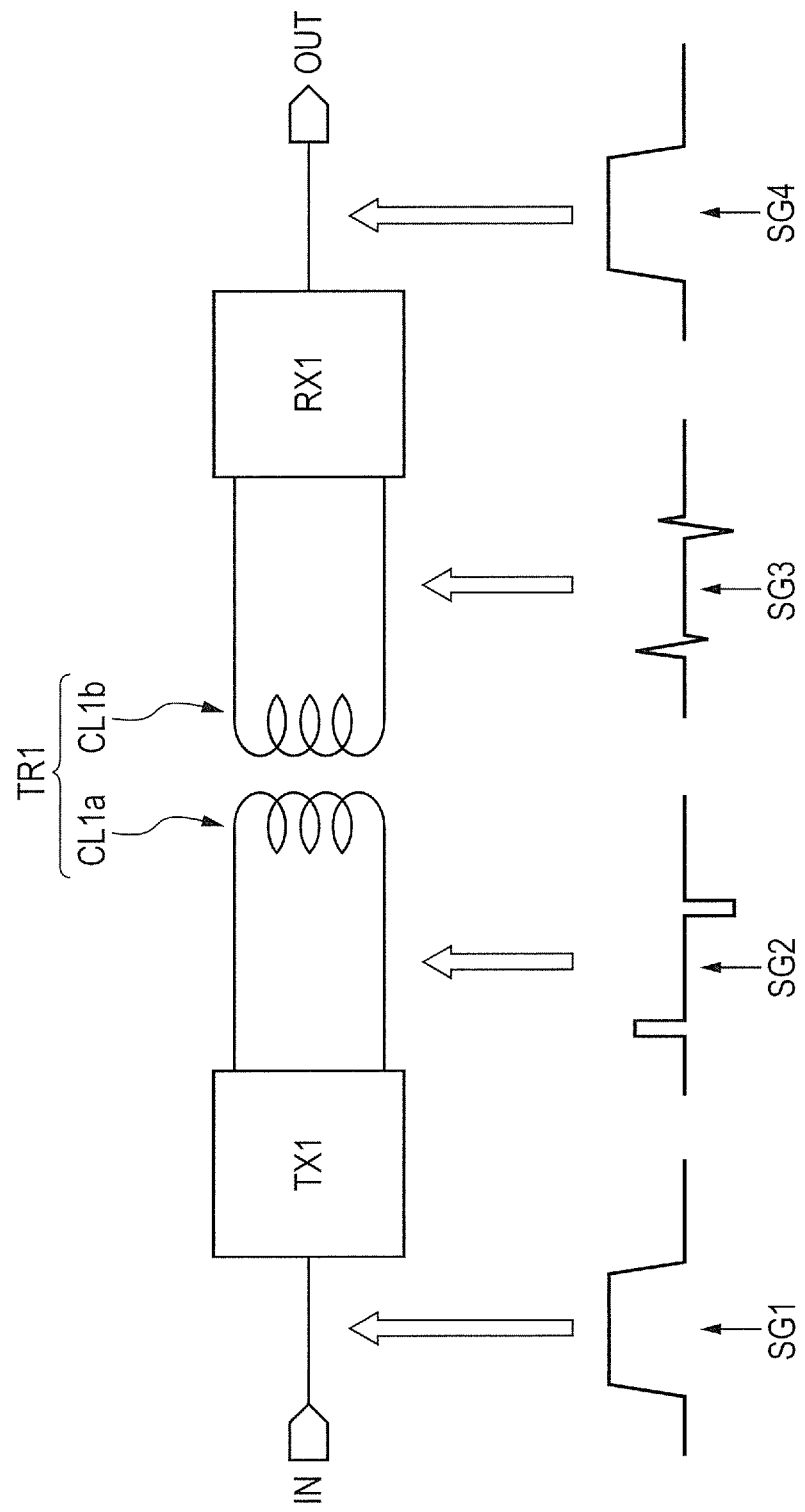
FIG. 2 is an explanatory view showing a signal transmission example.
Figure 3:
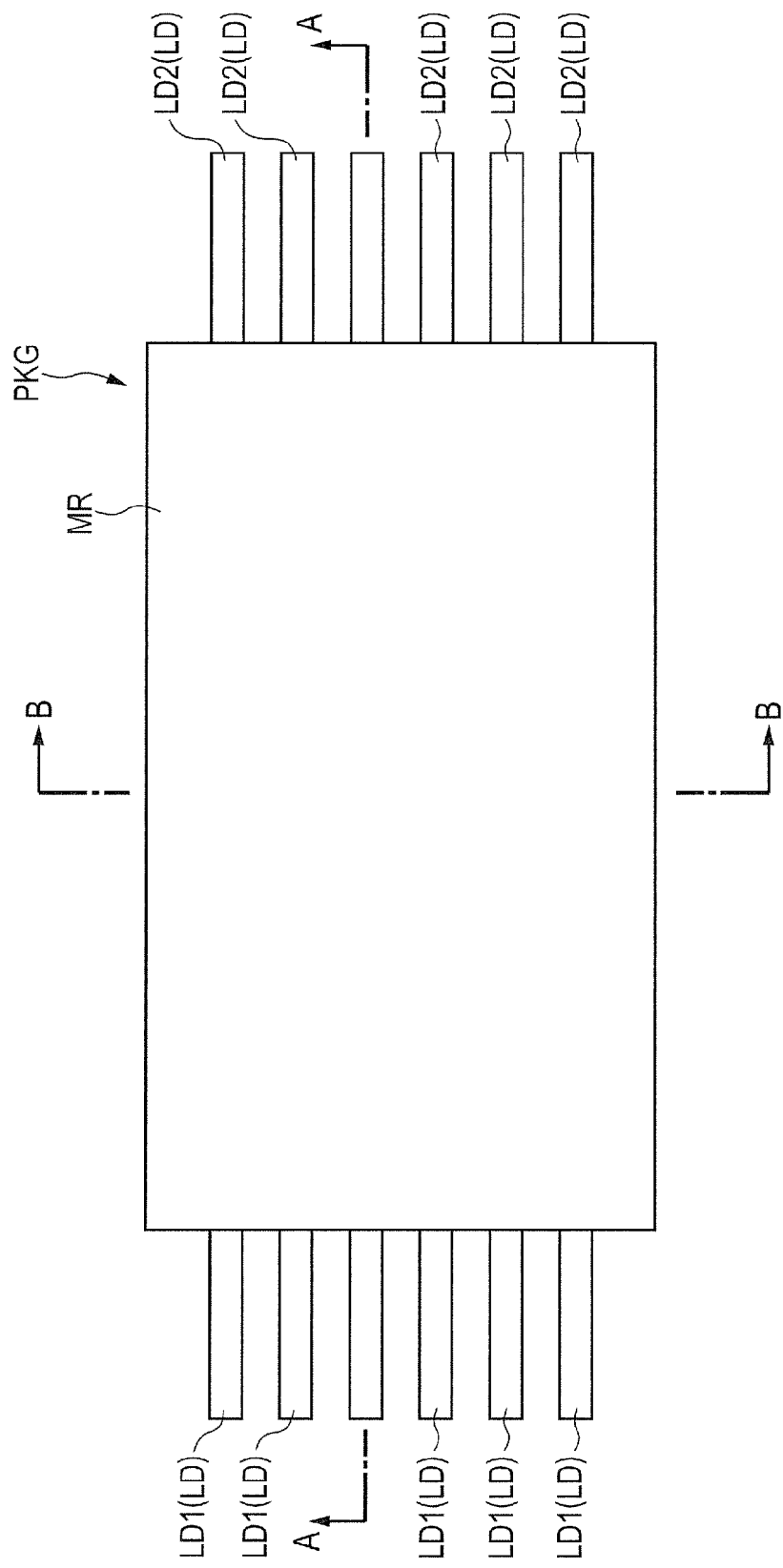
FIG. 3 is a top view of a semiconductor package of one embodiment.

FIG. 2 is an explanatory view showing a signal transmission example.

The transmission circuit TX1 extracts the edge part of a square wave signal SG1 inputted to the transmission circuit TX1, and generates a signal SG2 with a given pulse width, and sends the signal SG2 to the coil CL1$a$ (primary coil) of the transformer TR1. When a current resulting from the signal SG2 passes through the coil CL1$a$ (primary coil) of the transformer TR1, a signal SG3 in response thereto flows through the coil CL1$b$ (secondary coil) of the transformer TR1 by an induced electromotive force. The signal SG3 is amplified by the reception circuit RX1, and is further modulated into a square wave, so that a square wave signal SG4 is outputted from the reception circuit RX1. As a result, the signal SG4 in response to the signal SG1 inputted to the transmission circuit TX1 can be outputted from the reception circuit RX1. In this manner, a signal is transmitted from the transmission circuit TX1 to the reception circuit RX1. The transmission of a signal from the transmission circuit TX2 to the reception circuit RX2 can also be performed in the same manner.

Whereas, FIG. 2 shows one example of transmission of a signal from the transmission circuit to the reception circuit. However, the example is not exclusive, and can be variously changed. It is essential for the procedure only that a signal is transmitted through magnetically coupled coils (a primary coil and a secondary coil).

<Regarding Configuration Example of Semiconductor Package>

Then, a description will be given to a configuration example of a semiconductor package of the present embodiment. Incidentally, the semiconductor package can also be regarded as a semiconductor device.

Figure 4:
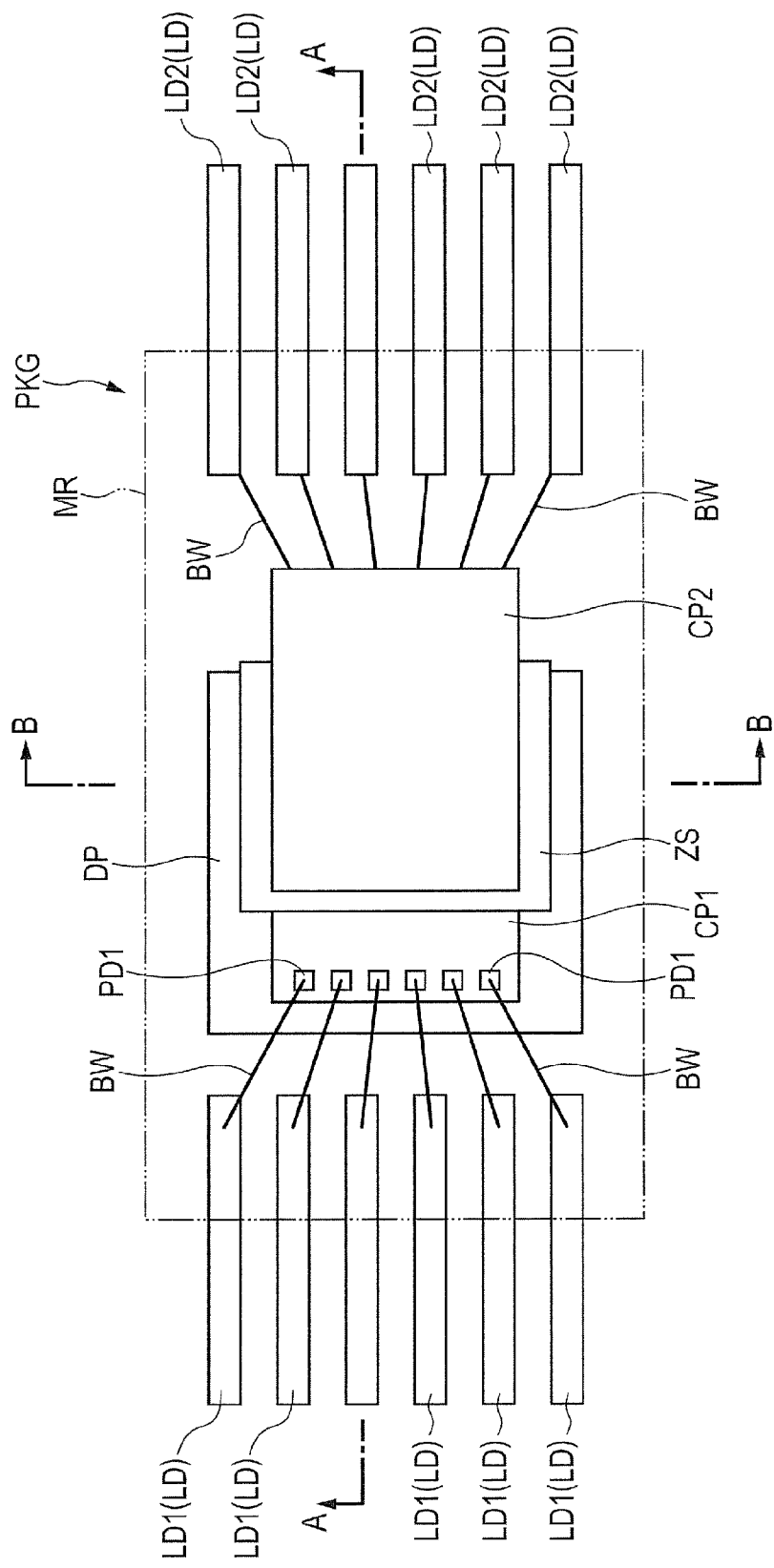
FIG. 4 is a plan perspective view of the semiconductor package of FIG. 3.
Figure 5:
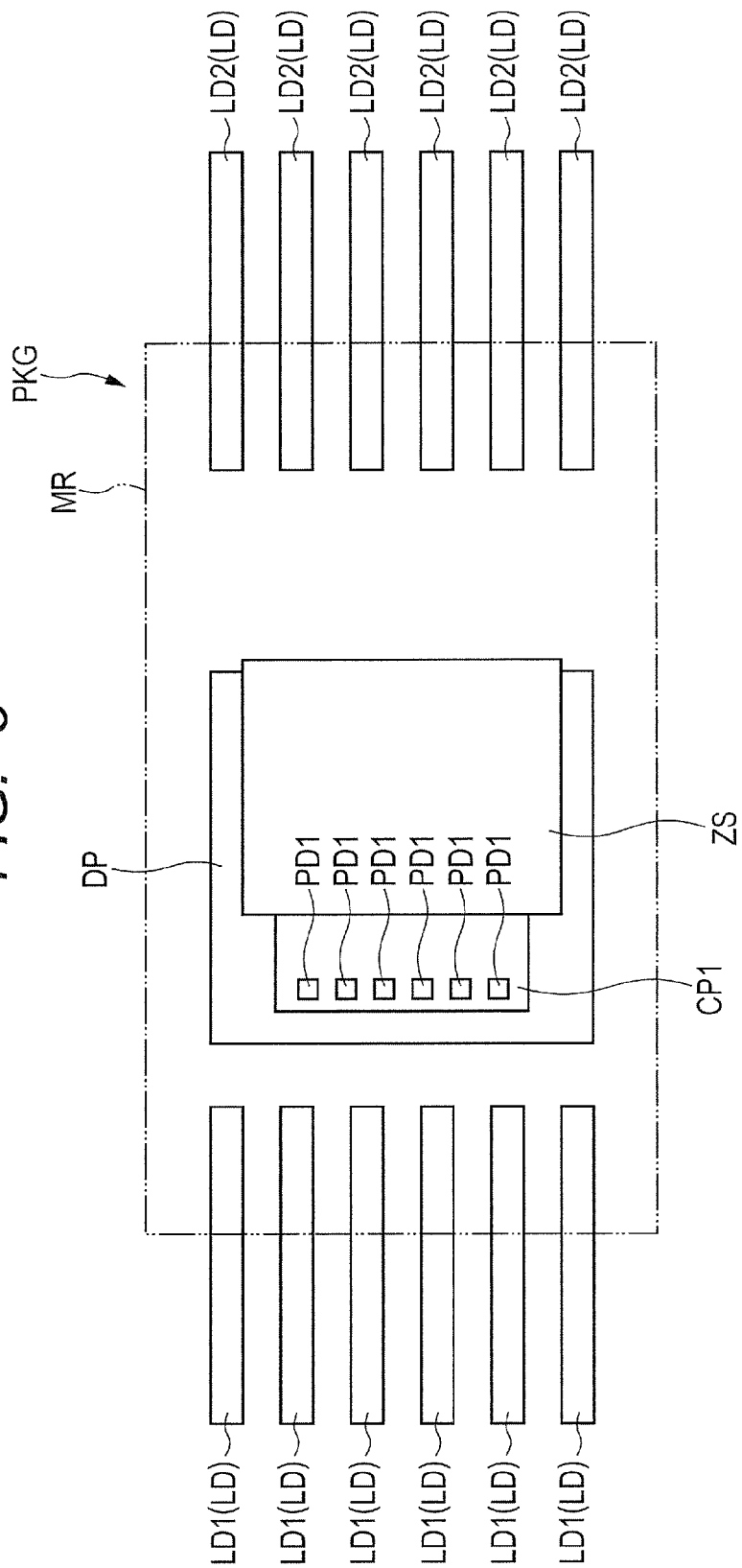
FIG. 5 is a plan perspective view of the semiconductor package of FIG. 3.
Figure 6:
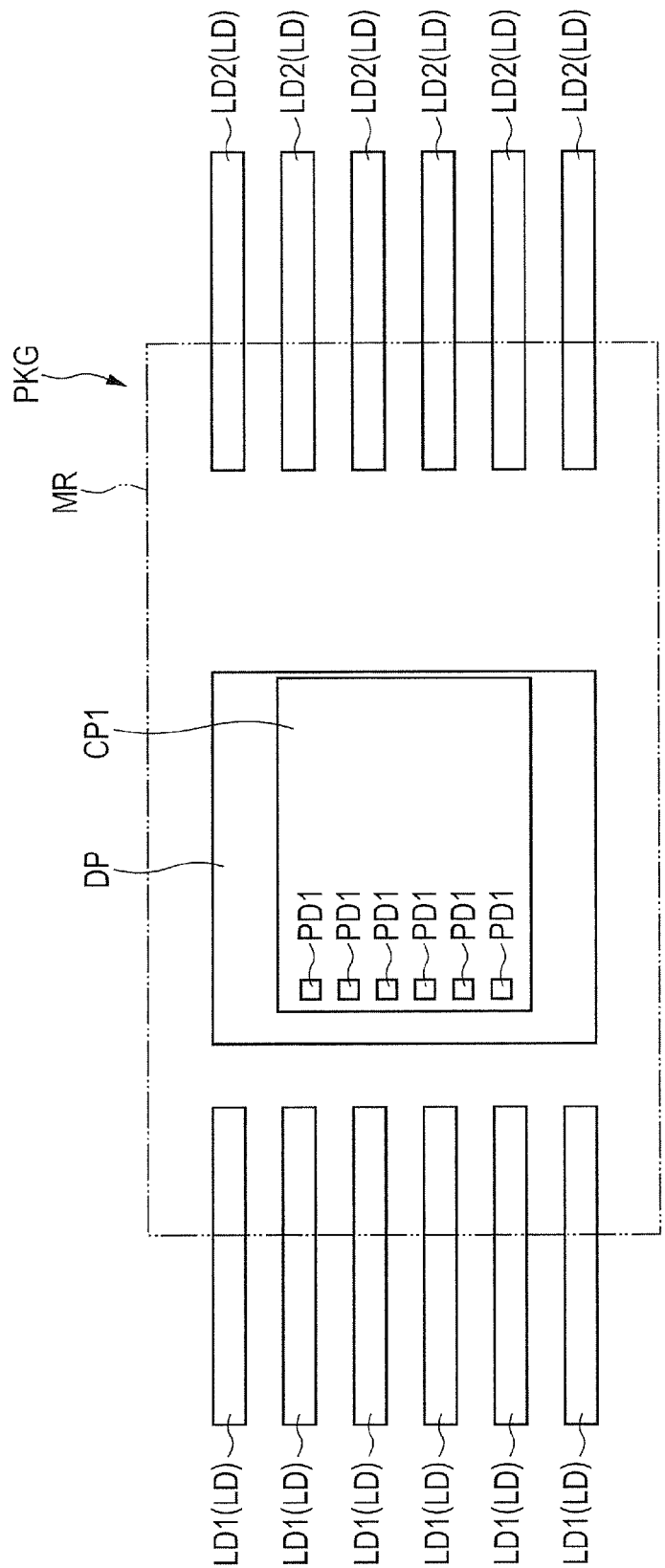
FIG. 6 is a plan perspective view of the semiconductor package of FIG. 3.
Figure 7:
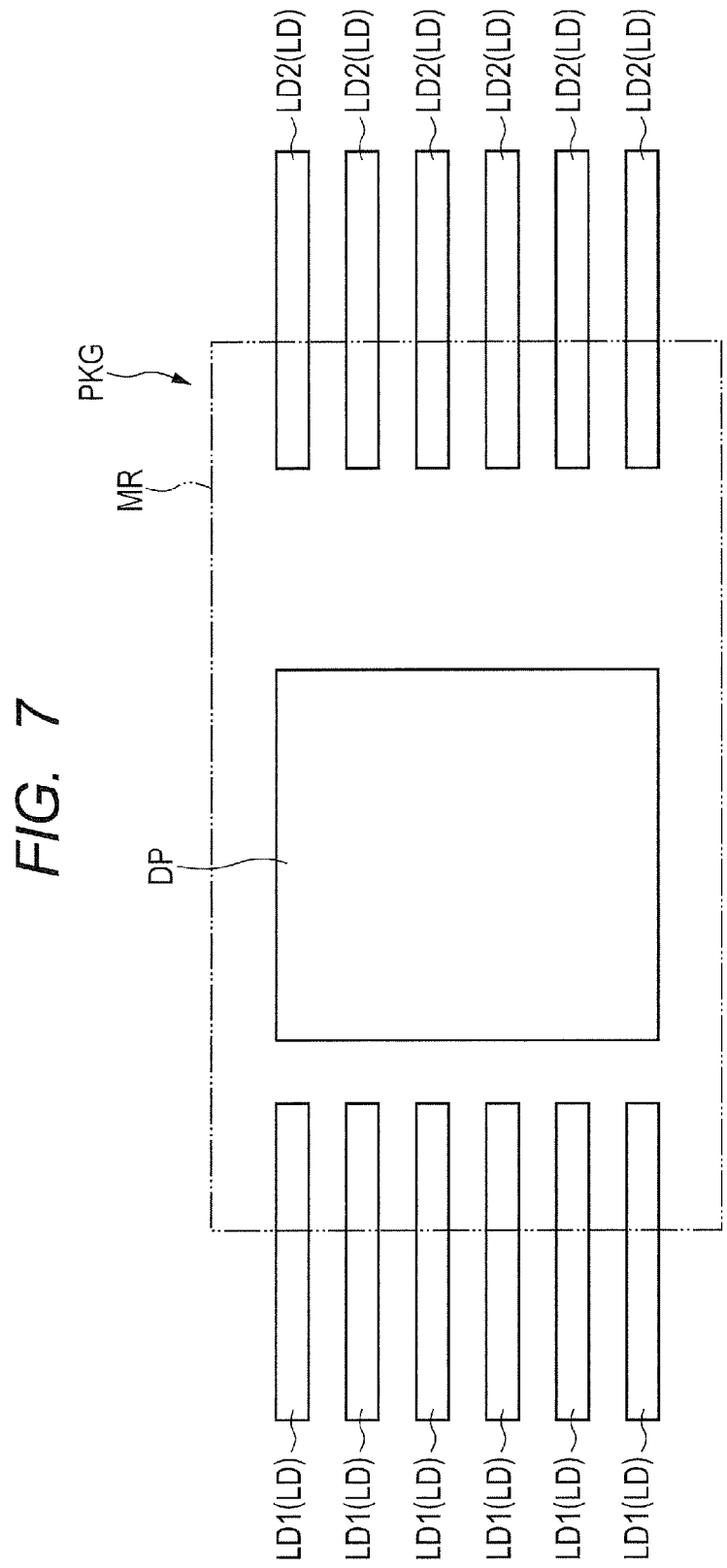
FIG. 7 is a plan perspective view of the semiconductor package of FIG. 3.
Figure 8:
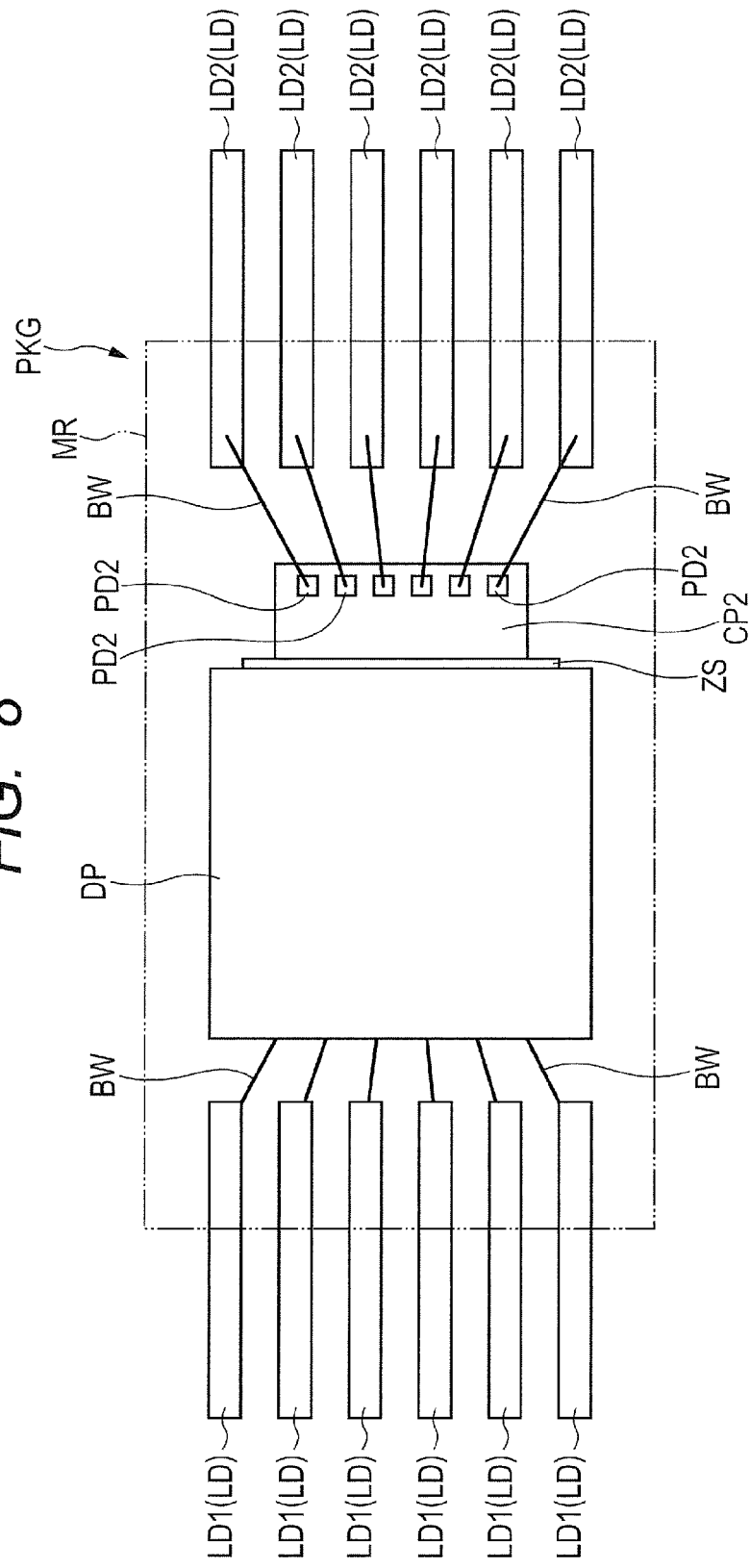
FIG. 8 is a plan perspective view of the semiconductor package of FIG. 3.
Figure 9:
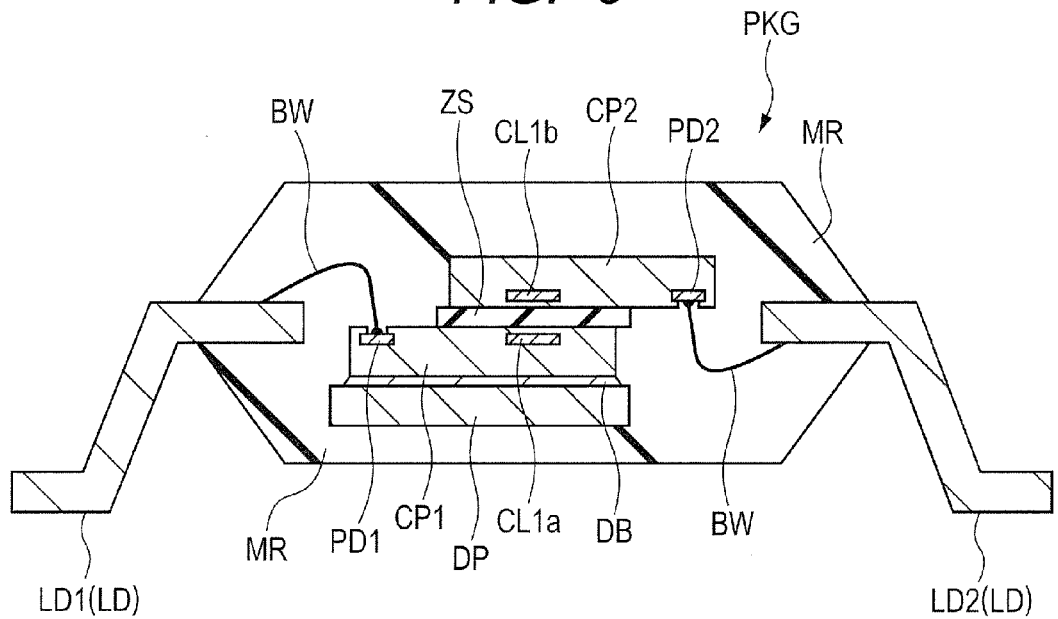
FIG. 9 is a cross sectional view of the semiconductor package of FIG. 3.
Figure 10:
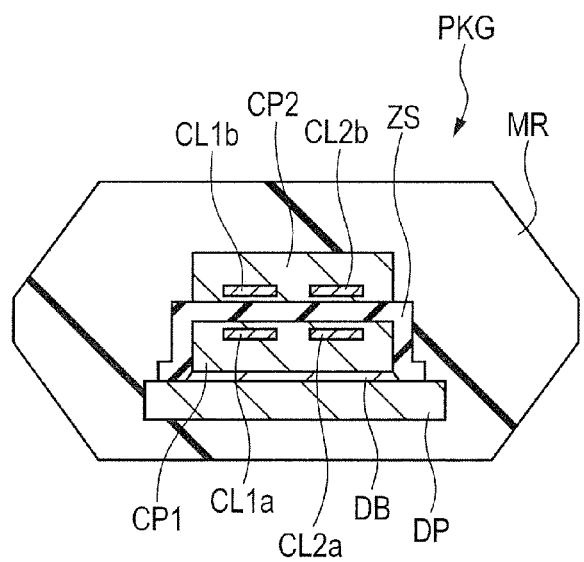
FIG. 10 is a cross sectional view of the semiconductor package of FIG. 3.

FIGS. 3 to 8 are each a plan view showing a semiconductor package (semiconductor device) PKG of the present embodiment. FIGS. 9 and 10 are each a cross sectional view showing the semiconductor package PKG of the present embodiment. Incidentally, of FIGS. 3 to 8, FIG. 3 is a top view (top surface side plan view) of the semiconductor package PKG; FIGS. 4 to 7 are each a plan perspective view of the semiconductor package PKG as seen through from the top surface side thereof; and FIG. 8 is a plan perspective view of the semiconductor package PKG as seen through from the bottom surface side thereof. In FIG. 4, a sealing resin part MR is seen through, and the outside shape (outer circumference) of the sealing resin part MR is indicated with a two-dot chain line. FIG. 5 corresponds to a plan perspective view obtained by removing the semiconductor chip CP2 and the wires BW from FIG. 4. FIG. 6 corresponds to a plan perspective view obtained by further removing an insulation sheet ZS from FIG. 5. FIG. 7 corresponds to a plan perspective view obtained by further removing the semiconductor chip CP1 from FIG. 6. Whereas, in FIG. 8, as in FIG. 4, the sealing resin part MR is seen through, and the outside shape (outer circumference) of the sealing resin part MR is indicated with a two-dot chain line. However, the directions in which the semiconductor package PKG is seen are opposite between FIG. 8 and FIG. 4. Whereas, the cross sectional view along each line A-A of FIGS. 3 and 4 roughly corresponds to FIG. 9. The cross sectional view along each line B-B of FIGS. 3 and 4 roughly corresponds to FIG. 10.

The semiconductor package PKG shown in FIGS. 3 to 10 is a semiconductor package including semiconductor chips CP1 and CP2. Below, the configuration of the semiconductor package PKG will be specifically described.

The semiconductor package PKG shown in FIGS. 3 to 10 has semiconductor chips CP1 and CP2, a die pad DP for mounting the semiconductor chip CP1 thereover, a plurality of leads LD, an insulation sheet ZS interposed between the semiconductor chips CP1 and CP2, a plurality of wires BW for establishing a coupling between the semiconductor chip CP1 and the leads LD, and between the semiconductor chip CP2 and the leads LD, and a sealing resin part MR for sealing these.

The sealing resin part (sealing part, sealing resin, or sealing body) MR as a sealing part is formed of a resin material such as a thermosetting resin material, and can also contain a filler, or the like. The sealing resin part MR seals, and electrically and mechanically protects the semiconductor chips CP1 and CP2, the die pad DP, the insulation sheet ZS, a plurality of leads LD, and a plurality of wires BW. The sealing resin part MR can be formed in, for example, a rectangular shape (tetragonal shape) in a plan configuration (outside shape configuration) crossing with its thickness.

At the front surface of the semiconductor chip CP1 which is the main surface on the element formation side of the semiconductor chip CP1, a plurality of pads (pad electrodes or bonding pads) PD1 are formed. The plurality of pads PD1 are external coupling terminals of the semiconductor chip CP1. Each pad PD1 of the semiconductor chip CP1 is electrically coupled with a semiconductor integrated circuit (e.g., the transmission circuit TX1 or the reception circuit RX2) formed in the inside of the semiconductor chip CP1.

At the front surface of the semiconductor chip CP2 which is the main surface on the element formation side of the semiconductor chip CP2, a plurality of pads PD2 are formed. The plurality of pads PD2 are external coupling terminals of the semiconductor chip CP2. Each pad PD2 of the semiconductor chip CP2 is electrically coupled with a semiconductor integrated circuit (e.g., the transmission circuit TX2, the reception circuit RX1, or the driving circuit DR) formed in the inside of the semiconductor chip CP2.

Incidentally, in the semiconductor chip CP1, the main surface on the side over which the pads PD1 are formed is referred to as a front surface of the semiconductor chip CP1, and the main surface opposite thereto is referred to as a back surface of the semiconductor chip CP1. Whereas, in the semiconductor chip CP2, the main surface on the side over which the pads PD2 are formed is referred to as a front surface of the semiconductor chip CP2, and the main surface opposite thereto is referred to as a back surface of the semiconductor chip CP2. Respective front surfaces of the semiconductor chips CP1 and CP2 are formed mainly of the top surfaces of insulation films PA described later, respectively.

The semiconductor chip CP1 is mounted (arranged) over the top surface of the die pad DP which is the chip mounting part so that the front surface of the semiconductor chip CP1 faces upward, and the back surface of the semiconductor chip CP1 faces the top surface of the die pad DP. The back surface of the semiconductor chip CP1 is bonded and fixed to the top surface of the die pad DP via a die bonding material (adhesive material) DB.

The semiconductor chip CP2 is mounted (arranged) over the front surface of the semiconductor chip CP1 via the insulation sheet (insulation adhesive sheet) ZS so that the front surface of the semiconductor chip CP2 faces the front surface of the semiconductor chip CP1. Namely, the semiconductor chip CP2 is mounted (arranged) over the front surface of the semiconductor chip CP1 so that the front surface of the semiconductor chip CP2 faces the front surface side of the semiconductor chip CP1, and the back surface of the semiconductor chip CP2 faces upward. The insulation sheet ZS is interposed between (the front surface of) the semiconductor chip CP2 and (the front surface of) the semiconductor chip CP1. The semiconductor chip CP1 and the semiconductor chip CP2 are spaced from each other with the insulation sheet ZS interposed therebetween by the thickness of the insulation sheet ZS, and are electrically insulated from each other.

In a plan view, the semiconductor chip CP1 and the semiconductor chip CP2 partially overlap each other. In the overlap region, the insulation sheet ZS is interposed between (the front surface of) the semiconductor chip CP2 and (the front surface of) the semiconductor chip CP1. Namely, in a plan view, the entire front surface of the semiconductor chip CP1 does not overlap the semiconductor chip CP2, and further, the entire front surface of the semiconductor chip CP2 does not overlap the semiconductor chip CP1. The semiconductor chip CP1 has a region overlapping and a region not overlapping the semiconductor chip CP2 in a plan view. Whereas, the semiconductor chip CP2 has a region overlapping and a region not overlapping the semiconductor chip CP1 in a plan view. Incidentally, a plan view corresponds to the case of a view of the plane generally in parallel with the main surface of the semiconductor chip CP1 or the main surface of the semiconductor chip CP2, or both thereof.

The semiconductor chip CP1 has a plurality of pads PD1. The plurality of pads PD1 are arranged in a region of the front surface of the semiconductor chip CP1 not overlapping the semiconductor chip CP2 in a plan view. For this reason, the plurality of pads PD1 provided at the semiconductor chip CP1 are not covered with the insulation sheet ZS. Whereas, the semiconductor chip CP2 has a plurality of pads PD2. The plurality of pads PD2 are arranged in a region of the front surface of the semiconductor chip CP2 not overlapping the semiconductor chip CP1 in a plan view. For this reason, the plurality of pads PD2 provided at the semiconductor chip CP2 are not covered with the insulation sheet ZS.

From another point of view, the front surface of the semiconductor chip CP1 has a region facing and a region not facing the front surface of the semiconductor chip CP2. The plurality of pads PD1 provided at the front surface of the semiconductor chip CP1 are arranged in a region of the front surface of the semiconductor chip CP1 not facing the front surface of the semiconductor chip CP2. Then, the plurality of pads PD1 provided at the semiconductor chip CP1 are not covered with the insulation sheet ZS. Whereas, the front surface of the semiconductor chip CP2 has a region facing and a region not facing the front surface of the semiconductor chip CP1. The plurality of pads PD2 provided at the front surface of the semiconductor chip CP2 are arranged in a region of the front surface of the semiconductor chip CP2 not facing the front surface of the semiconductor chip CP1. Then, the plurality of pads PD2 provided at the semiconductor chip CP2 are not covered with the insulation sheet ZS.

In other words, the semiconductor chip CP1 has a region not facing the semiconductor chip CP2, and not overlapping the insulation sheet ZS. A plurality of pads PD1 are arranged in the region (the region not facing the semiconductor chip CP2, and not overlapping the insulation sheet ZS). Whereas, the semiconductor chip CP2 has a region not facing the semiconductor chip CP2, and not overlapping the insulation sheet ZS. A plurality of pads PD2 are arranged in the region (the region not facing the semiconductor chip CP1, and not overlapping the insulation sheet ZS).

The plurality of pads PD1 included in the semiconductor chip CP1 do not overlap (do not face) the semiconductor chip CP2, and are not covered with the insulation sheet ZS. This enables coupling of each wire BW to each pad PD1. Whereas, the plurality of pads PD2 included in the semiconductor chip CP2 do not overlap (do not face) the semiconductor chip CP1, and are not covered with the insulation sheet ZS. This enables coupling of each wire BW to each pad PD2.

The insulation sheet ZS is a sheet-like (film-like) member formed of an insulating material. The insulation sheet ZS has an adhesion. For example, a DAF (Die Attach Film) can be used therefor. Of the main surfaces of the insulation sheet ZS situated opposite to each other, the front surface of the semiconductor chip CP1 is bonded to one main surface, and the front surface of the semiconductor chip CP2 is bonded to the other main surface. For this reason, the insulation sheet ZS also has a function of bonding or fixing the semiconductor chip CP1 and the semiconductor chip CP2.

As the materials for the insulation sheet ZS, for example, thermosetting resins or thermoplastic resins can be used. Of these, thermoplastic resins are more preferably used as the materials for the insulation sheet ZS. The semiconductor chip CP1 and the semiconductor chip CP2 are stacked one over another with the insulation sheet ZS interposed therebetween. The thickness of the insulation sheet ZS is less likely to change from the initial thickness when a thermoplastic resin is used as the material for the insulation sheet ZS than when a thermosetting resin is used as the material for the insulation sheet ZS. For this reason, the dielectric breakdown voltage between the semiconductor chip CP1 and the semiconductor chip CP2 is more likely to be ensured when a thermoplastic resin is used as the material for the insulation sheet ZS than when a thermosetting resin is used as the material for the insulation sheet ZS.

The lead LD is formed of a conductor, and is preferably formed of a metal material such as copper (Cu) or copper alloy. Each lead LD is formed of an inner lead part which is a portion of the lead LD situated in the sealing resin part MR, and an outer lead part which is a portion of the lead LD situated outside the sealing resin part MR. The outer lead part of the lead LD protrudes from the side surface of the sealing resin part MR to outside the sealing resin part MR. The gap between the inner lead parts of the adjacent leads LD is filled with the material forming the sealing resin part MR. The outer lead part of each lead LD can function as an external coupling terminal part (external terminal) of the semiconductor package PKG. The outer lead part of each lead LD is bent so that the bottom surface in the vicinity of the end of the outer lead part is situated slightly below the bottom surface of the sealing resin part MR.

As another form, the outer lead part of each lead LD can also not be bent. In that case, the outer lead part of each lead LD can be allowed to protrude from the side surface of the sealing resin part MR, and to extend in a direction in parallel with the bottom surface or the top surface of the sealing resin part MR.

Respective pads PD1 at the front surface of the semiconductor chip CP1 and respective pads PD2 at the front surface of the semiconductor chip CP2 are electrically coupled with the inner lead parts of respective leads LD via the wires BW which are each a conductive coupling member, respectively.

Herein, of the plurality of leads LD included in the semiconductor package PKG, the leads LD electrically coupled with the pads PD1 of the semiconductor chip CP1 via the wires BW, respectively, are each given a reference sign and numeral LD1, and are referred to as leads LD1. Whereas, of the plurality of leads LD included in the semiconductor package PKG, the leads LD electrically coupled with the pads PD2 of the semiconductor chip CP2 via the wires BW, respectively, are each given a reference sign and numeral LD2, and are referred to as leads LD2.

Namely, each pad PD1 at the front surface of the semiconductor chip CP1 is electrically coupled with the inner lead part of each lead LD1 via each wire BW. Each pad PD2 at the front surface of the semiconductor chip CP2 is electrically coupled with the inner lead part of each lead LD2 via each wire BW. In other words, the other end of the wire BW coupled at one end thereof to each pad PD1 at the front surface of the semiconductor chip CP1 is coupled to the top surface of the inner lead part of each lead LD1. Whereas, the other end of the wire BW coupled at one end thereof to each pad PD2 at the front surface of the semiconductor chip CP2 is coupled to the bottom surface of the inner lead part of each lead LD2.

Incidentally, the lead LD1 to which the pad PD1 of the semiconductor chip CP1 is coupled via the wire BW, and the lead LD2 to which the pad PD2 of the semiconductor chip CP2 is coupled via the wire BW are mutually different leads LD. Further, the pad PD1 of the semiconductor chip CP1 and the pad PD2 of the semiconductor chip CP2 are not coupled with each other via the wire BW. For this reason, the pad PD1 of the semiconductor chip CP1 is not coupled with the pad PD2 of the semiconductor chip CP2 via a conductor.

At the rectangular shape (tetragonal shape) forming the plan configuration of the sealing resin part MR, a plurality of leads LD1 and a plurality of leads LD2 are arranged at mutually opposite sides (side surfaces).

The wire (bonding wire) BW is a conductive coupling member (coupling member), is more specifically a conductive wire, and is formed of a metal thin line such as a gold (Au) line or a copper (Cu) line. The wires BW are sealed in the sealing resin part MR, and are not exposed from the sealing resin part MR.

As described above, the semiconductor chip CP1 and the semiconductor chip CP2 are arranged opposite to each other across the insulation sheet ZS so that the front surface of the semiconductor chip CP1 and the front surface of the semiconductor chip CP2 face each other. Then, the coils CL1a and CL2a are formed in the semiconductor chip CP1, and the coils CL1b and CL2b are formed in the semiconductor chip CP2. The coil CL1a formed in the semiconductor chip CP1 and the coil CL1b formed in the semiconductor chip CP2 overlap each other in a plan view. The coil CL2a formed in the semiconductor chip CP1 and the coil CL2b formed in the semiconductor chip CP2 overlap each other in a plan view. Namely, the semiconductor chip CP1 and the semiconductor chip CP2 are arranged opposite to each other across the insulation sheet ZS so that the coil CL1a formed in the semiconductor chip CP1 and the coil CL1b formed in the semiconductor chip CP2 face each other, and so that the coil CL2a formed in the semiconductor chip CP1 and coil CL2b formed in the semiconductor chip CP2 face each other.

The coil CL1a formed in the semiconductor chip CP1 and the coil CL1b formed in the semiconductor chip CP2 are magnetically coupled (inductively coupled) to form the transformer TR1. The coil CL2a formed in the semiconductor chip CP1 and the coil CL2b formed in the semiconductor chip CP2 are magnetically coupled (inductively coupled) to form the transformer TR2.

Between the coil CL1a in the semiconductor chip CP1 and the coil CL1b in the semiconductor chip CP2, an insulation film (corresponding to an insulation film PA described later) included in the semiconductor chip CP1, an insulation film (corresponding to an insulation film PA described later) included in the semiconductor chip CP2, and an insulation sheet ZS are interposed. Whereas, between the coil CL2a in the semiconductor chip CP1 and the coil CL2b in the semiconductor chip CP2, an insulation film (corresponding to an insulation film PA described later) included in the semiconductor chip CP1, an insulation film (corresponding to an insulation film PA described later) included in the semiconductor chip CP2, and an insulation sheet ZS are interposed. For this reason, the coil CL1a in the semiconductor chip CP1 and the coil CL1b in the semiconductor chip CP2 are not connected to each other via a conductor. Whereas, the coil CL2a in the semiconductor chip CP1 and the coil CL2b in the semiconductor chip CP2 are not connected to each other via a conductor.

The transmission of an electric signal between the semiconductor chip CP1 and the semiconductor chip CP2 is performed only via the transformers TR1 and TR2. Namely, only the signals transmitted by electromagnetic induction from the circuit (the transmission circuit TX1, or the like) formed in the semiconductor chip CP1 via the coil CL1a (primary coil) in the semiconductor chip CP1 and the coil CL1b (secondary coil) in the semiconductor chip CP2 are transmitted to the semiconductor chip CP2 (the reception circuit RX1). Whereas, only the signals transmitted by electromagnetic induction from the circuit (the transmission circuit TX2, or the like) formed in the semiconductor chip CP2 via the coil CL2b (primary coil) in the semiconductor chip CP2 and the coil CL2a (secondary coil) in the semiconductor chip CP1 are transmitted to the semiconductor chip CP1 (the reception circuit RX2).

Figure 11:
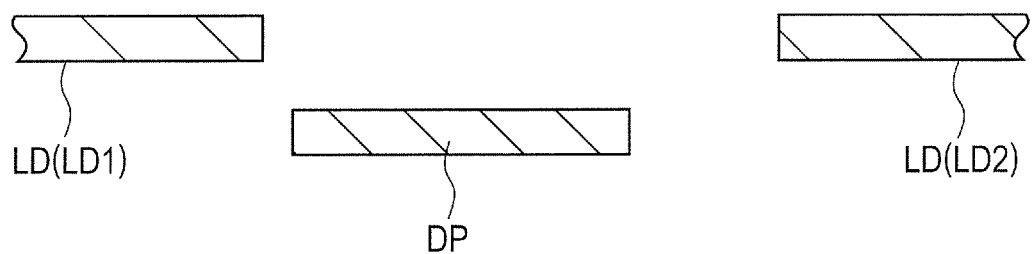
FIG. 11 is a cross sectional view of the semiconductor package of FIG. 3 during a manufacturing step.

Then, one example of the manufacturing steps of the semiconductor package PKG will be described by reference to FIGS. 11 to 16. FIG. 11 is a cross sectional view of the semiconductor package PKG during a manufacturing step, and shows a cross section corresponding to the FIG. 9.

The semiconductor package PKG can be manufactured, for example, in the following manner.

Namely, first, as shown in FIG. 11, a lead frame including a die pad DP and a plurality of leads LD joined to the framework thereof is provided.

Figure 12:
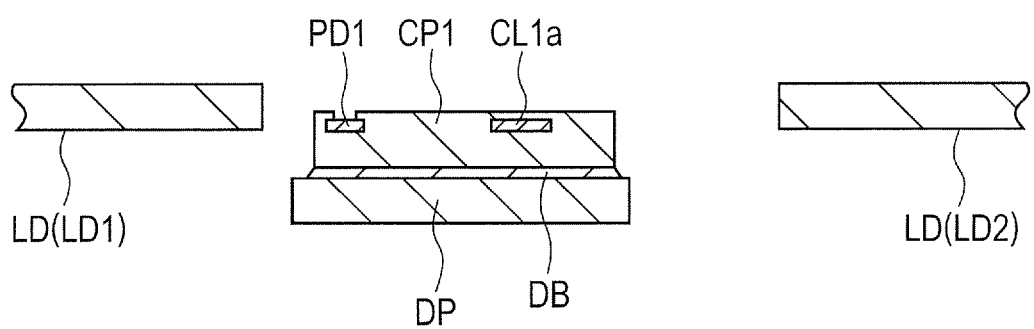
FIG. 12 is a cross sectional view of the semiconductor package during a manufacturing step following FIG. 11.

Then, as shown in FIG. 12, a die bonding step is performed. As a result, the semiconductor chip CP1 is mounted and bonded over the die pad DP of the lead frame via a die bonding material (adhesive material) DB. At this step, the back surface of the semiconductor chip CP1 is bonded to the top surface of the die pad DP with the die bonding material DB so that the back surface of the semiconductor chip CP1 faces the top surface of the die pad DP.

Figure 13:
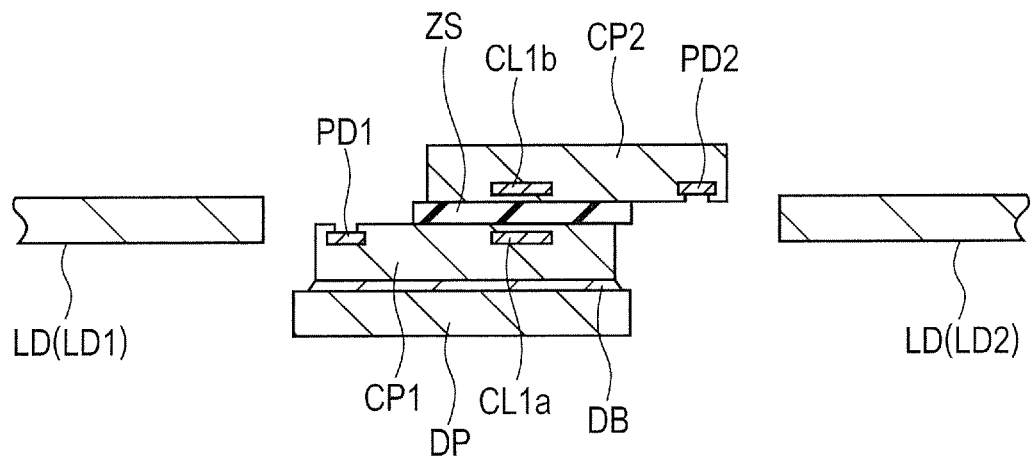
FIG. 13 is a cross sectional view of the semiconductor package during a manufacturing step following FIG. 12.

Then, as shown in FIG. 13, the semiconductor chip CP2 is mounted and fixed over the front surface of the semiconductor chip CP1 via the insulation sheet ZS so that the front surface of the semiconductor chip CP2 faces the front surface of the semiconductor chip CP1. At this step, after bonding the insulation sheet ZS to the front surface of the semiconductor chip CP1, the semiconductor chip CP2 may be mounted over the insulation sheet ZS. Alternatively, after bonding the insulation sheet ZS to the front surface of the semiconductor chip CP2, the opposite surface of the insulation sheet ZS (the opposite surface to the surface to which the semiconductor chip CP1 is bonded) may be bonded to the front surface of the semiconductor chip CP1.

Figure 14:
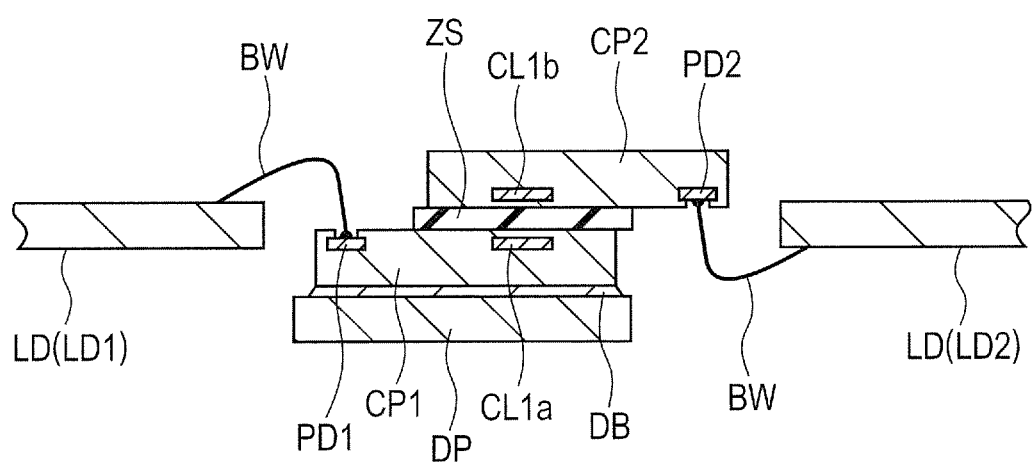
FIG. 14 is a cross sectional view of the semiconductor package during a manufacturing step following FIG. 13.

Then, as shown in FIG. 14, the wire bonding step is performed. As a result, a plurality of pads PD1 of the semiconductor chip CP1 and a plurality of pads PD2 of the semiconductor chip CP2, and a plurality of leads LD are coupled with each other via a plurality of wires BW, respectively. At this step, for example, the following procedure is acceptable: a plurality of pads PD1 at the front surface of the semiconductor chip CP1, and a plurality of leads LD1 are coupled with each other via a plurality of wires BW, respectively; then, the lead frame is reversed, and a plurality of pads PD2 at the front surface of the semiconductor chip CP2 and a plurality of leads LD2 are coupled with each other via a plurality of wires BW, respectively. Alternatively, the following procedure is also possible: the order of wire bonding for the semiconductor chip CP1 and the semiconductor chip CP2 is reversed; and first, a plurality of pads PD2 at the front surface of the semiconductor chip CP2 and a plurality of leads LD2 are coupled with each other via a plurality of wires BW, respectively, followed by inversion of the lead frame; and a plurality of pads PD1 at the front surface of the semiconductor chip CP1 and a plurality of leads LD1 are coupled with each other via a plurality of wires BW, respectively. By performing the wire bonding step, the plurality of pads PD1 of the semiconductor chip CP1 are electrically coupled with the plurality of leads LD1 via the plurality of wires BW, respectively. The plurality of pads PD2 of the semiconductor chip CP2 and the plurality of leads LD2 are electrically coupled with each other via plurality of other wires BW, respectively.

Figure 15:
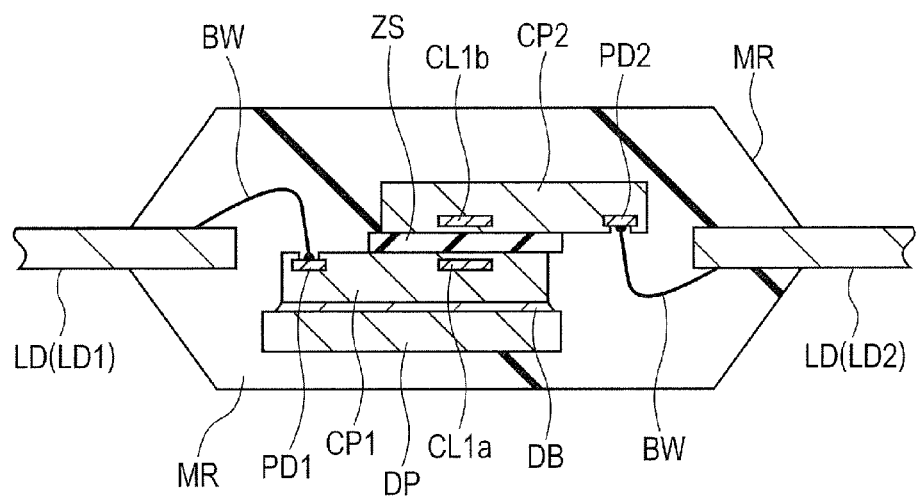
FIG. 15 is a cross sectional view of the semiconductor package during a manufacturing step following FIG. 14.

Then, as shown in FIG. 15, the resin sealing step is performed. This results in the formation of the sealing resin part MR for sealing the semiconductor chips CP1 and CP2, the die pad DP, the insulation sheet ZS, the plurality of leads LD, and the plurality of wires BW.

Figure 16:
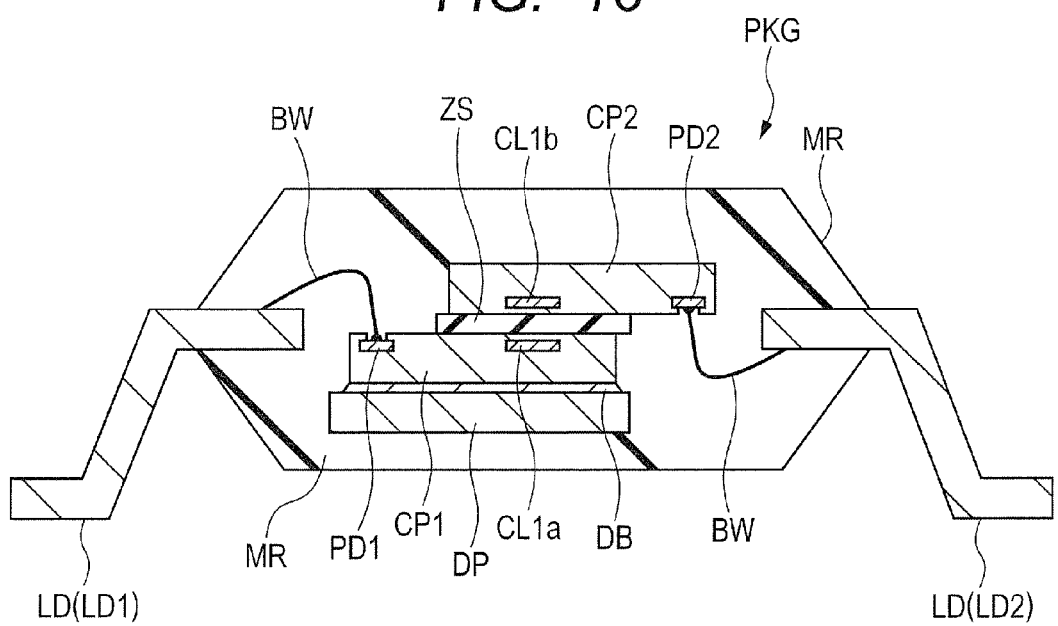
FIG. 16 is a cross sectional view of the semiconductor package during a manufacturing step following FIG. 15.

Then, the plurality of leads LD with their respective inner lead parts sealed by the sealing resin part MR are cut and separated from the framework of the lead frame. Then, as shown in FIG. 16, the outer lead parts of the plurality of leads LD are bent. In this manner, the semiconductor package PKG can be manufactured. Alternatively, bending of the leads LD may not be performed.

Incidentally, herein, a description has been given to the case where the semiconductor chip CP1 is mounted over the die pad DP in the semiconductor package PKG. However, as another form, in the semiconductor package PKG, the semiconductor chip CP1 and the semiconductor chip CP2 may be changed. In that case, the semiconductor chip CP2 is mounted over the die pad DP.

Further, herein, as the package form of the semiconductor package PKG, the case of the SOP (Small Outline Package) has been described as an example. However, the present invention is also applicable to other forms than the SOP.

Herein, a description will be given to the use examples of the product in which the semiconductor package PKG is mounted. Examples thereof include a car, the motor control parts of home electrical appliances such as a washing machine, a switching power supply, an illumination controller, a photovoltaic power generation controller, a mobile phone, or mobile communication equipment.

For example, in the case of car use, the semiconductor chip CP1 is a low voltage chip to be supplied with a low-voltage power supply voltage. The power supply voltage to be fed in that case is, for example, about 5 V. On the other hand, the power supply voltage of the driving target (such as an inverter INV described later) of the driving circuit DR is, for example, 600 V to 1000 V, or a higher voltage than that. The high voltage may be supplied from the driving target (such as an inverter INV described later) to the semiconductor chip CP2.

<Regarding Electronic System Using a Semiconductor Device>

Figure 17:
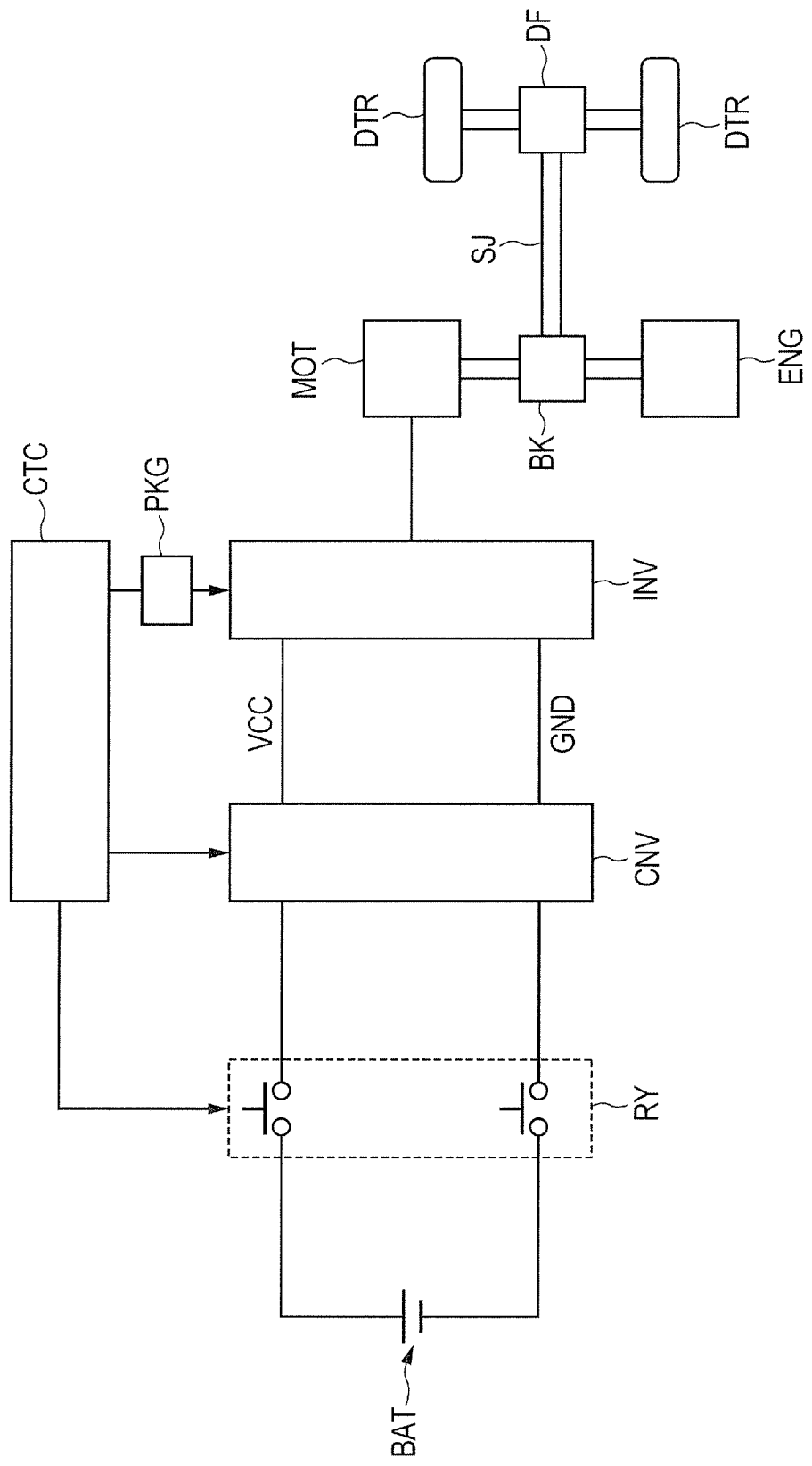
FIG. 17 is an explanatory view showing one example of an electronic system of a semiconductor device of one embodiment.

Then, a description will be given to one example of an electronic system (electronic device) using the semiconductor package (semiconductor device) PKG of the present embodiment. FIG. 17 is an explanatory view (circuit block diagram) showing one example of the electronic system (electronic device) using the semiconductor package PKG of the present embodiment, herein, an electric car system.

The electronic system (herein, an electric car system) shown in FIG. 17 has the load of a motor MOT, or the like, an inverter (inverter circuit) INV, a power supply BAT, and a control part (control circuit) CTC. As the motor MOT, for example, a three-phase motor, or the like can be used. The three-phase motor is driven by three-phase voltages different in phase. The semiconductor package PKG is coupled between the control part CTC and the inverter INV.

In an electronic system (herein, an electric car system) of FIG. 17, the power supply BAT is coupled via a relay RY and a converter (booster converter) CNV to an inverter INV. Thus, a voltage (electric power) from the power supply BAT is supplied to the inverter INV. The converter CNV is interposed between the power supply BAT and the inverter INV. Accordingly, the voltage (DC voltage) from the power supply BAT is converted (boosted) to a voltage suitable for motor driving at the converter CNV, and then is supplied to the inverter INV. The relay RY is interposed between the power supply BAT and the converter CNV. Thus, the coupling between the power supply BAT and the converter CNV can be switched by the relay RY between a coupled state and a cut-off state.

Further, the motor MOT is coupled to the inverter INV. Thus, the DC current (DC electric power) supplied from the power supply BAT via the converter CNV to the inverter INV is converted to an AC voltage (AC electric power) at the inverter INV, and is supplied to the motor MOT. The motor MOT is driven by the AC voltage (AC electric power) supplied from the inverter INV.

The motor MOT can rotate (drive) the tires (wheels) of a car, and the like.

For example, in the case of a hybrid car, the output shaft of the motor MOT and the output shaft of the engine ENG are synthesized by a power transfer mechanism BK. The torque is transferred to an axle SJ. The axle SJ operates together with a driving wheel DTR via a differential DF. When a large driving force is required, or in other cases, the motor MOT is driven together with the engine ENG. The output torques are synthesized by the power transfer mechanism BK, and transferred via the axle SJ to the driving tires DTR. As a result, the driving tires DTR can be driven. When so much driving force is not required (e.g., when running is performed at a given speed), and in other cases, the engine ENG is stopped, and only the motor MOT can drive the driving tires DTR. Further, in the case of a hybrid car, in addition to the motor MOT, the engine ENG is also required. However, in the case of an electric car not having an engine, the engine ENG can be omitted.

To the inverter INV, a control part (controller) CTC is coupled via the semiconductor package PKG, so that the control part CTC controls the inverter INV. Namely, a DC voltage (DC electric power) is supplied from the power supply BAT to the inverter INV, and is converted to an AC voltage (AC electric power) by the inverter INV controlled by the control part CTC, which is supplied to the motor MOT. As a result, the motor MOT can be driven. The control part CTC is formed of, for example, an ECU (Electronic Control Unit), and includes therein a control semiconductor chip such as a MCU (Micro Controller Unit). The relay RY and the converter CNV can also be controlled by the control part CTC.

However, the control part CTC and the inverter INV do not directly transmit signals therebetween. The semiconductor package PKG is interposed between the control part CTC and the inverter INV. Namely, the semiconductor package PKG is interposed for the transmission of signals between the control part CTC and the inverter INV. In the electronic system (herein, the electric car system) of FIG. 17, the control circuit CC of the FIG. 1 corresponds to the control part CTC of FIG. 17, and the load LOD of the FIG. 1 corresponds to the inverter INV of FIG. 17. The leads LD1 of semiconductor package PKG are coupled to the control part CTC. The leads LD2 of the semiconductor package PKG are coupled to the inverter INV. Alternatively, when the driving circuit DR of FIG. 1 is internally included in a semiconductor chip outside the semiconductor package PKG, the semiconductor chip (the semiconductor chip internally including the driving circuit DR) is interposed between the semiconductor package PKG and the inverter INV in FIG. 17. In response to the signal (control signal) transmitted from the control part CTC via the transmission circuit TX1, the transformer TR1, and the reception circuit RX1 to the driving circuit DR, the driving circuit DR outputs a signal (control signal or driving signal) for controlling or driving the inverter INV. The signal (control signal or driving signal) is inputted to the inverter INV. The control part CTC can control the inverter INV via the semiconductor package PKG.

The inverter INV has a power semiconductor element (power transistor). Examples of the power semiconductor element may include an IGBT (Insulated Gate Bipolar Transistor). For example, when the motor MOT is a three-phase motor, the inverter INV has six IGBTs corresponding to the three phases. The power semiconductor element included in the inverter INV receives a signal (control signal or driving signal) from the driving circuit DR. When the power semiconductor element included in the inverter INV is an IGBT, the gate electrode of the IGBT receives a signal (control signal or driving signal) from the driving circuit DR. The control part CTC controls the power semiconductor element (e.g., IGBT) of the inverter INV via the semiconductor package PKG, and thereby can control the inverter INV.

By controlling the current flowing through the power semiconductor element (e.g., IGBT) of the inverter INV by the control part CTC, the motor MOT is driven (rotated). Namely, by controlling ON/OFF of the power semiconductor element (e.g., IGBT) of the inverter INV by the control part CTC, it is possible to drive the motor MOT.

As described above, the semiconductor package PKG internally includes the semiconductor chips CP1 and CP2. The semiconductor chip CP1 and the semiconductor chip CP2 are different in voltage level (reference potential) from each other. For example, the driving circuit DR is coupled to the inverter INV in order to drive or control the inverter INV. Accordingly, the reference potential (voltage level) of the semiconductor chip CP2 may be raised to a voltage roughly equal to the power supply voltage VCC of the inverter INV to be driven. The power supply voltage VCC is a considerably high voltage (e.g., about several hundreds V to several thousands V). This also applies to the case where the driving circuit DR is internally included in a different semiconductor chip from the semiconductor chip CP2. For this reason, a large difference is caused in voltage level (reference potential) between the semiconductor chip CP1 and the semiconductor chip CP2. In other words, the semiconductor chip CP2 may be supplied with a higher voltage (e.g., about several hundreds V to several thousands V) than the power supply voltage (e.g., about several V to several tens V) supplied to the semiconductor chip CP1 from the inverter INV.

However, as described above, it is only the signal transmitted by electromagnetic induction from the primary coil (CL1a) in the semiconductor chip CP1 to the secondary coil (CL1b) in the semiconductor chip CP2, or the signal transmitted by electromagnetic induction from the primary coil (CL2b) in the semiconductor chip CP2 to the secondary coil (CL2a) in the semiconductor chip CP1 that is electrically transmitted between the semiconductor chip CP1 and the semiconductor chip CP2. For this reason, even when the voltage level (reference potential) of the semiconductor chip CP1 and the voltage level (reference potential) of the semiconductor chip CP2 are different from each other, it is possible to precisely prevent the voltage level (reference potential) of the semiconductor chip CP2 from being inputted to the semiconductor chip CP1, or the voltage level (reference potential) of the semiconductor chip CP1 from being inputted to the semiconductor chip CP2. Namely, even when the reference potential (voltage level) of the semiconductor chip CP2 is raised to the voltage roughly equal to the power supply voltage VCC (e.g., about several hundreds V to several thousands V) of the inverter INV to be driven, it is possible to precisely prevent the reference potential of the semiconductor chip CP2 from being inputted to the semiconductor chip CP1. For this reason, it is possible to precisely transmit electric signals between the semiconductor chips CP1 and CP2 different in voltage level (reference potential) from each other.

Whereas, in the electric car system, when an increase and a decrease in ambient temperature are repeated, it is necessary to prevent the insulation sheet ZS and the semiconductor chips CP (CP1 and CP2) from being peeled from each other by a thermal stress. For example, in the environmental temperature test according to the quality standard AEC-Q100, the sample is required to have a durability of 500 cycles or more at −65° C. to 150° C. in the temperature cycling test. In the present embodiment, even in such environment, the insulation sheet ZS and the semiconductor chips CP (CP1 and CP2) can be prevented from being peeled from each other.

Further, it is possible to enhance the reliability of the semiconductor chip CP1 and the semiconductor chip CP2. Furthermore, it is possible to improve the reliability of the semiconductor package PKG. Still further, it is possible to improve the reliability of the electronic device using the semiconductor package PKG.

Whereas, signals are transmitted between the semiconductor chips using the magnetically coupled coils. As a result, it is possible to implement miniaturization of the semiconductor package PKG.

Whereas, when the power supply voltage VCC is increased, the breakdown voltage of the semiconductor package PKG, namely, the breakdown voltage between the semiconductor chip CP1 and the semiconductor chip CP2 in the semiconductor package PKG is required to be accordingly increased. In contrast, in the present embodiment, as described later, it is possible to improve the breakdown voltage between the semiconductor chip CP1 and the semiconductor chip CP2 in the semiconductor package PKG. Therefore, the breakdown voltage of the semiconductor package PKG can be improved. The breakdown voltage (the breakdown voltage between the semiconductor chips CP1 and CP2) of the semiconductor package PKG can be improved. This enables an increase in power supply voltage VCC converted (boosted) at the converter CNV, and supplied to the inverter INV. Therefore, an increase in power supply voltage VCC to be supplied to the inverter INV can result in an increase in current to be passed through the motor MOT. As a result, it is possible to improve the speed (rotation speed) of the motor MOT.

<Regarding Structure of Semiconductor Chip>

Figure 18:
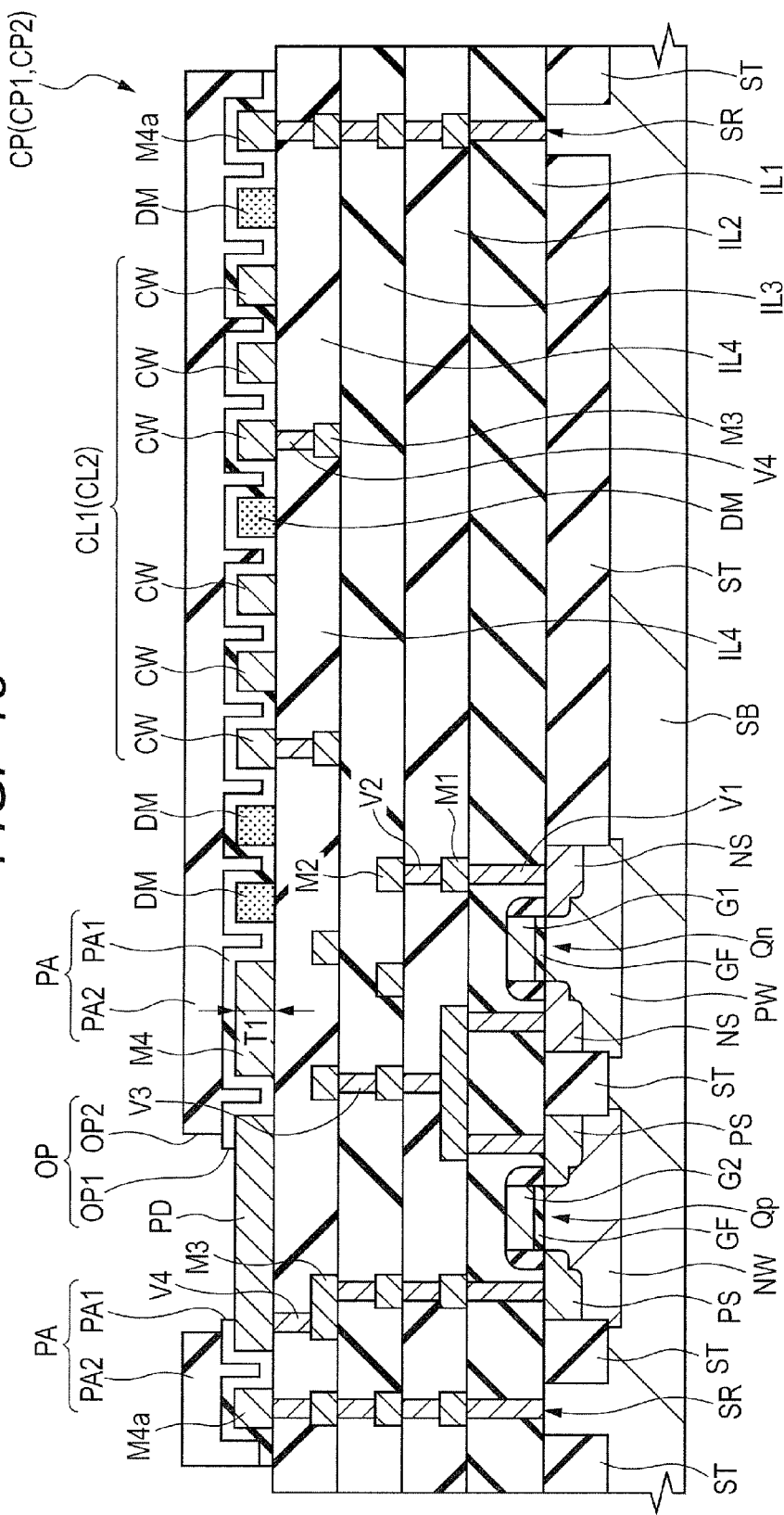
FIG. 18 is a cross sectional view of a semiconductor chip of one embodiment.
Figure 19:
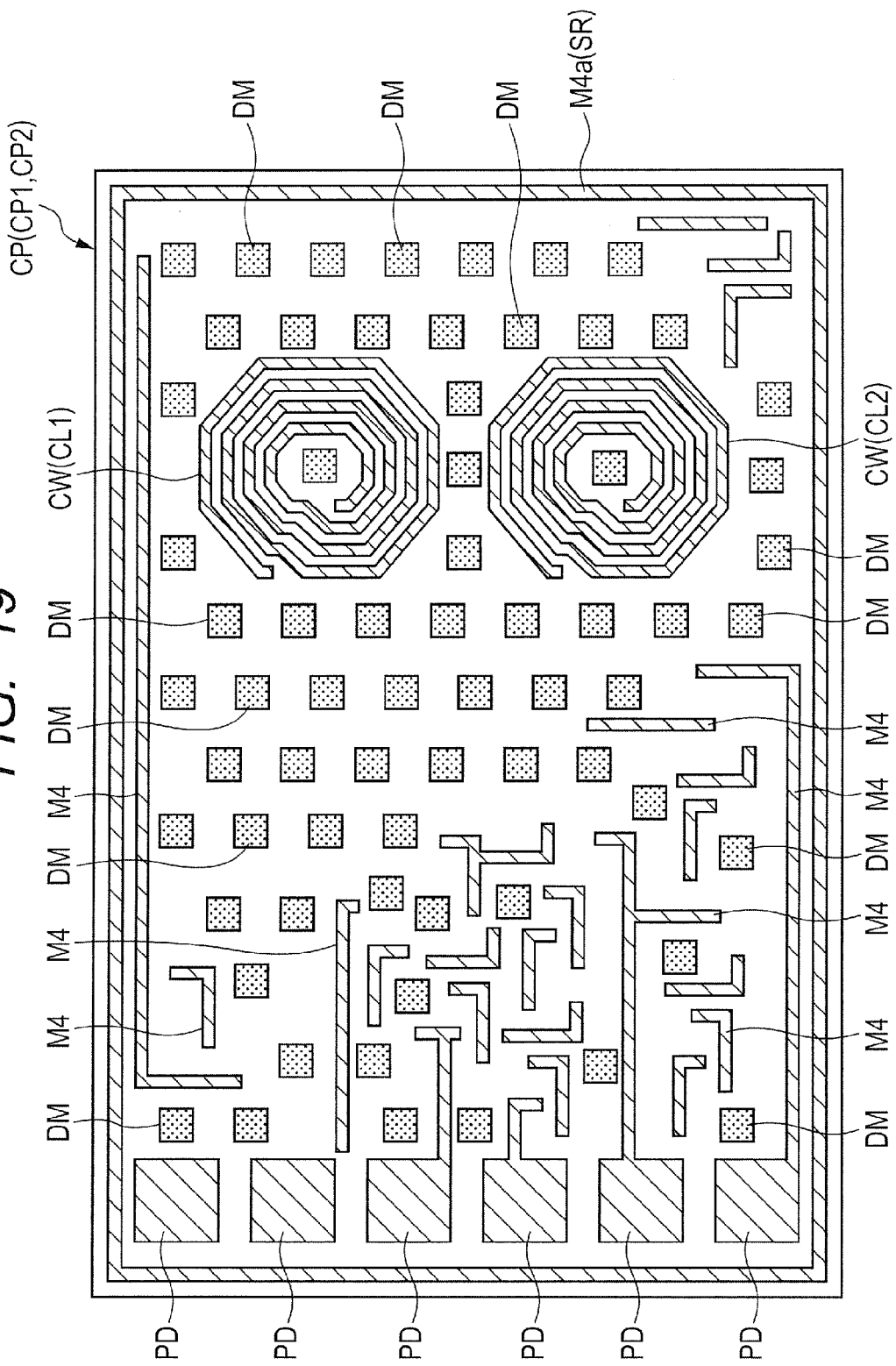
FIG. 19 is a plan view of the semiconductor chip of one embodiment.

FIG. 18 is a cross sectional view schematically showing a cross sectional structure of the semiconductor chip (semiconductor device) CP of the present embodiment. FIG. 19 is a plan view of the semiconductor chip (semiconductor device) CP of the present embodiment. FIG. 19 shows a metal pattern at the uppermost-layer wiring layer (herein, the fourth wiring layer) in the semiconductor chip CP. Herein, the metal pattern of the uppermost-layer wiring layer (herein, the fourth wiring layer) is a pattern formed by a conductive film CD described later.

The semiconductor chip CP shown in FIGS. 18 and 19 is a semiconductor chip corresponding to the semiconductor chip CP1 or the semiconductor chip CP2. Namely, the configuration of the semiconductor chip shown in FIGS. 18 and 19 is applicable to both of the semiconductor chip CP1 and the semiconductor chip CP2.

The semiconductor chip CP of the present embodiment is a semiconductor chip formed using a semiconductor substrate SB formed of a single crystal silicon, or the like.

As shown in FIG. 18, a semiconductor elements such as MISFETs (Metal Insulator Semiconductor Field Effect Transistors) are formed at a semiconductor substrate SB formed of single crystal silicon, or the like, forming the semiconductor chip (semiconductor device) CP of the present embodiment.

For example, in a semiconductor substrate SB1, a p type well PW and an n type well NW are formed. Over the p type well PW, a gate electrode G1 for n channel type MISFET is formed via a gate insulation film GF. Over the n type well NW, a gate electrode G2 for p channel type MISFET is formed via a gate insulation film GF. The gate insulation film GF is formed of, for example, a silicon oxide film. The gate electrodes G1 and G2 are each formed of, for example, a polycrystal silicon film (doped polysilicon film) doped with an impurity.

In the p type well PW in the semiconductor substrate SB, n type semiconductor regions NS for source/drain of an n channel type MISFET are formed. In the n type well NW in the semiconductor substrate SB, p type semiconductor regions PS for source/drain of a p channel type MISFET are formed. The gate electrode G1, the gate insulation film GF under the gate electrode G1, and the n type semiconductor regions NS (source/drain regions) on the opposite sides of the gate electrode G1 form an n channel type MISFET Qn. Whereas, the gate electrode G2, the gate insulation film GF under the gate electrode G2, and the p type semiconductor regions PS (source/drain regions) on the opposite sides of the gate electrode G2 form a p channel type MISFET Qp. The n type semiconductor regions NS can also be formed in a LDD (Lightly doped Drain) structure. In this case, over each sidewall of the gate electrode G1, a sidewall insulation film also referred to as a sidewall spacer is formed. Similarly, the p type semiconductor regions PS can also be formed in a LDD structure. In this case, over each sidewall of the gate electrode G1, a sidewall insulation film also referred to as a sidewall spacer is formed.

Incidentally, herein, the semiconductor elements formed at the semiconductor substrate SB have been described by taking MISFETs as an example. However, other than this, a capacitive element, a resistance element, a memory element, or transistors with other configurations may be formed. When the semiconductor chip CP is the semiconductor chip CP1, the semiconductor elements formed at the semiconductor substrate SB form the transmission circuit TX1 and the reception circuit RX2. When the semiconductor chip CP is the semiconductor chip CP2, the semiconductor elements formed at the semiconductor substrate SB form the transmission circuit TX2, the reception circuit RX1, and the driving circuit DR.

Further, herein, the semiconductor substrate SB has been described by taking a single crystal silicon substrate as an example. However, as another form, a SOI (Silicon On Insulator) substrate, or the like can also be used as the semiconductor substrate SB.

Over the semiconductor substrate SB, a wiring structure including one or more layers of wiring layers is formed. Preferably, a multilayer wiring structure is formed of a plurality of interlayer insulation films and a plurality of wiring layers.

Namely, over the semiconductor substrate SB, a plurality of interlayer insulation films IL1, IL2, IL3, and IL4 are formed. In the plurality of interlayer insulation films IL1, IL2, IL3, and IL4, a plug V1, via parts V2, V3, and V4, and wires M1, M2, M3, and M4 are formed.

Specifically, over the semiconductor substrate SB, the interlayer insulation film IL1 is formed as an insulation film in such a manner as to cover the MISFET. Over the interlayer insulation film IL1, a wire M1 is formed. The wire M1 is a wire of a first wiring layer (the lowermost-layer wiring layer). Over the interlayer insulation film IL1, an interlayer insulation film IL2 is formed as an insulation film in such a manner as to cover the wire M1. Over the interlayer insulation film IL2, a wire M2 is formed. The wire M2 is a wire of a second wiring layer which is a wiring layer one layer higher than the first wiring layer. Over the interlayer insulation film IL2, an interlayer insulation film IL3 is formed as an insulation film in such a manner as to cover the wire M2. Over the interlayer insulation film IL3, a wire M3 is formed. The wire M3 is a wire of a third wiring layer which is a wiring layer one layer higher than the second wiring layer. Over the interlayer insulation film IL3, an interlayer insulation film IL4 is formed as an insulation film in such a manner as to cover the wire M3. Over the interlayer insulation film IL4, a wire M4 is formed. The wire M4 is a wire of a fourth wiring layer which is a wiring layer one layer higher than the third wiring layer. The fourth wiring layer is the uppermost-layer wiring layer.

The plug V1 is formed of a conductor, and is formed in the underlying layer of the wire M1, namely, is formed in the interlayer insulation film IL1 in such a manner as to penetrate through the interlayer insulation film IL1. Thus, the top surface of the plug V1 is in contact with the bottom surface of the wire M1, so that the plug V1 is electrically coupled with the wire M1. Further, the bottom of the plug V1 is coupled with various semiconductor regions (e.g., the n type semiconductor regions NS or the p type semiconductor regions PS) formed in the semiconductor substrate SB, the gate electrodes G1 and G2, and the like. As a result, the wire M1 is electrically coupled via the plug V1 with various semiconductor regions formed in the semiconductor substrate SB, the gate electrodes G1 and G2, and the like.

The via part V2 is formed of a conductor, and is formed between the wire M2 and the wire M1, namely, is formed in the interlayer insulation film IL2, and couples the wire M2 and the wire M1. The via part V2 can also be formed integrally with the wire M2. Whereas, the via part V3 is formed of a conductor, and is formed between the wire M3 and the wire M2, namely, is formed in the interlayer insulation film IL3, and couples the the wire M3 and the wire M2. The via part V3 can also be formed integrally with the wire M3. Whereas, the via part V4 is formed of a conductor, and is formed between the wire M4 and the wire M3, namely, is formed in the interlayer insulation film IL4, and couples the wire M4 and the wire M3. The via part V4 can also be formed integrally with the wire M4.

In the semiconductor chip CP shown in FIGS. 18 and 19, the fourth wiring layer is the uppermost-layer wiring layer, and the wire M4 is the uppermost-layer wire. The first wiring layer (wire M1), the second wiring layer (wire M2), the third wiring layer (wire M3), and the fourth wiring layer (wire M4) establish desirable couplings among the semiconductor elements (e.g., the MISFETs) formed at the semiconductor substrate SB, which enables desirable operations thereof.

The fourth wiring layer which is the uppermost-layer wire forms the pads (pad electrodes or bonding pads) PD. Namely, the pads PD are formed at the same layer as the wire M4. In other words, the wire M4 and the pads PD are formed of the conductive layers at the same layer by the same step. For this reason, as with the wire M4, the pads PD are also formed over the interlayer insulation film IL4.

Whereas, the fourth wiring layer which is the uppermost-layer wiring layer forms the coils CL1 and CL2. Namely, the coils CL1 and CL2 (the coil wire CW for the coil CL1 and the coil wire CW for the coil CL2) are formed at the same layer as the pads PD and the wire M4. In other words, the wires M4, the pads PD, and the coils CL1 and CL2 (the coil wire CW for the coil CL1 and the coil wire CW for the coil CL2) are each formed of the conductive layer at the same layer by the same step. For this reason, as with the wire M4 and the pads PD, the coils CL1 and CL2 (the coil wire CW for the coil CL1 and the coil wire CW for the coil CL2) are also formed over the interlayer insulation film IL4. The coil CL1 (the coil wire CW for the coil CL1) and the coil CL2 (the coil wire CW for the coil CL2) are formed at the same layer.

Further, in the present embodiment, the fourth wiring layer which is the uppermost-layer wiring layer forms dummy wires DM. Namely, the dummy wires DM are formed at the same layer as the pads PD, the wires M4, and the coils CL1 and CL2. In other words, the wires M4, the pads PD, the coils CL1 and CL2, and the dummy wires DM are formed of conductive layers at the same layer by the same step. For this reason, as with the wires M4, the pads PD, and the coils CL1 and CL2, the dummy wires DM are also formed over the interlayer insulation film IL4.

Incidentally, in FIG. 18, in order to make the dummy wires DM distinguishable, only the dummy wires DM are shown with a dotted hatching. Whereas, FIG. 19 is a plan view. For ease of understanding of the drawing, the metal patterns of the fourth wiring layer which is the uppermost-layer wiring layer are hatched. However, also in FIG. 19, in order to make the dummy wires DM distinguishable, of the metal patterns of the fourth wiring layer, only the dummy wires DM are shown with a dotted hatching, and others are given oblique hatching.

The dummy wire DM is not a wire (metal pattern) necessary for passing a current (or applying a voltage). Namely, the dummy wire DM does not function as a wire, also does not function as a pad, and also does not function as an element (e.g., a coil), but is a dummy metal pattern. In other words, the dummy wire DM is a wire (metal pattern) not required in terms of the circuit configuration. The dummy wire is a floating potential pattern. Namely, the dummy wire DM is a metal pattern which is electrically floating (at a floating potential).

For this reason, the dummy wire DM is not a metal pattern necessary for forming the circuits (e.g., the transmission circuits TX1 and TX2, the reception circuits RX1 and RX2, and the driving circuit DR) formed at the semiconductor chip CP, further also is not a wire formed for coupling the pads PD with the circuit, and still further also is not a wire formed for coupling the circuits and the coil CL1 or the coil CL2. In the present embodiment, although described particularly later, the dummy wire DM is formed in order to enhance the flatness of the front surface of the insulation layer of the uppermost layer in the semiconductor chip CP (herein, the top surface of the insulation film PA, namely, the top surface of the resin film PA2). The dummy wire DM is an isolated pattern. In FIG. 19, the dummy wire DM is formed as a rectangular pattern, but can also be formed as a line-shaped pattern.

Thus, in the semiconductor chip CP of the present embodiment, a wiring structure including one or more layers of wiring layers (more preferably, a plurality of wiring layers) is formed over the semiconductor substrate SB. At the uppermost-layer wiring layer (herein, the fourth wiring layer) of the wiring layers included in the wiring structure, the pads PD, the wires M4, the coils CL1 and CL2 (coil wires CW), and the dummy wires DM are formed. For example, when the conductive film (corresponding to a conductive film CD described later) formed over the interlayer insulation film IL4 is patterned, thereby to form the wires M4, not only the wires M4 but also the pads PD, the coils CL1 and CL2 (coil wires CW), and the dummy wires DM can also be formed at the time of patterning the conductive film.

The coil CL1 corresponds to the coil CL1a or the coil CL1b. The coil CL2 corresponds to the coil CL2a or the coil CL2b. The pad PD corresponds to the pad PD1 or the pad PD2. Namely, when the semiconductor chip CP is the semiconductor chip CP1, the coil CL1 corresponds to the coil CL1a, and the coil CL2 corresponds to the coil CL2a, and the pad PD corresponds to the pad PD1. When the semiconductor chip CP is the semiconductor chip CP2, the coil CL1 corresponds to the coil CL1b, and the coil CL2 corresponds to the coil CL2b, and the pad PD corresponds to the pad PD2.

The coil CL1 and the coil CL2 are each formed of a coil wire (coiled wire) CW circling in a spiral form (coiled form or loop form) over the interlayer insulation film IL4. The coil wire CW can be regarded as a wire for coil. Namely, the coil CL1 is formed of the coil wire CW for the coil CL1, and the coil CL2 is formed of the coil wire CW for the coil CL2. The coil wire CW for the coil CL1 and the coil wire CW for the coil CL2 are not connected with each other, and separated and spaced from each other.

The wires M4, the coils CL1 and CL2 (coil wires CW), and the dummy wires DM are covered with the insulation film (protective film or surface protective film) PA, and are not exposed. In contrast, each pad PD is at least partially exposed from an opening OP of the insulation film PA. However, a part of the pad PD is covered with the insulation film PA. Namely, although the pad PD is exposed from the opening OP, the portion of the pad PD not overlapping the opening OP in a plan view is covered with the insulation film PA. Specifically, the central part of the pad PD is not covered with the insulation film PA, and the outer circumference part of the pad PD is covered with the insulation film PA.

The pads PD are electrically coupled with the internal wires of the semiconductor chip CP. For example, the wire M4 formed integrally with the pad PD is provided. The wire M4 formed integrally with the pad PD is coupled with the wire M3 through the via part V4 provided immediately under the wire M4. As a result, the pad PD can be electrically coupled with the wire M3. Alternatively, the following is also acceptable: the via part V4 is provided immediately under the pad PD, and the pad PD is electrically coupled through the via part V4 with the wire M3.

Incidentally, the internal wires of the semiconductor chip CP are the wires formed in the multilayer wiring structure over the semiconductor substrate SB, and herein include the wires M1, M2, M3, and M4.

The coils CL1 and CL2 are electrically coupled with the internal wires of the semiconductor chip CP, respectively, and are coupled with the circuits formed in the semiconductor chip CP via the internal wires of the semiconductor chip CP. For example, a via part V4 is provided immediately under one end of the coil CL1, so that the one end of the coil CL1 can be electrically coupled with the wire M3 through the via part V4. Whereas, another via part V4 is provided immediately under the other end of the coil CL1, so that the other end of the coil CL1 can be electrically coupled with another wire M3 through the via part V4. Whereas, for example, a via part V4 is provided immediately under one end of the coil CL2, so that the one end of the coil CL2 can be electrically coupled with the wire M3 through the via part V4. Further, another via part V4 is provided immediately under the other end of the coil CL2, so that the other end of the coil CL2 can be electrically coupled with another wire M3 through the via part V4.

Further, FIGS. 18 and 19 each show the case where the number of wiring layers formed over the semiconductor substrate SB is 4 (the case of a total of four layers of the wires M1, M2, M3, and M4). However, the number of the wiring layers is not limited to 4, and can be variously changed, but is preferably 2 or more.

As shown in FIG. 18, over the interlayer insulation film IL4, the insulation film PA is formed in such a manner as to cover the wires M4 and the coils CL1 and CL2. The insulation film PA is the uppermost-layer film (insulation film) of the semiconductor chip CP. The insulation film PA can function as the surface protective film of the semiconductor chip CP. The insulation film PA covers and protects the wires M4, the coils CL1 and CL2, and the dummy wires DM. Alternatively, the insulation film PA can also be regarded as a passivation film.

The insulation film PA is preferably formed of a lamination film of a silicon nitride film PA1, and a resin film PA2 over the silicon nitride film PA1. The resin film PA2 is preferably a polyimide film (polyimide resin film). The polyimide film is a polymer including an imide bond at the repeating unit, and is a kind of organic insulation film. As the resin film PA2, other than the polyimide film, there can also be used other organic insulation films of epoxy type, PBO type, acrylic type, WRP type resins, and the like. The polyimide type resins are organic resins preferably used for devices required to be resistant to heat as high as 200° C. or more, and can be used differently according to the mechanical strengths such as thermal expansion coefficient and the ductility, the curing temperature, and the like of the material. The uppermost-layer (the outermost-surface) film of the semiconductor chip CP is set as the resin film PA2. This can also provide advantages such as easy use (easy handling) of the semiconductor chip CP.

The silicon nitride film PA1 and the resin film PA2 are each an insulation film. Accordingly, the insulation film PA can also be regarded as a lamination insulation film of a plurality of stacked insulation films (specifically, two insulation films of a silicon nitride film PA1 and a resin film PA2). Incidentally, in the present application, the lamination insulation film means a lamination film of a plurality of stacked insulation films. As described above, the pad PD is exposed from the opening OP of the insulation film PA. On the other hand, the wire M4, the coils CL1 and CL2, and the dummy wires DM are covered with the insulation film PA, and hence are not exposed.

The insulation film PA has therein an opening OP for exposing at least a part of each pad PD. The insulation film PA is a lamination film of the silicon nitride film PA1 and the resin film PA2. Accordingly, the opening OP in the insulation film PA is formed of an opening OP2 in the resin film PA2, and an opening OP1 in the silicon nitride film PA1.

The pad PD is exposed from the opening OP in the insulation film PA. Namely, the opening OP is provided over the pad PD, so that the pad PD is exposed from the opening OP of the insulation film PA. For this reason, the pad PD exposed from the opening OP of the insulation film PA can be coupled with a conductive coupling member such as the wire BW.

When the semiconductor chip CP is the semiconductor chip CP1, the transmission circuit TX1, the reception circuit RX2, and the coils CL1 and CL2 (corresponding to the coils CL1a and CL2a) are formed in the semiconductor chip CP (CP1). In this case, the coil CL1 (corresponding to the coil CL1a) is coupled via the internal wire of the semiconductor chip CP (CP1) to the transmission circuit TX1 in the semiconductor chip CP (CP1). The coil CL2 (corresponding to the coil CL2a) is coupled via the internal wire of the semiconductor chip CP (CP1) to the reception circuit RX2 in the semiconductor chip CP (CP1).

Whereas, when the semiconductor chip CP is the semiconductor chip CP2, the reception circuit RX1, the transmission circuit TX2, and the coils CL1 and CL2 (corresponding to the coils CL1b and CL2b) are formed in the semiconductor chip CP (CP2). In this case, the coil CL1 (corresponding to the coil CL1b) is coupled via the internal wire of the semiconductor chip CP (CP2) to the reception circuit RX1 in the semiconductor chip CP (CP2). The coil CL2 (corresponding to the coil CL2b) is coupled via the internal wire of the semiconductor chip CP (CP2) to the transmission circuit TX2 in the semiconductor chip CP (CP2).

Further, as shown in FIGS. 18 and 19, a seal ring SR is formed at the outer circumference part of the semiconductor chip CP. The seal ring may also be referred to as a guard ring. The seal ring SR is formed at the outer circumference part of the semiconductor chip CP in such a manner as to circulate along the outer circumference of the semiconductor chip CP in a plan view. Accordingly, in a plan view, the seal ring SR is formed in a ring shape along the outer circumference of the semiconductor chip CP. The outside shape of the semiconductor chip CP is a generally rectangular shape. In accordance with this, the outside shape of the seal ring SR can be set as a generally rectangular shape, a shape obtained by rounding the corners of the rectangle, or a shape obtained by removing the corners of the rectangle. In the semiconductor chip CP, various circuits and semiconductor elements are formed in the region surrounded by the seal ring SR in a plan view. Accordingly, the n channel type MISFET Qn, the p channel type MISFET Qp, the wires M1, M2, M3, and M4, the pads PD, the coils CL1 and CL2 (coil wires CW), and the dummy wires DM are formed (arranged) in the region surround by the seal ring SR in the semiconductor chip CP in a plan view.

The seal ring SR is formed of seal ring wires (metal patterns) Mia, M2a, M3a, and M4a, and seal ring via parts (metal patterns) Via, V2a, V3a, and V4a. The seal ring wire Mia is formed of the same material at the same layer by the same step as for the wire M1. The seal ring wire M2a is formed of the same material at the same layer by the same step as for the wire M2. The seal ring wire M3a is formed of the same material at the same layer by the same step as for the wire M3. The seal ring wire M4a is formed of the same material at the same layer by the same step as for the wire M4. Whereas, the seal ring via part Via is formed of the same material at the same layer by the same step as for the plug V1. The seal ring via part V2a is formed of the same material at the same layer by the same step as for the via part V2. The seal ring via part V3a is formed of the same material at the same layer by the same step as for the via part V3. The seal ring via part V4a is formed of the same material at the same layer by the same step as for the via part V4.

The seal ring SR is formed in a metal wall shape by the seal ring wires Mia, M2a, M3a, and M4a, and the seal ring via parts Via, V2a, V3a, and V4a. Namely, the seal ring SR is formed in a metal wall shape resulting from the vertical array of the seal ring wire M4a, the via part V4a, the wire M3a, the via part V3a, the wire M2a, the via part V2a, the wire Mia, and the via part Via. In other words, the seal ring via part Via, the wire Mia, the via part V2a, the wire M2a, the via part V3a, the wire M3a, the via part V4a, and the wire M4a are formed at different layers, and are stacked from the bottom to the top in this order, thereby to form the seal ring SR as the whole. Therefore, the seal ring via part Via, the wire Mia, the via part V2a, the wire M2a, the via part V3a, the wire M3a, the via part V4a, and the wire M4a are formed at the outer circumference part of the semiconductor chip CP in such a manner as to circulate along the outer circumference of the semiconductor chip CP in a plan view.

The seal ring SR is provided. As a result, when a crack is caused in the cut surface by a dicing blade in the dicing step (cutting step) during manufacturing of the semiconductor chip CP, the extension of the crack can be stopped by the seal ring SR. Further, the penetration of moisture through the cut surface (side surface) of the semiconductor chip CP can be stopped by the seal ring SR.

For this reason, the seal ring wires Mia, M2a, M3a, and M4a, and the via parts Via, V2a, V3a, and V4a are not formed for establishing couplings among elements or circuits, but are formed for forming the seal ring SR.

Further, FIG. 18 shows the case where elements (semiconductor elements) such as MISFETs are not formed immediately under the coils CL1 and CL2. In this case, the elements (semiconductor elements) such as MISFETs can be inhibited or prevented from being affected by the magnetic field generated at the coils CL1 and CL2. As another form, elements (semiconductor elements) such as MISFETs can also be formed immediately under the coils CL1 and CL2. This case is advantageous for miniaturization (reduction in area) of the semiconductor chip.

<Regarding Manufacturing Steps of Semiconductor Chip>

Then, a description will be given to the manufacturing steps of the semiconductor chip (semiconductor device) CP of the present embodiment. The semiconductor chip CP of FIGS. 18 and 19 is manufactured by the following manufacturing steps.

FIGS. 20 to 32 are each an essential part cross sectional view of the semiconductor chip (semiconductor device) CP of the present embodiment during a manufacturing step. FIGS. 20 to 32 each show a cross sectional view corresponding to FIG. 18.

First, as shown in FIG. 20, a semiconductor substrate (semiconductor wafer) SB having a specific resistance of, for example, about 1 to 10 Ωcm, and formed of a p type single crystal silicon is provided (prepared). At this stage, the semiconductor substrate SB is in a semiconductor wafer state.

Then, in the main surface of the semiconductor substrate SB, element isolation regions ST are formed by, for example, a STI (Shallow Trench Isolation) method. Each element isolation region ST is formed by forming a trench in the semiconductor substrate SB, and embedding an insulation film in the trench. In the semiconductor substrate SB, a MISFET is formed in an active region defined (partitioned) by the element isolation regions ST as described later.

Then, as shown in FIG. 21, in (the active region) of the semiconductor substrate SB, semiconductor elements such as MISFETs are formed.

Namely, using an ion implantation method, a p type well PW and an n type well NW are formed. Over the p type well PW and the n type well NW, gate electrodes G1 and G2 are formed via a gate insulation film GF. Using an ion implantation method, n type semiconductor regions NS and p type semiconductor regions PS are formed. As a result, an n channel type MISFET Qn and a p channel type MISFET Qp are formed at the semiconductor substrate SB. Then, by a salicide: Self Aligned Silicide technology, low-resistance metal silicide layers (not shown) can also be formed at respective tops (outer layer parts) of the n type semiconductor regions NS, the p type semiconductor regions PS, and the gate electrodes G1 and G2, and the like.

Figure 22:
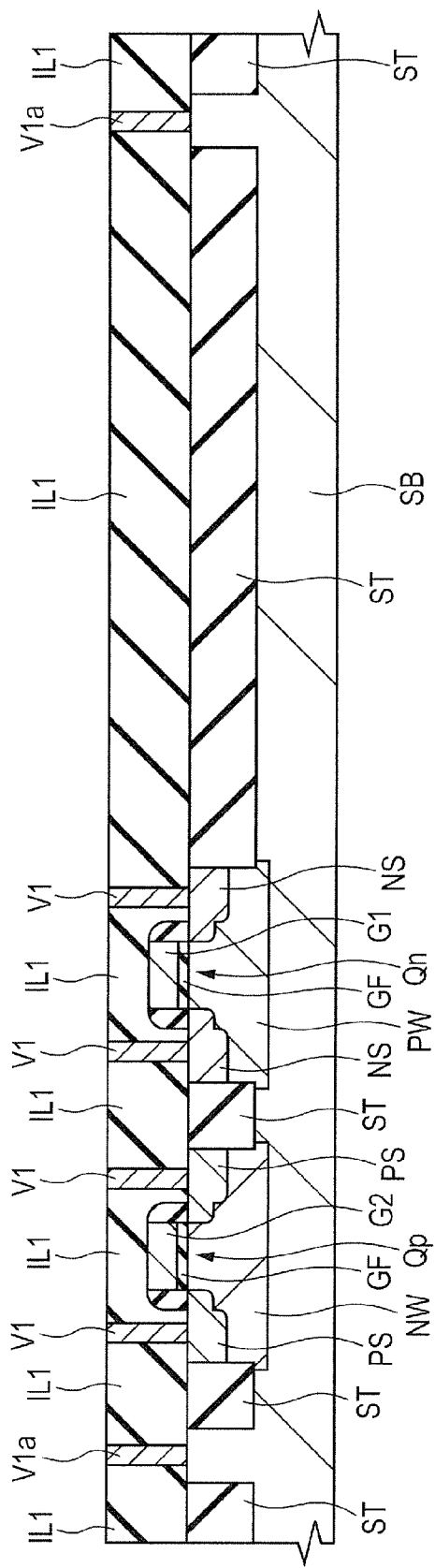
FIG. 22 is a cross sectional view of the semiconductor chip during a manufacturing step following FIG. 21.

Then, as shown in FIG. 22, over the main surface (the entire main surface) of the semiconductor substrate SB, an interlayer insulation film IL1 is formed in such a manner as to cover the MISFETs Qn and Qp. The interlayer insulation film IL1 is formed of, for example, a single film of a silicon oxide film, or a lamination film of a silicon nitride film and a silicon oxide film thicker than the silicon nitride film (the silicon nitride film being on the lower layer side, and the silicon oxide film being on the upper layer side). After deposition of the interlayer insulation film IL1, if required, the front surface (top surface) of the interlayer insulation film IL1 is polished by a CMP (Chemical Mechanical Polishing) method. As a result of this or other procedures, the top surface of the interlayer insulation film IL1 can also be planarized.

Then, using a photoresist layer (not shown) formed over the interlayer insulation film IL1 using a photolithography technology as an etching mask, the interlayer insulation film IL1 is dry etched. As a result, contact holes (through holes or holes) are formed in the interlayer insulation film ILL Then, a conductive film is embedded in each of the contact holes, thereby to form a conductive plug (coupling conductor part) V1. At this step, a seal ring via part Via is also formed.

For forming the plug V1, for example, over the interlayer insulation film IL1 including the inside (over the bottom and the sidewall) of each contact hole, a barrier conductor film (e.g., a titanium film, a titanium nitride film, or a lamination film thereof) is formed by a sputtering method, a plasma CVD method, or the like. Then, a main conductor film formed of a tungsten film, or the like is formed over the barrier conductor film in such a manner as to fill the contact hole by a CVD method, or the like. Then, unnecessary portions of the main conductor film and the barrier conductor film outside the contact hole (over the interlayer insulation film IL1) are removed by a CMP method, an etch back method, or the like. As a result, the top surface of the interlayer insulation film IL1 is exposed. The barrier conductor film and the main conductor film embedded and left in the contact hole in the interlayer insulation film IL1 form the plug V1. In FIG. 22, for simplification of the drawing, the plug V1 is shown with the main conductor film and the barrier conductor film in an integral form. The plug V1 is electrically coupled at its bottom with the n type semiconductor region NS, the p type semiconductor region PS, the gate electrode G1, the gate electrode G2, or the like.

Figure 23:
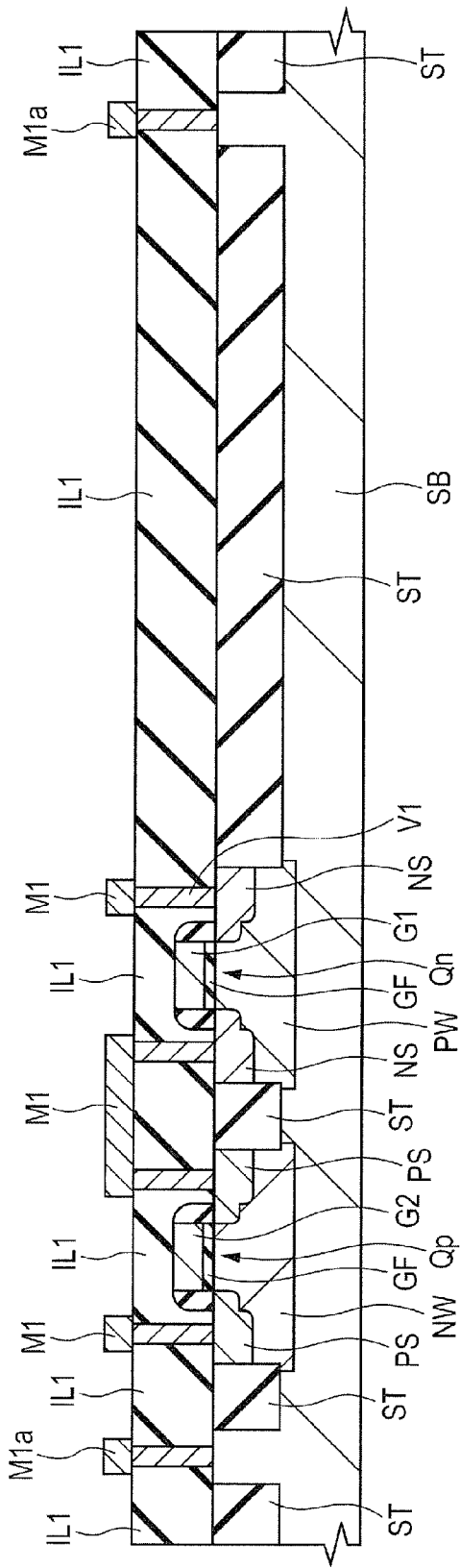
FIG. 23 is a cross sectional view of the semiconductor chip during a manufacturing step following FIG. 22.

Then, as shown in FIG. 23, over the interlayer insulation film IL1 including the plugs V1 embedded therein, the wire M1 of the first wiring layer which is the lowermost-layer wiring layer is formed. For forming the wire M1, first, over the interlayer insulation film IL1 including the plugs V1 embedded therein, a conductive film for the first wiring layer is formed. The conductive film for the first wiring layer is formed of, for example, a lamination film of a barrier conductor film (e.g., a titanium film or a titanium nitride film, or a lamination film thereof), an aluminum film, and a barrier conductor film (e.g., a titanium film or a titanium nitride film, or a lamination film thereof) sequentially from the bottom, and can be formed using a sputtering method, or the like. The aluminum film in the conductive film for the first wiring layer can be regarded as an aluminum film for forming the wire M1. Then, the conductive film for the first wiring layer is patterned using a photolithography technology and an etching technology. As a result, the wire M1 can be formed. At this step, the seal ring wire M1a is also formed. The plug V1 is in contact with the wire M1 at its top surface, thereby to be electrically coupled with the wire M1.

The aluminum film for forming the wire M1 is not limited to a pure aluminum film. Conductive material films including aluminum as a main component (only conductive material films exhibiting metal conduction) can be used. For example, a compound film or an alloy film of Al (aluminum) and Si (silicon), a compound film or an alloy film of Al (aluminum) and Cu (copper), or a compound film or an alloy film of Al (aluminum), Si (silicon), and Cu (copper) can be preferably used as an aluminum film for forming the wire M1. Further, the composition ratio of Al (aluminum) in the aluminum film is preferably larger than 50 at % (atomic %) (i.e., being Al-rich). This also applies not only to the aluminum film for forming the wire M1, but also to the aluminum film for forming the wire M2, the aluminum film for forming the wire M3, and the aluminum film for forming the wire M4.

Further, herein, a description has been given to the case where the wire M1 is formed by a procedure of patterning the conductive film. As another form, the wire M1 can also be formed by a damascene method. In this case, over the interlayer insulation film IL1 including the plugs V1 embedded therein, an insulation film is formed. Then, a wire trench is formed in the insulation film, and a conductive film is embedded in the wire trench. As a result, it is possible to form the wire M1 as an embedded wire (e.g., an embedded copper wire). This also applies to the wire M2 and the wire M3 formed later.

Figure 24:
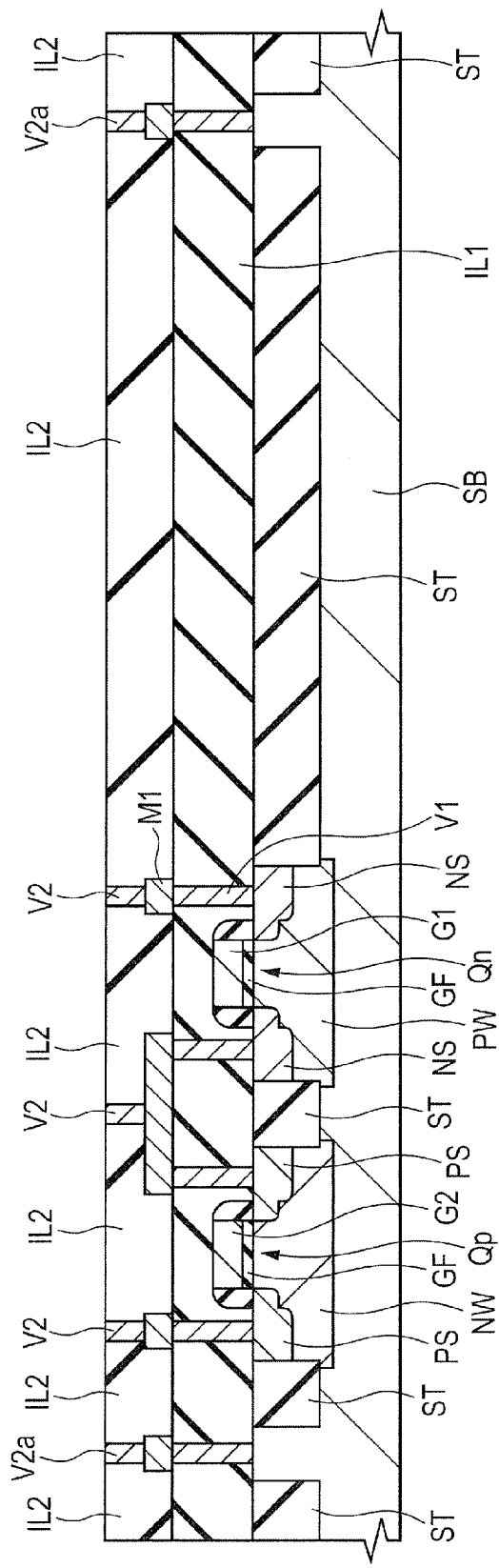
FIG. 24 is a cross sectional view of the semiconductor chip during a manufacturing step following FIG. 23.

Then, as shown in FIG. 24, over the main surface (the entire main surface) of the semiconductor substrate SB, namely, over the interlayer insulation film IL1, an interlayer insulation film IL2 is formed in such a manner as to cover the wire M1. The interlayer insulation film IL2 is formed of a silicon oxide film, or the like, and can be formed using a CVD method, or the like. After deposition of the interlayer insulation film IL2, the front surface (top surface) of the interlayer insulation film IL2 is polished by a CMP method. As a result of this or other procedures, the flatness of the top surface of the interlayer insulation film IL2 can also be enhanced.

Then, using a photoresist layer (not shown) formed over the interlayer insulation film IL2 using a photolithography technology as an etching mask, the interlayer insulation film IL2 is dry etched. As a result, contact holes (through holes or holes) are formed in the interlayer insulation film IL2. Then, a conductive film is embedded in each of the through holes, thereby to form a conductive plug (coupling conductor part) V2. At this step, a seal ring via part V2a is also formed. The via part V2 can also be regarded as a conductive plug. The via part V2 can be formed by the same procedure for the plug V1. However, the via part V2 can also be made different in material for the conductive film from the plug V1. For example, the following is also acceptable: the plug V1 includes a tungsten film as the main body, and the via part V2 includes an aluminum film as the main body.

Figure 25:
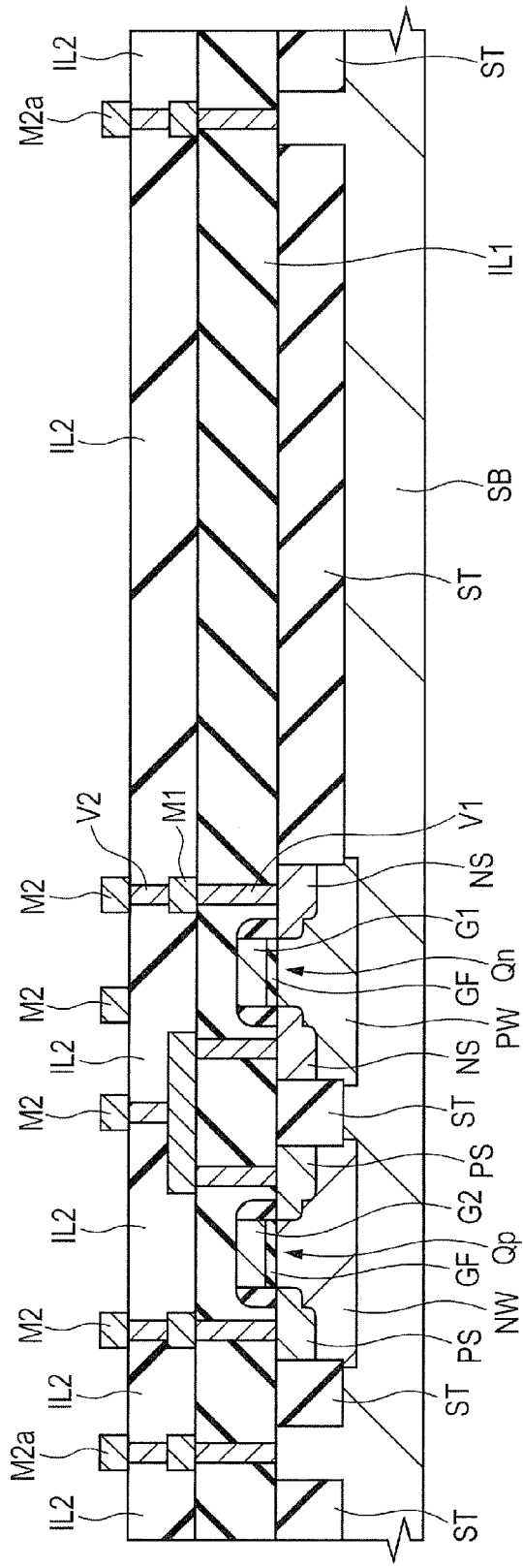
FIG. 25 is a cross sectional view of the semiconductor chip during a manufacturing step following FIG. 24.

Then, as shown in FIG. 25, over the interlayer insulation film IL2 including the via parts V2 embedded therein, the wire M2 of the second wiring layer is formed. For forming the wire M2, first, over the interlayer insulation film IL2 including the via parts V2 embedded therein, a conductive film for the second wiring layer is formed. For the conductive film for the second wiring layer, the same material for the conductive film for the first wiring layer can be used. Then, the conductive film for the second wiring layer is patterned using a photolithography technology and an etching technology. As a result, the wire M2 can be formed. At this step, the seal ring wire M2a is also formed. The via part V2 is in contact with the wire M1 at its bottom surface, thereby to be electrically coupled with the wire M1, and is in contact with the wire M2 at its top surface, thereby to be electrically coupled with the wire M2. Namely, the via part V2 electrically couples the wire M1 and the wire M2.

Figure 26:
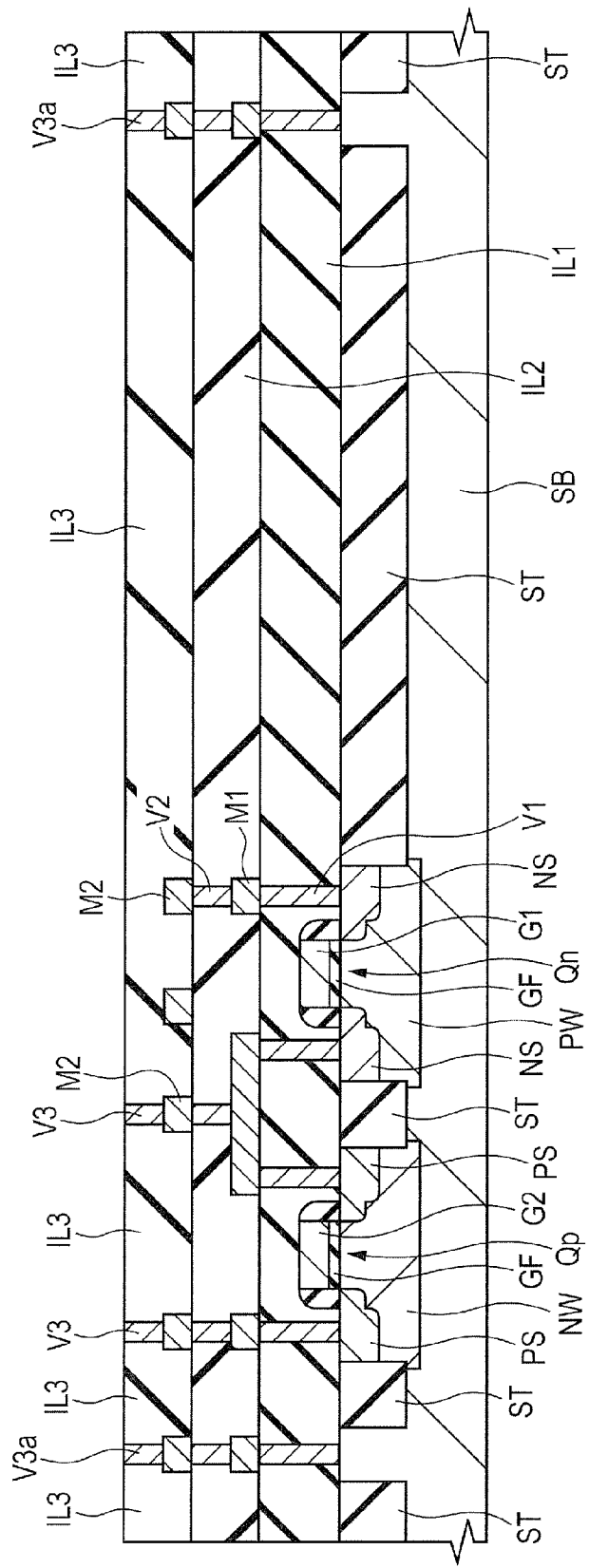
FIG. 26 is a cross sectional view of the semiconductor chip during a manufacturing step following FIG. 25.

Then, as shown in FIG. 26, over the main surface (the entire main surface) of the semiconductor substrate SB, namely, over the interlayer insulation film IL2, the interlayer insulation film IL3 is formed in such a manner as to cover the wire M2. The interlayer insulation film IL3 is formed of a silicon oxide film, or the like, and can be formed using a CVD method, or the like. After deposition of the interlayer insulation film IL3, the front surface (top surface) of the interlayer insulation film IL3 is polished by a CMP method. As a result of this or other procedures, the flatness of the top surface of the interlayer insulation film IL3 can also be enhanced.

Then, using a photoresist layer (not shown) formed over the interlayer insulation film IL3 using a photolithography technology as an etching mask, the interlayer insulation film IL3 is dry etched. As a result, through holes (holes) are formed in the interlayer insulation film IL3. Then, a conductive film is embedded in each of the through holes, thereby to form a conductive via part (coupling conductor part) V3. At this step, a seal ring via part V3a is also formed. The via part V3 can also be regarded as a conductive plug. The via part V3 can be formed of the same conductive material in the same manner as with the via part V2.

Figure 27:
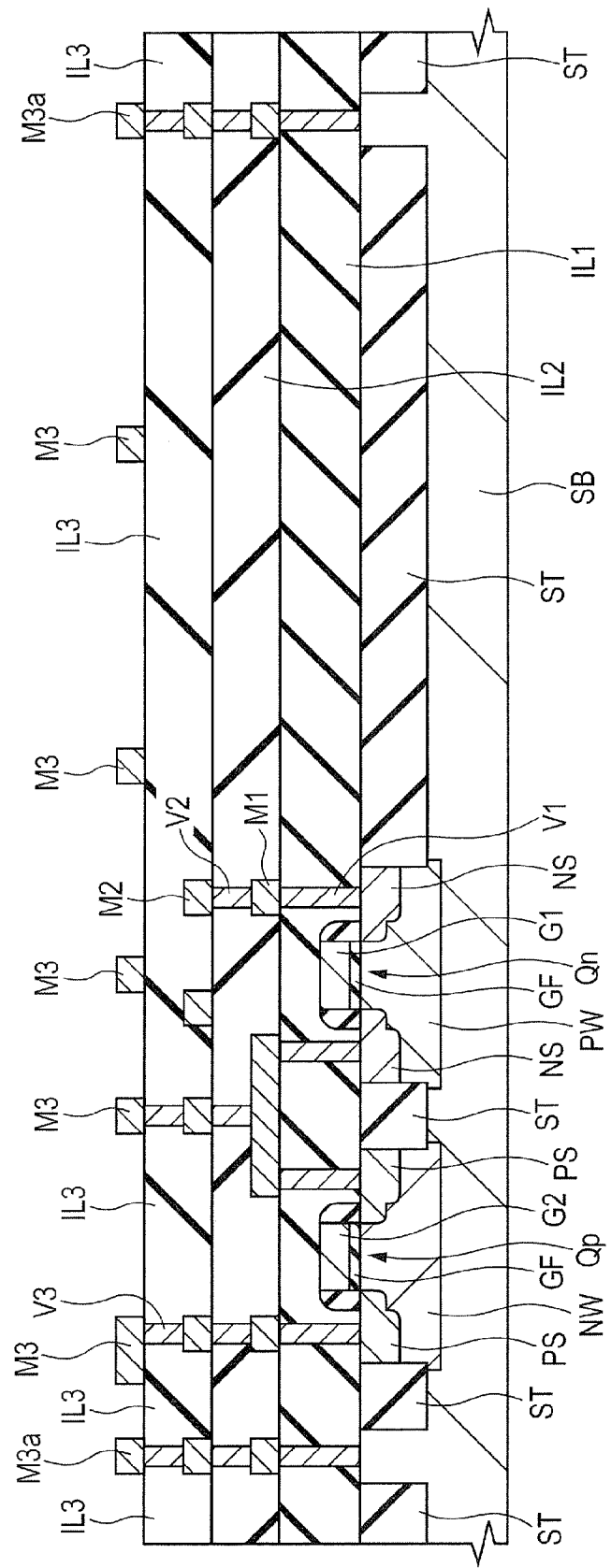
FIG. 27 is a cross sectional view of the semiconductor chip during a manufacturing step following FIG. 26.

Then, as shown in FIG. 27, over the interlayer insulation film IL3 including the via parts V3 embedded therein, the wire M3 of the third wiring layer is formed. For forming the wire M3, first, over the interlayer insulation film IL3 including the via parts V3 embedded therein, a conductive film for the third wiring layer is formed. For the conductive film for the third wiring layer, the same material for the conductive film for the first wiring layer or the conductive film for the second wiring layer can be used. Then, the conductive film for the third wiring layer is patterned using a photolithography technology and an etching technology. As a result, the wire M3 can be formed. At this step, the seal ring wire M3a is also formed. The via part V3 is in contact with the wire M2 at its bottom surface, thereby to be electrically coupled with the wire M2, and is in contact with the wire M3 at its top surface, thereby to be electrically coupled with the wire M3. Namely, the via part V3 electrically couples the wire M2 and the wire M3.

Figure 28:
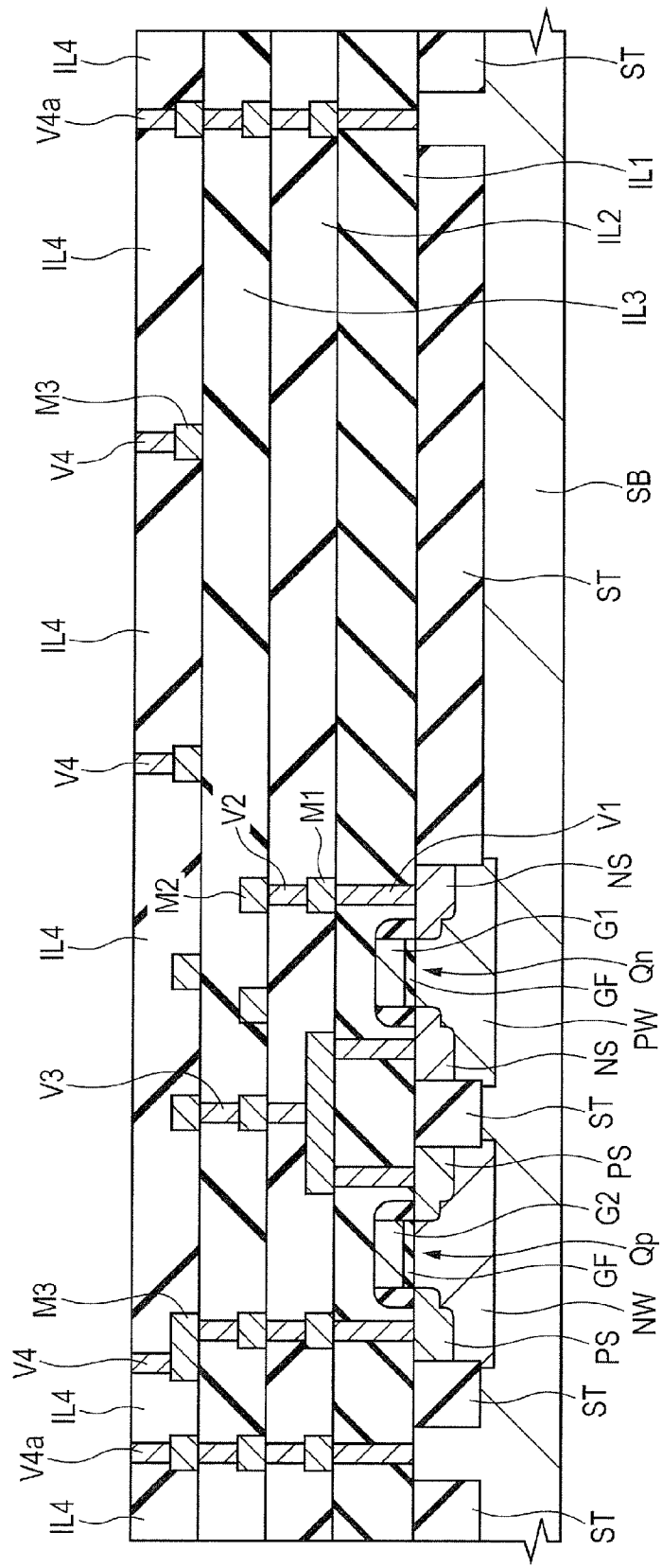
FIG. 28 is a cross sectional view of the semiconductor chip during a manufacturing step following FIG. 27.

Then, as shown in FIG. 28, over the main surface (the entire main surface) of the semiconductor substrate SB, namely, over the interlayer insulation film IL3, an interlayer insulation film IL4 is formed in such a manner as to cover the wire M3. The interlayer insulation film IL4 is formed of a silicon oxide film, or the like, and can be formed using a CVD method, or the like. After deposition of the interlayer insulation film IL4, the front surface (top surface) of the interlayer insulation film IL4 is polished by a CMP method. As a result of this or other procedures, the flatness of the top surface of the interlayer insulation film IL4 can also be enhanced.

Then, using a photoresist layer (not shown) formed over the interlayer insulation film IL4 using a photolithography technology as an etching mask, the interlayer insulation film IL4 is dry etched. As a result, through holes (holes) are formed in the interlayer insulation film IL4. Then, a conductive film is embedded in each of the through holes, thereby to form a conductive via part (coupling conductor part) V4. At this step, a seal ring via part V4a is also formed. The via part V4 can also be regarded as a conductive plug. The via part V4 can be formed of the same conductive material in the same manner as with the via part V3.

Figure 29:
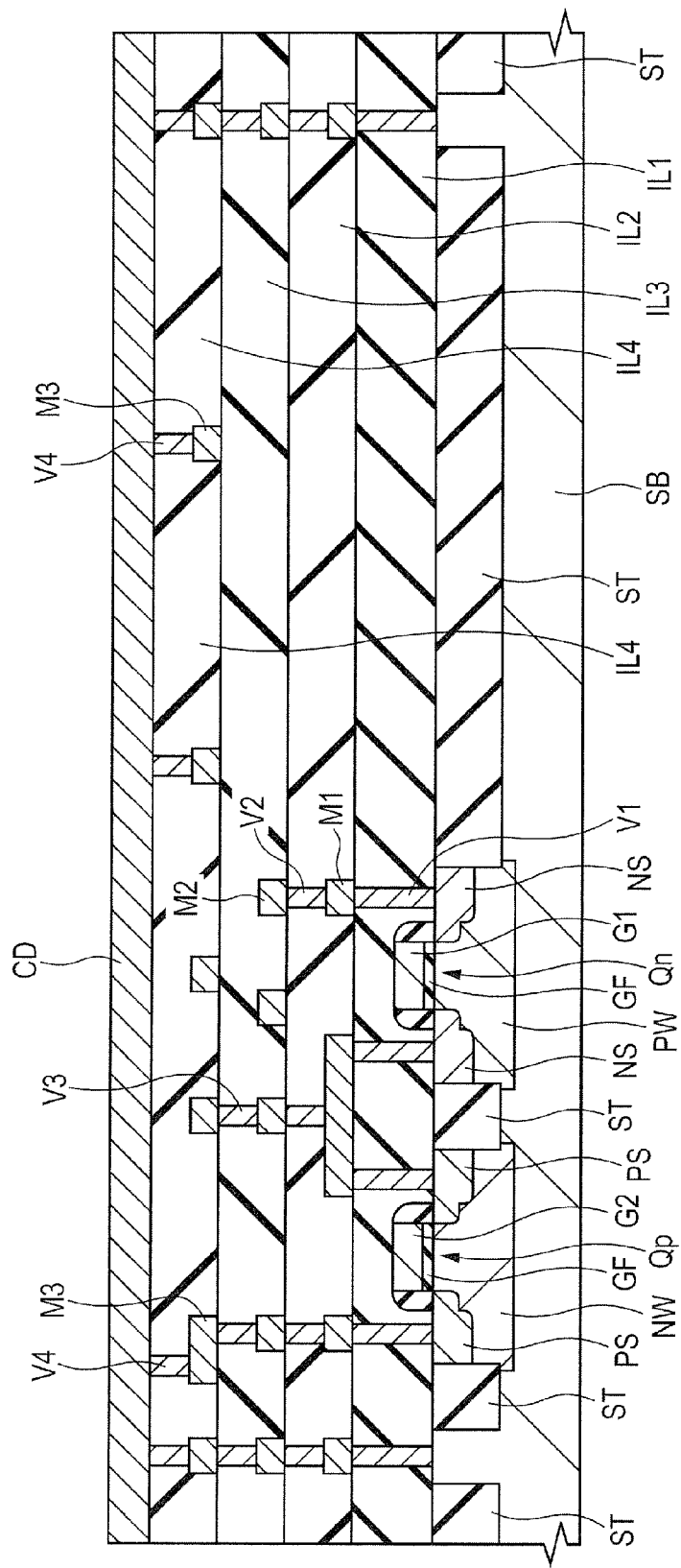
FIG. 29 is a cross sectional view of the semiconductor chip during a manufacturing step following FIG. 28.
Figure 30:
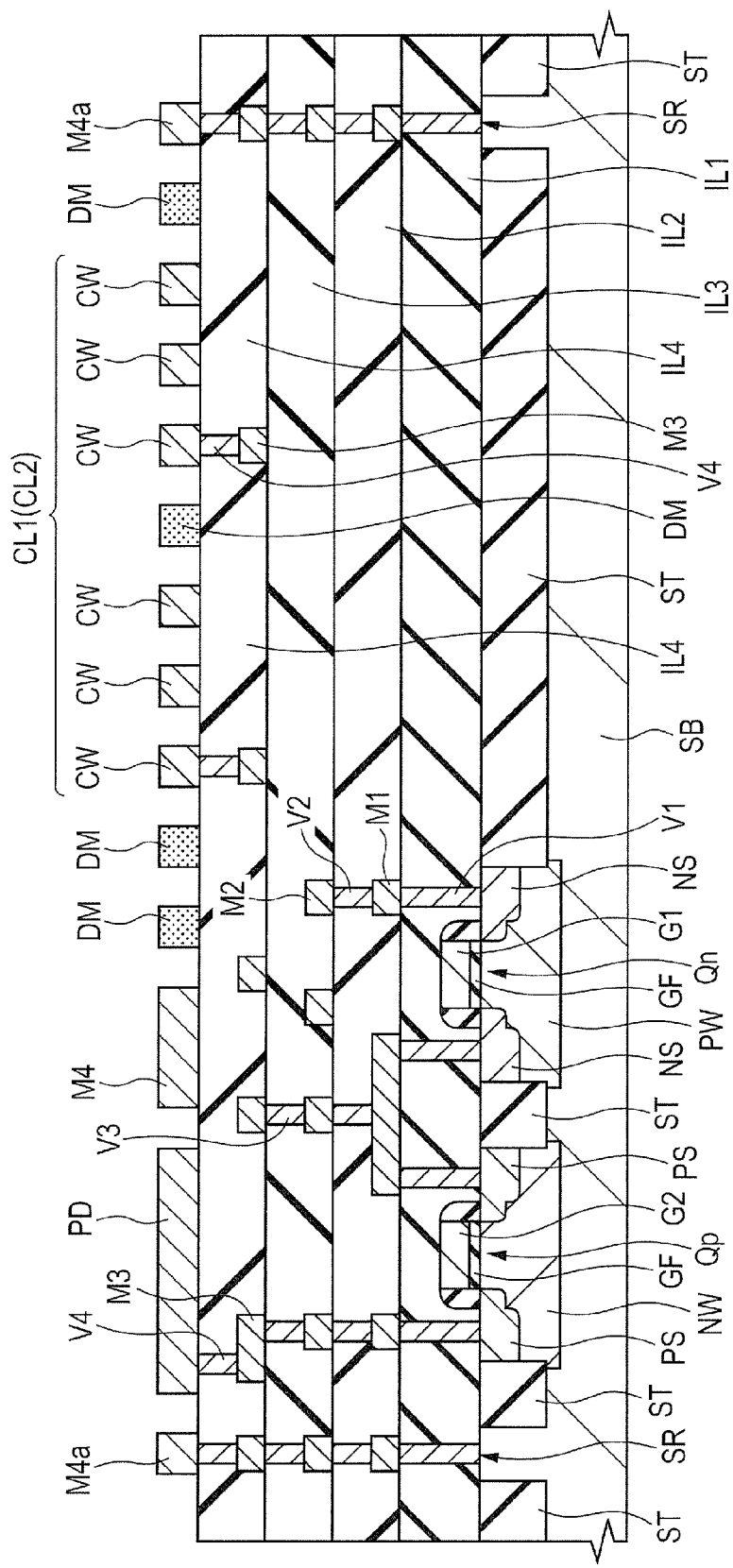
FIG. 30 is a cross sectional view of the semiconductor chip during a manufacturing step following FIG. 29.

Then, over the interlayer insulation film IL4 including the via parts V4 embedded therein, the wire M4 of the fourth wiring layer, the pads PD, the coils CL1 and CL2 (the coil wires CW forming the coils CL1 and CL2), and the dummy wires DM are formed. For forming the wire M4, the pads PD, the coils CL1 and CL2 (coil wires CW), and the dummy wires DM, first, as shown in FIG. 29, over the interlayer insulation film IL4 including the via parts V4 embedded therein, a conductive film CD for the fourth wiring layer is formed. The conductive film CD is formed of a lamination film of, for example, a barrier conductor film (e.g., a titanium film, a titanium nitride film, or a lamination film thereof), an aluminum film, and a barrier conductor film (e.g., a titanium film, a titanium nitride film, or a lamination film thereof) sequentially from the bottom, and can be formed using a sputtering method, or the like. The conductive film CD is a conductive film for the fourth wiring layer, and also serves as a conductive film for forming the wire M4, a conductive film for forming the pads PD, a conductive film for forming the coils CL1 and CL2 (coil wires CW), a conductive film for forming the dummy wires DM, and a conductive film for forming the seal ring wire M4a. Then, the conductive film CD is patterned using a photolithography technology and an etching technology. As a result, as shown in FIG. 30, it is possible to form the wire M4, the pad PD, the coils CL1 and CL2 (coil wires), the dummy wires DM, and the seal ring wire M4a. The wire M4, the pad PD, the coil CL1 (the coil wire CW forming the coil CL1), the coil CL2 (the coil wire CW forming the coil CL2), the dummy wires DM, and the seal ring wire M4a are each formed of the patterned conductive film CD. Incidentally, in FIG. 30, in order to make the dummy wires DM distinguishable, only the dummy wires DM are shown with a dotted hatching.

The via part V4 is in contact with the wire M3 at its bottom surface, thereby to be electrically coupled with the wire M3, and is in contact with the wire M4, the pad PD, the coil CL1 (the coil wire CW forming the coil CL1), or the coil CL2 (the coil wire CW forming the coil CL2) at its top surface, thereby to be electrically coupled with the wire M4, the pad PD, the coil CL1, or the coil CL2. Namely, the via part V4 electrically couples the wire M3 and the wire M4, electrically couples the wire M3 and the pad PD, electrically couples the wire M3 and the coil CL1 (the coil wire CW forming the coil CL1), or electrically couples the wire M3 and the coil CL2 (the coil wire CW forming the coil CL2). Incidentally, the dummy wire DM does not function as a wire for establishing a coupling among the elements or among circuits. For this reason, the via part V4 is not required to be provided immediately under the dummy wire DM.

When the semiconductor chip CP corresponds to the semiconductor chip CP1, the coil CL1 and the coil CL2 are the coil CL1a and the coil CL2a, respectively, and the pad PD is the pad PD1. When the semiconductor chip CP corresponds to the semiconductor chip CP2, the coil CL1 and the coil CL2 are the coil CL1b and the coil CL2b, respectively, and the pad PD is the pad PD2.

Whereas, herein, a description has been given to the case where the via part V4 and the wire M4 are formed by separate steps. As another form, the via part V4 can also be formed by the same step as that for the wire M4, the pad PD, and the coils CL1 and CL2 (the coil wires CW forming the coils CL1 and CL2). In this case, the via part V4 is formed integrally with the wire M4, the pad PD, the coil CL1 (the coil wire CW forming the coil CL1), or the coil CL2 (the coil wire CW forming the coil CL2). In this case, the through hole for the via part V4 is formed in the interlayer insulation film IL4. Then, the conductive film CD is formed over the interlayer insulation film IL4 in such a manner as to fill the through hole. Then, the conductive film CD is patterned using a photolithography technology and an etching technology, thereby to form the wire M4, the pad PD, the coils CL1 and CL2 (coil wires CW), and the dummy wires DM. As a result, the wire M4, the pad PD, the coils CL1 and CL2 (coil wires CW), and the dummy wires DM are formed. In addition, the via part V4 formed integrally with the wire M4, the pad PD, the coil CL1 (the coil wire CW forming the coil CL1), or the coil CL2 (the coil wire CW forming the coil CL2) is also formed.

Further, the via part V2 and the wire M2 can also be formed by the same step. In that case, the via part V2 is formed integrally with the wire M2. Whereas, the via part V3 and the wire M3 can also be formed by the same step. In that case, the via part V3 is formed integrally with the wire M3.

The plan configuration of the pad PD can be set as, for example, a plan configuration of a generally rectangular shape having larger sides than the wire width of the wire M4. The pad PD is preferably an aluminum pad including aluminum as the main body. The wire M4 is preferably an aluminum wire including aluminum as the main body.

Incidentally, As the aluminum film for use in the aluminum pad and the aluminum wire, a compound film or an alloy film of Al (aluminum) and Si (silicon), a compound film or an alloy film of Al (aluminum) and Cu (copper), a compound film or an alloy film of Al (aluminum), Si (silicon), and Cu (copper), or the like can be preferably used. The composition ratio of Al (aluminum) is preferably larger than 50 at % (i.e., being Al-rich).

Figure 31:
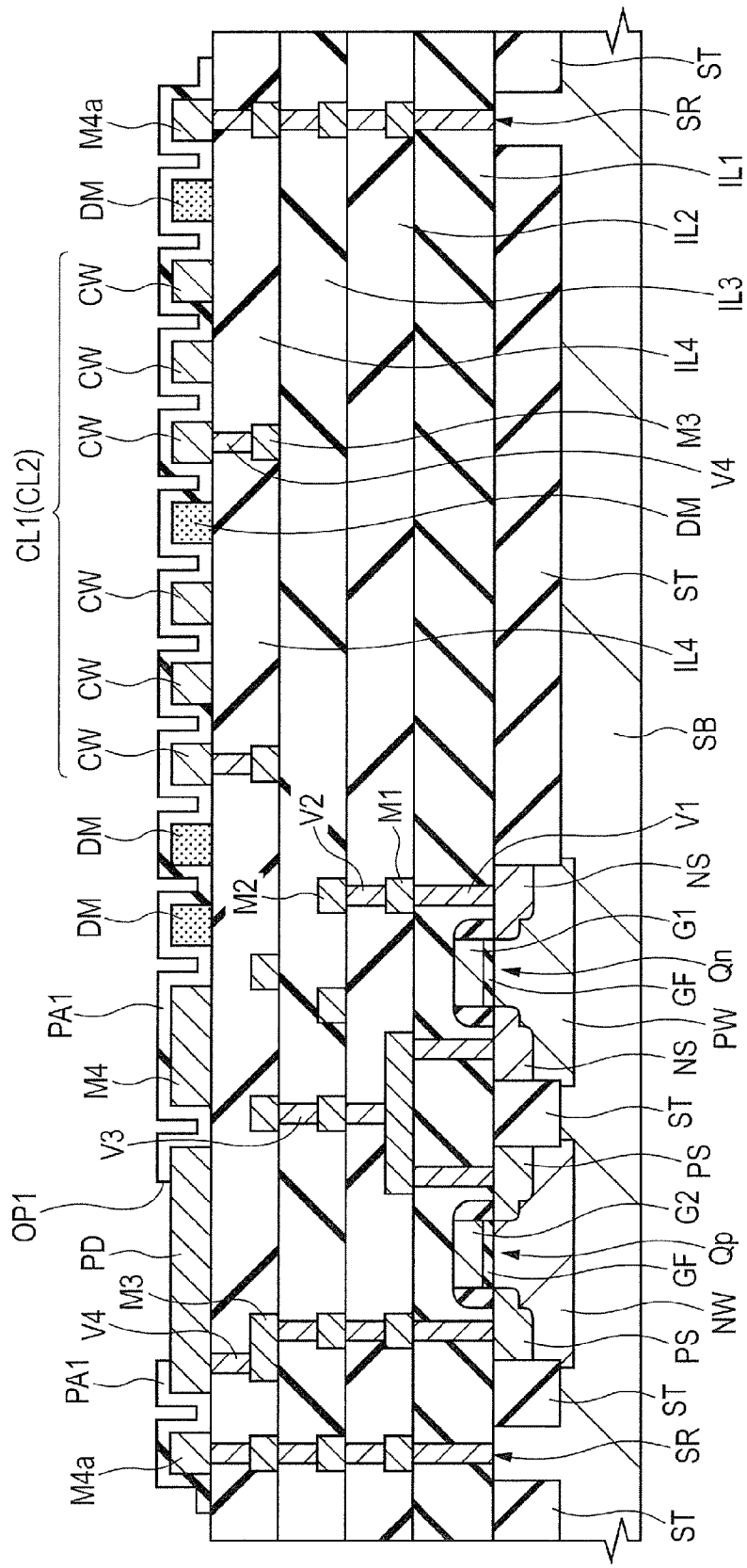
FIG. 31 is a cross sectional view of the semiconductor chip during a manufacturing step following FIG. 30.

Then, as shown in FIG. 31, over the main surface (the entire main surface) of the semiconductor substrate SB, namely, over the interlayer insulation film IL4, a silicon nitride film PA1 is formed in such a manner as to cover the wire M4, the pad PD, the coils CL1 and CL2 (coil wires CW), the dummy wires DM, and the seal ring wire M4a. The silicon nitride film PA1 can be formed by a CVD method, or the like. As the deposition method of the silicon nitride film PA1, a HDP (High Density Plasma)-CVD method is in particular preferable. The thickness (formed film thickness) of the silicon nitride film PA1 can be set at, for example, about 0.3 μm.

At the stage before deposition of the silicon nitride film PA1, the wire M4, the pad PD, the coils CL1 and CL2 (coil wires CW), the dummy wires DM, and the seal ring wire M4a were exposed. Then, upon deposition of the silicon nitride film PA1, the wire M4, the pad PD, the coils CL1 and CL2 (coil wires CW), the dummy wires DM, and the seal ring wire M4a are covered with the silicon nitride film PA1, and hence are not exposed.

Then, an opening OP1 is formed in the silicon nitride film PA1. The opening OP1 is formed by selectively removing the silicon nitride film PA1 over the pad PD. The opening OP1 is formed in such a manner as to be internally included in the pad PD in a plan view. For example, after deposition of the silicon nitride film PA1, over the silicon nitride film PA1, a photoresist pattern (not shown) is formed using a photolithography technology. Using the photoresist pattern as an etching mask, the silicon nitride film PA1 is dry etched. As a result, the opening OP1 can be formed in the silicon nitride film PA1. The opening OP1 is formed in such a manner as to penetrate through the silicon nitride film PA1. Accordingly, at least a part of the pad PD is exposed from the opening OP1. Further, when the opening OP1 is formed in the silicon nitride film PA1, the silicon nitride film PA1 in the scribe region is preferably removed.

Further, when the pad PD is formed of a lamination film of a barrier conductor film, an aluminum film thereover, and a barrier conductor film thereover as described above, preferably, the barrier conductor film (the upper layer side barrier conductor film) exposed from the opening OP1 is removed by etching, so that the aluminum film forming the pad PD is exposed from the opening OP1.

Alternatively, after exposing the aluminum film forming the pad PD from the opening OP1, a base metal film (not shown) can also be formed over the aluminum film exposed from the opening OP1. The base metal film is formed of, for example, a lamination film of a nickel (Ni) film, and a gold (Au) film over the nickel (Ni) film. The formation of the base metal film results in a coupling between the base metal film and the wire BW. This can facilitate coupling of the wire BW.

Figure 32:
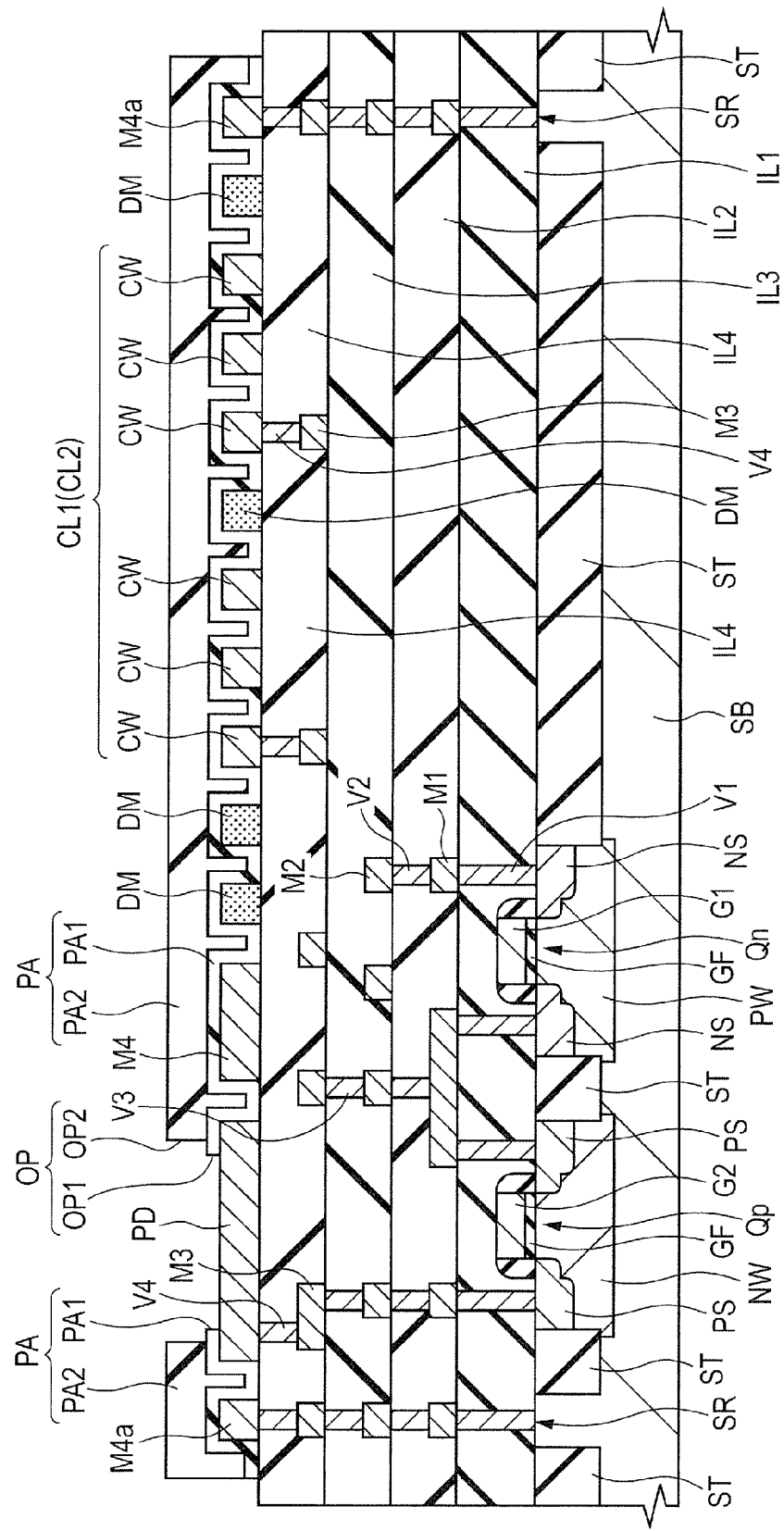
FIG. 32 is a cross sectional view of the semiconductor chip during a manufacturing step following FIG. 31.

Then, as shown in FIG. 32, over the main surface (the entire main surface) of the semiconductor substrate SB, namely, over the silicon nitride film PA1, a resin film PA2 is formed. The resin film PA2 is formed entirely over the main surface of the semiconductor substrate SB, and hence is formed over the silicon nitride film PA1, and over the pad PD exposed from the opening OP1 in the silicon nitride film PA1. As the resin film PA2, a polyimide film or the like can be preferably used. The resin film PA2 can be formed by, for example, a coating method. The thickness (formed film thickness) of the resin film PA2 is larger than the thickness (formed film thickness) of the silicon nitride film PA1, and can be set at, for example, about 3 μm.

The resin film PA2 is formed entirely over the main surface of the semiconductor substrate SB, and hence is formed over the silicon nitride film PA1, and over the pad PD exposed from the opening OP1 in the silicon nitride film PA1. At the stage before deposition of the resin film PA2, the pad PD was exposed from the opening OP1 in the silicon nitride film PA1. Upon deposition of the resin film PA2, the pad PD exposed from the opening OP1 in the silicon nitride film PA1 is covered with the resin film PA2, and hence is not exposed.

Then, an opening OP2 is formed in the resin film PA2. The opening OP2 can be formed, for example, in the following manner. Namely, the resin film PA2 is formed as a photosensitive resin film. The resin film PA2 formed of the photosensitive resin is subjected to exposure to light and development. As a result, a portion of the resin film PA2 to be the opening OP2 is selectively removed, thereby to form the opening OP2 in the resin film PA2. Then, a heat treatment is performed, so that the resin film PA2 is cured. The opening OP2 is formed in such a manner as to penetrate through the resin film PA2. Accordingly, at least a part of the pad PD is exposed from the opening OP2.

Alternatively, as another form, the following is also acceptable: using the photoresist layer formed over the resin film PA2 using a photolithography technology as an etching mask, the resin film PA2 is dry etched; as a result, the opening OP2 is formed in the resin film PA2. In that case, the resin film PA2 is not required to be a photosensitive resin film.

The opening OP2 in the resin film PA2 is formed in such a manner as to internally include the opening OP1 in the silicon nitride film PA1 in a plan view. For this reason, upon formation of the opening OP2 in the resin film PA2, the inner wall of the opening OP1 in the silicon nitride film PA1 is not covered with the resin film PA2, and is exposed. Further, when the opening OP2 is formed in the resin film PA2, the resin film PA2 in the scribe region is preferably removed.

The insulation film PA having the opening OP for exposing at least a part of the pad PD is formed in this manner. The insulation film PA is formed of the silicon nitride film PA1 and the resin film PA2. The insulation film PA has the opening OP for exposing at least a part of the pad PD. However, the opening OP is formed of the opening OP2 in the resin film PA2, and the opening OP1 in the silicon nitride film PA1. The inner wall of the opening OP in the insulation film PA is formed of the inner wall of the opening OP2 in the resin film PA2, the inner wall of the opening OP1 in the silicon nitride film PA1, and the top surface of the silicon nitride film PA1 situated between the inner wall of the opening OP1 and the inner wall of the opening OP2, and not covered with the resin film PA2.

Then, if required, the back surface side of the semiconductor substrate SB is ground or polished, thereby to reduce the thickness of the semiconductor substrate SB. Then, the semiconductor substrate SB is diced (cut) together with the lamination structure over the semiconductor substrate SB. At this step, the semiconductor substrate SB, and the lamination structure over the semiconductor substrate SB are diced (cut) along the scribe region. As a result, a semiconductor chip is obtained from each chip region of the semiconductor substrate SB (semiconductor wafer).

The semiconductor chip (semiconductor device) CP can be manufactured in this manner.

<Regarding Stacking of Semiconductor Chips>

Figure 33:
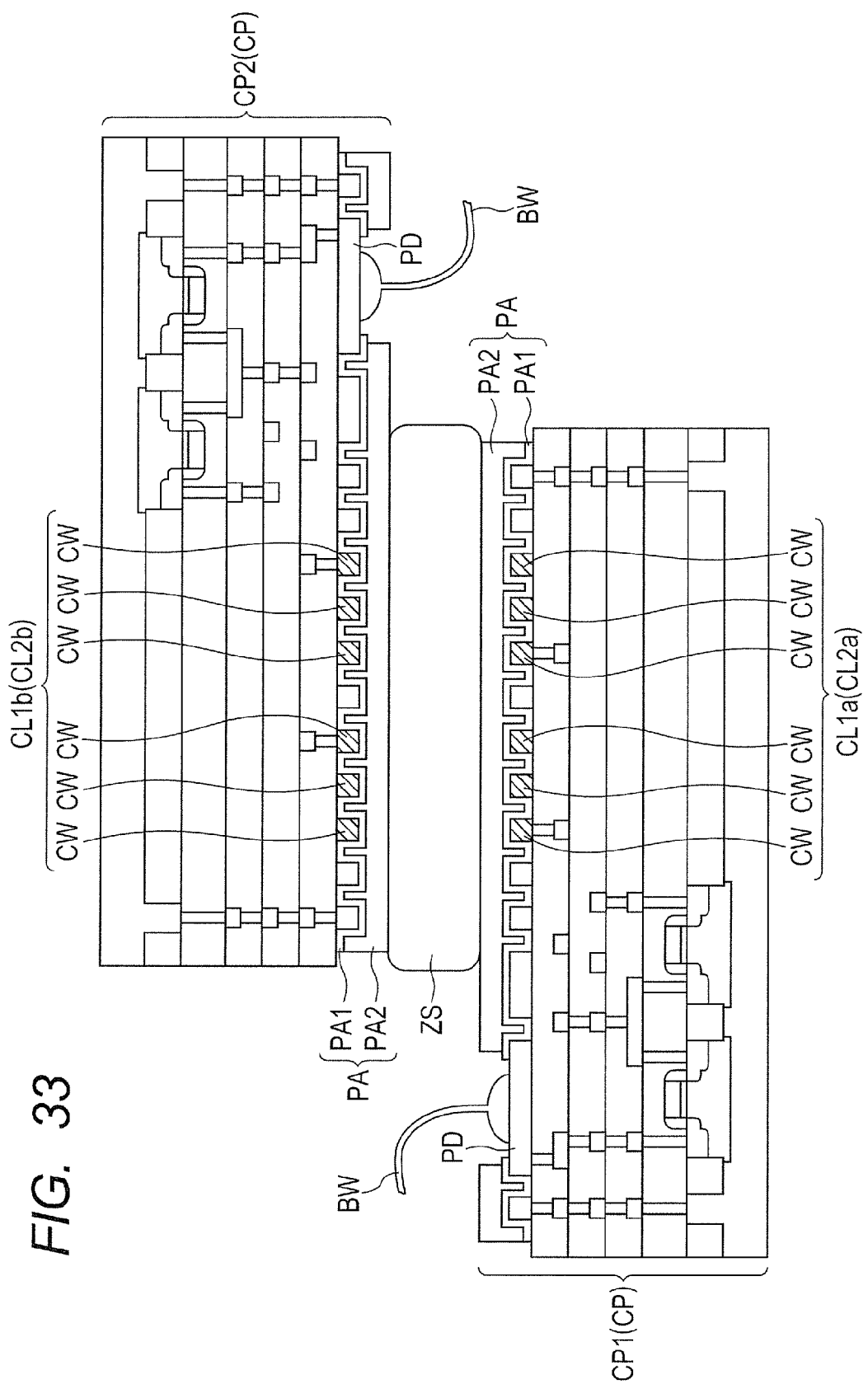
FIG. 33 is a partially enlarged cross sectional view showing a part of the semiconductor package of FIG. 9 on an enlarged scale.

FIG. 33 is a partially enlarged cross sectional view showing a part of the semiconductor package PKG of FIG. 9 on an enlarged scale. Incidentally, in FIG. 33, for ease of understanding of the drawing, the sealing resin part MR, the die pad DP, and the leads LD are not shown.

In FIG. 33, the cross sectional structure of the semiconductor chip CP of FIG. 18 is applied to the cross sectional structures of the semiconductor chips CP1 and CP2. Namely, in FIG. 33, each cross sectional structure of the semiconductor chip CP1 and the semiconductor chip CP2 is roughly the same as the cross sectional structure of the semiconductor chip CP of FIG. 18. However, in actuality, the semiconductor chip CP1 and the semiconductor chip CP2 are different in semiconductor elements and wires according to the difference between the circuits formed in the semiconductor chip CP1 and the circuits formed in the semiconductor chip CP2. However, the foregoing description contents regarding the configuration and the manufacturing method of the semiconductor chip CP is common between the semiconductor chip CP1 and the semiconductor chip CP2.

As shown in FIGS. 18 and 33, the semiconductor chip CP1 has the wiring structure including one or more layers of wiring layers (more preferably, a plurality of wiring layers), the coils CL1a and CL2a formed in the wiring structure, and the insulation film PA formed over the wiring structure. Whereas, the semiconductor chip CP2 has the wiring structure including one or more layers of wiring layers (more preferably, a plurality of wiring layers), the coils CL1b and CL2b formed in the wiring structure, and the insulation film PA formed over the wiring structure. Then, the semiconductor chip CP1 and the semiconductor chip CP2 are stacked one over another via the insulation sheet ZS with the insulation film PA of the semiconductor chip CP1 and the insulation film PA of the semiconductor chip CP2 facing each other. The insulation sheet ZS is interposed between the insulation film PA of the semiconductor chip CP1 and the insulation film PA of the semiconductor chip CP2. The coil CL1a of the semiconductor chip CP1 and the coil CL1b of the semiconductor chip CP2 overlap each other in a plan view, and are magnetically coupled with each other. Whereas, the coil CL2a of the semiconductor chip CP1 and the coil CL2b of the semiconductor chip CP2 overlap each other in a plan view, and are magnetically coupled with each other.

Incidentally, in FIG. 33, for ease of understanding of the drawing, each coil wire CW formed in the semiconductor chips CP1 and CP2 is indicated with black solid fill, and other hatchings are omitted.

The coil CL1a of the semiconductor chip CP1 and the coil CL1b of the semiconductor chip CP2 are not coupled by a conductor, but are magnetically coupled with each other. The coil CL2a of the semiconductor chip CP1 and the coil CL2b of the semiconductor chip CP2 are not coupled by a conductor, but are magnetically coupled with each other.

The insulation film PA of the semiconductor chip CP1, the insulation film PA of the semiconductor chip CP2, and the insulation sheet ZS are interposed between the coil CL1a of the semiconductor chip CP1 and the coil CL1b of the semiconductor chip CP2, which are insulated from each other by the insulation film PA of the semiconductor chip CP1, the insulation film PA of the semiconductor chip CP2, and the insulation sheet ZS. Whereas, the insulation film PA of the semiconductor chip CP1, the insulation film PA of the semiconductor chip CP2, and the insulation sheet ZS are interposed between the coil CL2a of the semiconductor chip CP1 and the coil CL2b of the semiconductor chip CP2, which are insulated from each other by the insulation film PA of the semiconductor chip CP1, the insulation film PA of the semiconductor chip CP2, and the insulation sheet ZS. For this reason, the breakdown voltage (dielectric breakdown voltage) between the semiconductor chip CP1 and the semiconductor chip CP2 can be ensured by the insulation film PA of the semiconductor chip CP1, the insulation film PA of the semiconductor chip CP2, and the insulation sheet ZS. Therefore, the breakdown voltage (dielectric breakdown voltage) between the coil CL1a of the semiconductor chip CP1 and the coil CL1b of the semiconductor chip CP2, and the breakdown voltage (dielectric breakdown voltage) between the coil CL2a of the semiconductor chip CP1 and the coil CL2b of the semiconductor chip CP2 can be ensured by the insulation film PA of the semiconductor chip CP1, the insulation film PA of the semiconductor chip CP2, and the insulation sheet ZS.

Further, in each of the semiconductor chips CP1 and CP2, when the thickness of the insulation film PA is set too large, the semiconductor wafer becomes more likely to warp during manufacturing of the semiconductor chip. As a result, it becomes difficult to perform the manufacturing steps of the semiconductor chips CP1 and CP2. On the other hand, the thickness of the insulation sheet ZS is easy to control. Accordingly, the semiconductor package PKG can be manufactured using the insulation sheet ZS with a desirable thickness. For this reason, the thickness of the insulation sheet ZS is preferably larger than the thickness of the insulation film PA of the semiconductor chip CP1, and further is preferably larger than the thickness of the insulation film PA of the semiconductor chip CP2. In other words, the thickness of the insulation film PA of the semiconductor chip CP1, and the thickness of the insulation film PA of the semiconductor chip CP2 are each preferably smaller than the thickness of the insulation sheet ZS. This can inhibit or prevent the semiconductor wafer from warping during the manufacturing steps of the semiconductor chip. As a result, it becomes easier to perform the manufacturing steps of the semiconductor chips CP1 and CP2. In addition, it becomes possible to sufficiently ensure the breakdown voltage between the semiconductor chip CP1 and the semiconductor chip CP2 mainly by the insulation sheet ZS.

<Regarding Study by the Present Inventors>

The present inventors conducted a study on the following technology: as in FIG. 33 or FIG. 38 described later, two semiconductor chips are stacked one over another with the insulation sheet (ZS) interposed therebetween; thus, the coil of one semiconductor chip and the coil of the other semiconductor chip are magnetically coupled (inductively coupled) with each other; and signals are transmitted from one semiconductor chip to the other semiconductor chip via the magnetically coupled coils.

In accordance with the technology, the dielectric breakdown voltage between one semiconductor chip and the other semiconductor chip can be adjusted by the thickness of the insulation sheet (ZS). For example, when a high dielectric breakdown voltage is necessary, an increase in thickness of the insulation sheet (ZS) interposed between the two semiconductor chips can increase the dielectric breakdown voltage between one semiconductor chip and the other semiconductor chip.

The study by the present inventors indicates the following: with a semiconductor package (semiconductor device) in which an insulation sheet (ZS) is interposed between two semiconductor chips, the coil of one semiconductor chip and the coil of the other semiconductor chip are allowed to overlap each other, and the coil of one semiconductor chip and the coil of the other semiconductor chip are magnetically coupled with each other, the following problem occurs. Namely, the present inventors have found that the following phenomenon may occur: the insulation sheet (ZS) interposed between the two semiconductor chips is peeled from the semiconductor chips, so that the breakdown voltage (dielectric breakdown voltage) between one semiconductor chip and the other semiconductor chip decreases. Below, a specific description will be given with reference to the study example of FIGS. 34 and 35.

Figure 34:
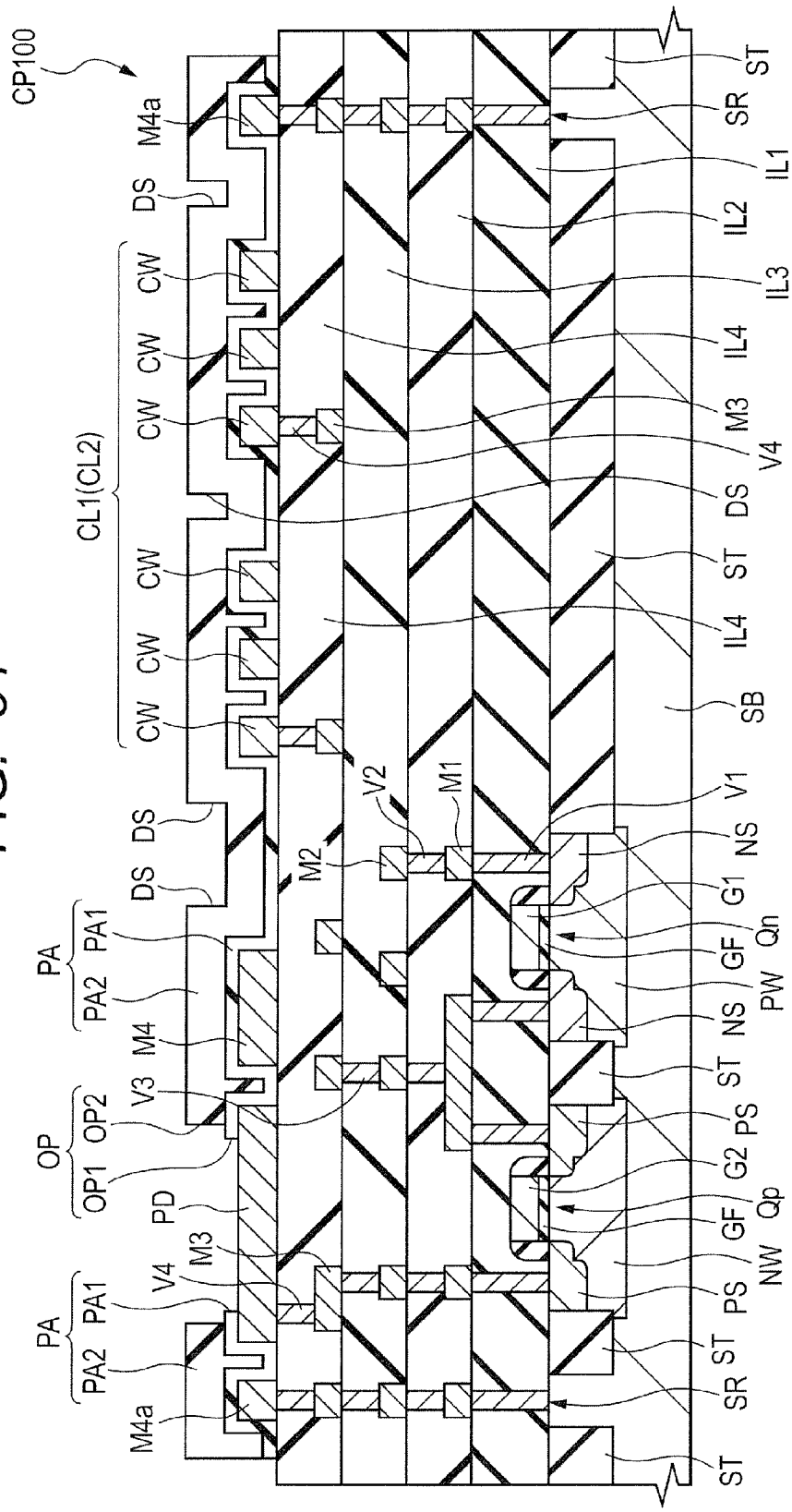
FIG. 34 is a cross sectional view of a semiconductor chip of a study example.
Figure 35:
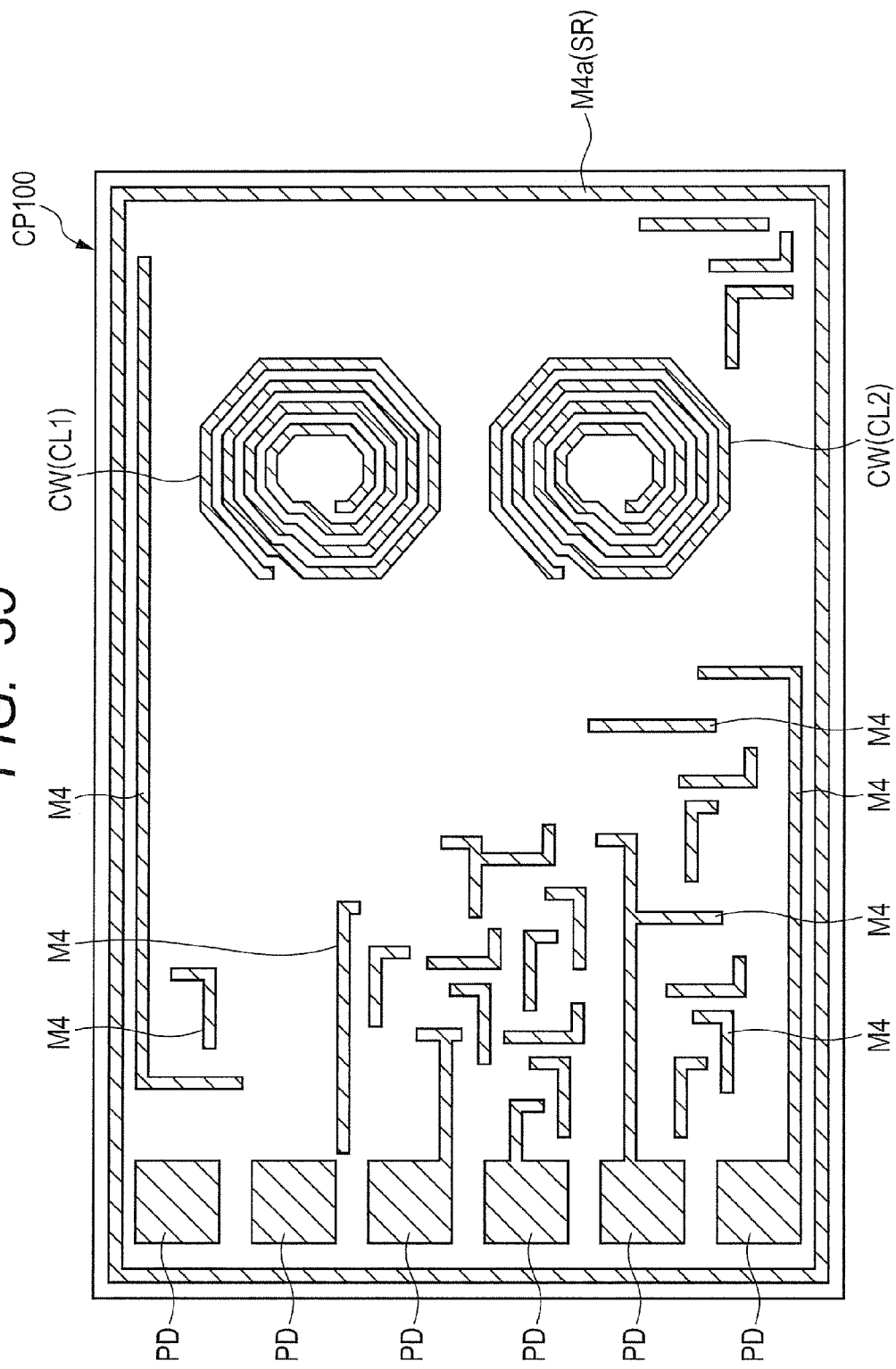
FIG. 35 is a plan view of the semiconductor chip of the study example.

FIG. 34 is a cross sectional view of a semiconductor chip (semiconductor device) CP100 of the study example studied by the present inventors, and corresponds to FIG. 18 of the present embodiment. FIG. 35 is a plan view of the semiconductor chip CP100 of the study example of FIG. 34, and corresponds to FIG. 19 of the present embodiment, in which the metal pattern of the uppermost-layer wiring layer (herein, the fourth wiring layer) is shown.

The semiconductor chip CP100 shown in FIGS. 34 and 35 is mainly different from the semiconductor chip CP of the present embodiment shown in the FIGS. 18 and 19 in that the equivalent of the dummy wire DM is not formed in the semiconductor chip CP100 shown in FIGS. 34 and 35. Namely, in the semiconductor chip CP of the present embodiment shown in the FIGS. 18 and 19, the dummy wires DM are formed at the uppermost-layer wiring layer (herein, the fourth wiring layer). In contrast, in the semiconductor chip CP100 of the study example shown in FIGS. 34 and 35, the equivalent of the dummy wire DM is not formed at the uppermost-layer wiring layer (herein, the fourth wiring layer).

In the semiconductor chip CP100 of the study example shown in FIGS. 34 and 35, the equivalent of the dummy wire DM is not formed at the uppermost-layer wiring layer. Reflecting this, a step difference DS is formed at the top surface of the insulation film PA (i.e., the top surface of the resin film PA2). The step difference DS is formed when the uppermost-layer wiring layer includes therein a void space not having a metal pattern formed therein, and the area of the void space is large to a certain degree. The size (height) of the step difference DS is roughly the same as the thickness (height) of the wire M4, the coil wire CW, and the pad PD formed at the uppermost-layer wiring layer.

Herein, the formation of the step difference DS will be described by reference to FIGS. 36A and 36B and 37A and 37B. FIGS. 36A and 36B, and 37A and 37B are each an explanatory view (cross sectional view) for illustrating the formation of the step difference DS, and each show a part of the semiconductor chip CP100 of the study example.

Figure 36A:
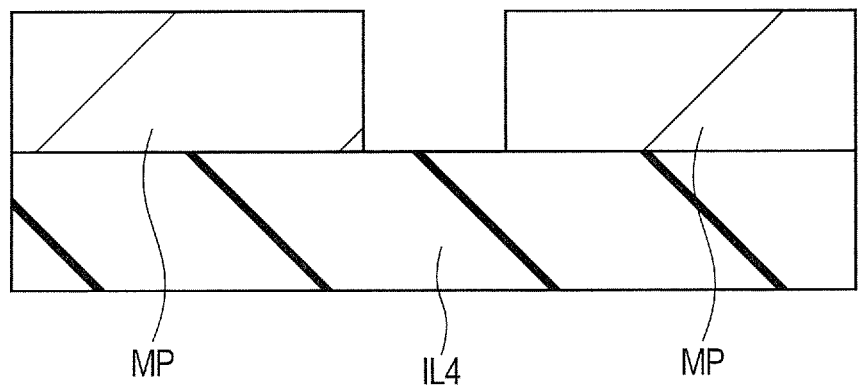
FIGS. 36A and 36B are each an explanatory view for illustrating the formation of a step difference.
Figure 36B:
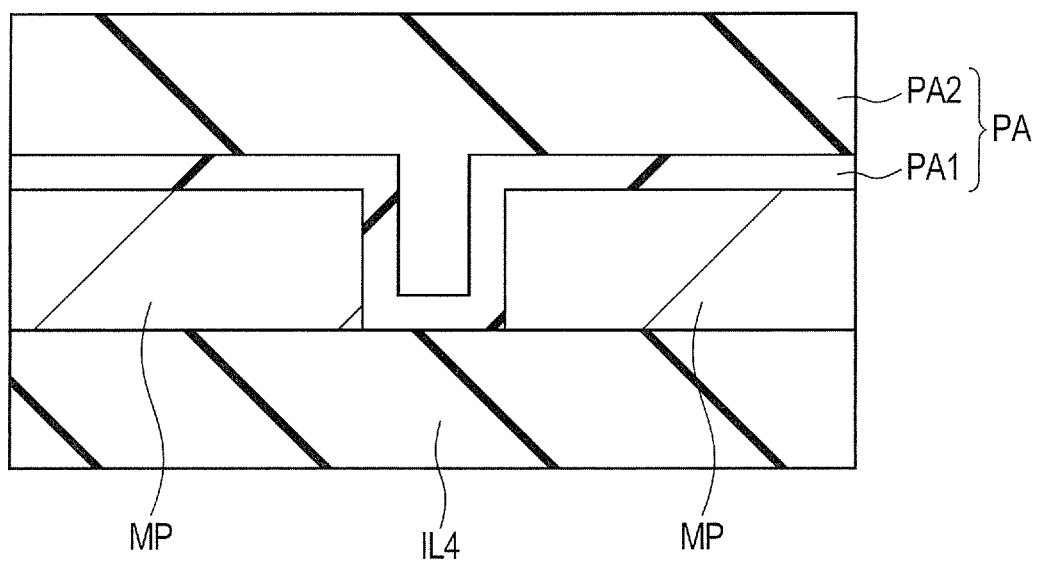
Figure 37A:
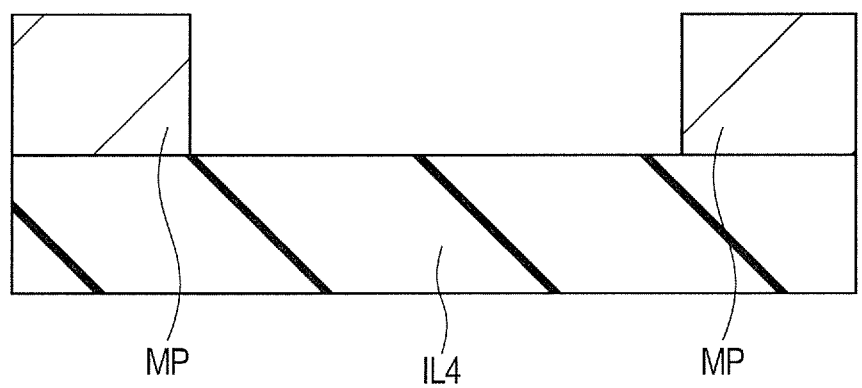
FIGS. 37A and 37B are each an explanatory view for illustrating the formation of a step difference.
Figure 37B:
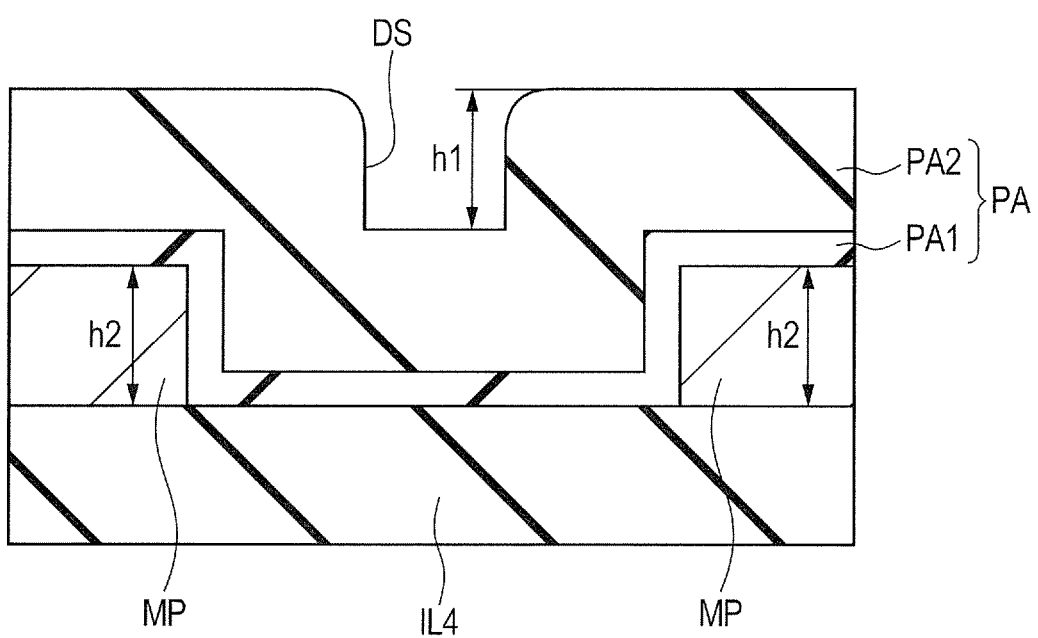

FIGS. 36A and 37A each show the stage at which the uppermost-layer wiring layer (herein, the fourth wiring layer) has been formed over the interlayer insulation film IL4 in the semiconductor chip CP100 of the study example. FIGS. 36B and 37B each show the stage at which the insulation film PA of the uppermost-layer insulation film has been formed. Incidentally, the metal patterns MP shown in FIGS. 36A and 36B and 37A and 37B are the metal patterns formed at the uppermost-layer wiring layer, and correspond to the pad PD, the wire M4, or the coil wire CW shown in FIG. 35. Incidentally, FIGS. 36A and 36B each show the cross section of the region in which the metal patterns are close to each other. FIGS. 37A and 37B each show the cross section of the region in which the metal patterns MP are considerably apart from each other. Namely, the distance between the metal patterns in FIGS. 37A and 37B is considerably larger than the distance between the metal patterns in FIG. 36.

When the distance between the adjacent metal patterns is small to a certain degree as in FIG. 36A, the formation of the insulation film PA results in as follows: as in FIG. 36B, in the region between the adjacent metal patterns MP, a step difference is hardly formed at the top surface of the insulation film PA, so that the top surface of the insulation film PA becomes roughly flat.

However, when the distance between the adjacent metal patterns MP is large to a certain degree as in FIG. 37A, the formation of the insulation film PA results in as follows: as in FIG. 37B, in the region between the adjacent metal patterns MP, a step difference DS is formed at the top surface of the insulation film PA, so that the top surface of the insulation film PA is not flat, and has the step difference DS. The size (height) h1 of the step difference DS is approximately the same as the thickness (height) h2 of the metal pattern MP (h1=h2).

In the semiconductor chip CP100 shown in FIGS. 34 and 35, the equivalent of the dummy wire DM is not formed. This results in the formation of the region in which the distance between the adjacent metal patterns MP is large as in FIGS. 37A and 37B. Thus, a step difference DS is formed at the top surface of the insulation film PA.

Figure 38:
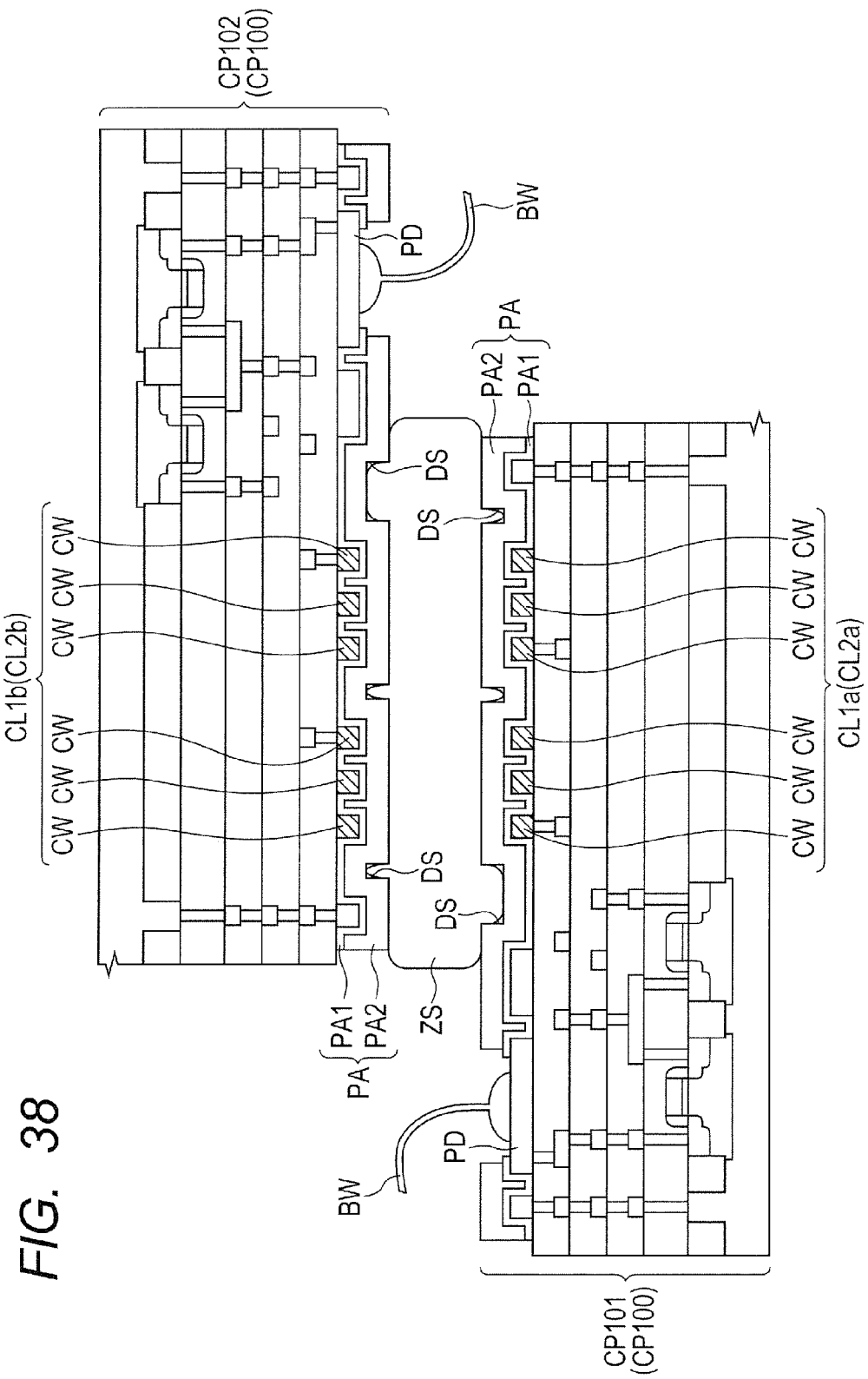
FIG. 38 is a partially enlarged cross sectional view showing a part of the semiconductor package on an enlarged scale when the semiconductor chip of the study example is applied to the semiconductor chip of the semiconductor package of FIG. 9.

FIG. 38 is a partially enlarged cross sectional view showing a part of the semiconductor package on an enlarged scale when the semiconductor chip CP100 of the study example is applied to the semiconductor chip of the semiconductor package PKG of FIG. 9, and corresponds to FIG. 33. As shown in FIG. 38, two semiconductor chips CP101, and CP102 are stacked one over another with the insulation sheet ZS interposed therebetween. To each cross sectional structure of the semiconductor chips CP101 and CP102, the cross sectional structure of the semiconductor chip CP100 of the study example of FIG. 34 is applied. Accordingly, in the semiconductor chips CP101 and CP102 of FIG. 38, the equivalent of the dummy wire DM is not formed. Reflecting this, a step difference DS is formed at the top surface of the insulation film PA at the uppermost layer. Whereas, FIG. 39 is a partially enlarged cross sectional view showing the vicinity of the step difference DS of FIG. 38 on an enlarged scale.

When the two semiconductor chips CP101 and CP102 are stacked one over another with the insulation sheet ZS interposed therebetween, the insulation sheet ZS is interposed between the insulation film PA of the semiconductor chip CP101 and the insulation film PA of the semiconductor chip CP102. When the top surface of the insulation film PA is flat, the insulation sheet ZS can be in close contact with the top surface of the insulation film PA. However, when the step difference DS is formed at the top surface of the insulation film PA, as shown in FIG. 39, at the position adjacent to the step difference DS, the insulation sheet ZS cannot be in close contact with the insulation film PA, resulting in the formation of a void (space or gap) VD between the insulation sheet ZS and the insulation film PA.

Figure 39:
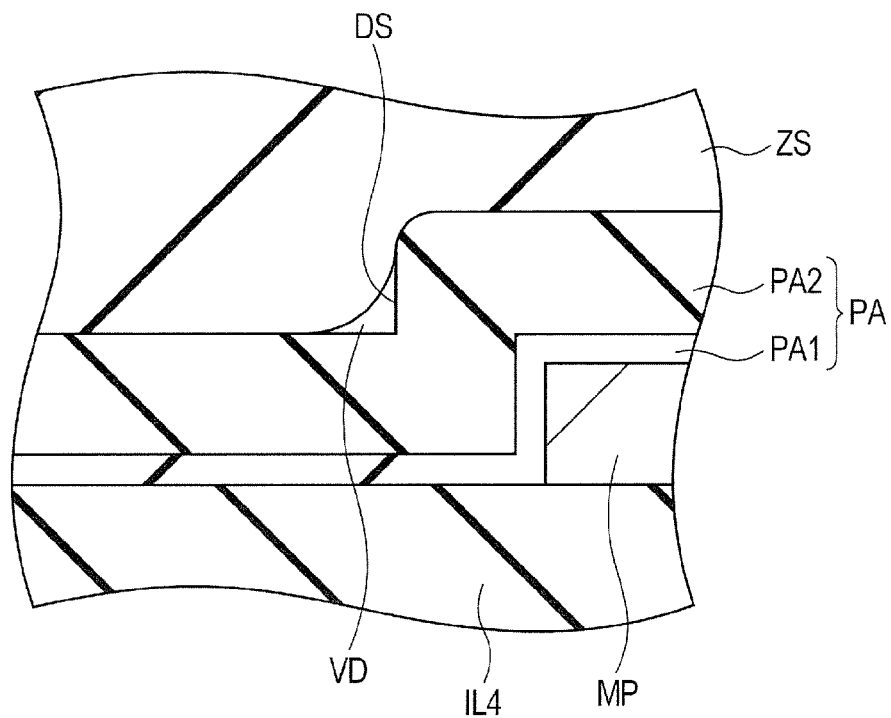
FIG. 39 is a partially enlarged cross sectional view of FIG. 38.

As shown in FIG. 39, when the void VD is formed between the insulation sheet ZS and the insulation film PA at the position adjacent to the step difference DS, the insulation sheet ZS becomes more likely to be peeled from the semiconductor chip CP101 or the semiconductor chip CP102 with the void VD as a starting point. Peeling of the insulation sheet ZS from the semiconductor chip CP101 or the semiconductor chip CP102 leads to a reduction of the breakdown voltage (dielectric breakdown voltage) between the semiconductor chip CP101 and the semiconductor chip CP102. Particularly, peeling thereof leads to a reduction of the breakdown voltage (dielectric breakdown voltage) between the magnetically coupled coil in the semiconductor chip CP101 and coil in the semiconductor chip CP102. For this reason, when the semiconductor device (semiconductor package) operates at a high voltage, the semiconductor device (semiconductor package) undergoes dielectric breakdown, or other failures, incurring a degradation of the reliability. Further, when the insulation sheet ZS is peeled from the semiconductor chip CP101 or the semiconductor chip CP102, the peeled portion serves as a penetration path for the moisture, or the like, leading to a reduction of the moisture resistance. This entails a degradation of the reliability such as the dielectric breakdown of the semiconductor device (semiconductor package) under high moist environment.

<Regarding Main Features and Effects>

In the semiconductor device (semiconductor package) PKG of the present embodiment, the semiconductor chip CP1 and the semiconductor chip CP2 are stacked one over another with the insulation sheet ZS interposed therebetween; and the coils (CL1*a* and CL2*a*) in the semiconductor chip CP1 and the coils (CL1*b* and CL2*b*) in the semiconductor chip CP2 are magnetically coupled with each other, respectively.

As a result, the signal transmission between the semiconductor chip CP1 and the semiconductor chip CP2 can be performed using the magnetic coupling (inductive coupling) between the coils (inductors).

As distinct from the present embodiment, it is assumed that the primary coil and the secondary coil forming the signal transmitting transformer are formed in the same semiconductor chip. In this case, the breakdown voltage (dielectric breakdown voltage) between the primary coil and the secondary coil formed in the same semiconductor chip is ensured by the interlayer insulation film interposed between the primary coil and the secondary coil. However, when the thickness of the interlayer insulation film is set too large, the semiconductor wafer becomes more likely to warp during manufacturing of the semiconductor device (semiconductor chip). As a result, it becomes difficult to perform the manufacturing steps of the semiconductor device (semiconductor chip). Further, when the thickness of the interlayer insulation film is set too large, it becomes difficult to form the wiring structure. This imposes a limit on the increase in thickness of the interlayer insulation film. Accordingly, there is a limit on the increase in breakdown voltage (dielectric breakdown voltage) between the primary coil and the secondary coil formed in the same semiconductor chip.

In contrast, in the present embodiment, the primary coil and the secondary coil forming the signal transmitting transformer are formed in different semiconductor chips. Namely, the coil formed in the semiconductor chip CP1 and the coil formed in the semiconductor chip CP2 are magnetically coupled with each other, thereby to form a signal transmitting transformer. Then, an insulation sheet is interposed between the semiconductor chip CP1 and the semiconductor chip CP2. For this reason, the breakdown voltage (dielectric breakdown voltage) between the primary coil and the secondary coil can be ensured by the insulation film (PA) formed over the coils (CL1*a* and CL2*a*) in the semiconductor chip CP1, the insulation film (PA) formed over the coils (CL1*b* and CL2*b*) in the semiconductor chip CP2, and the insulation sheet ZS interposed between the semiconductor chip CP1 and the semiconductor chip CP2. The thickness of the insulation sheet ZS can be selected according to the required breakdown voltage (dielectric breakdown voltage). For this reason, it is possible to increase the breakdown voltage (dielectric breakdown voltage) between the primary coil and the secondary coil with ease and with precision. For example, in the case of the specifications of a high required level of the breakdown voltage (dielectric breakdown voltage) between the primary coil and the secondary coil, the thickness of the insulation sheet ZS is increased in accordance with the specifications. This can provide a semiconductor device (semiconductor package) satisfying the specifications.

However, the study by the present inventors indicates as follows: as described by reference to the study example, in the semiconductor package in which the semiconductor chips CP101 and CP102 are stacked one over another with the insulation sheet ZS interposed therebetween, when the step difference DS causes the formation of the void (see FIG. 39) at the position adjacent to the step difference DS, the insulation sheet ZS becomes more likely to be peeled from the semiconductor chips CP101 and CP102. Peeling of the insulation sheet ZS entails a reduction of the breakdown voltage (dielectric breakdown voltage) between the coil in the semiconductor chip CP101 and the coil in the semiconductor chip CP102. This leads to a degradation of the reliability of the semiconductor device (semiconductor package).

In contrast, in the present embodiment, the dummy wires DM are formed at the uppermost-layer wiring layer of the wiring structure of the semiconductor chip CP1. Similarly, the dummy wires DM are formed at the uppermost-layer wiring layer of the wiring structure of the semiconductor chip CP2. By forming the dummy wires DM at the uppermost-layer wiring layer, it becomes possible to inhibit or prevent the formation of a step difference such as the step difference DS at the top surface of the insulation film PA at each uppermost layer of the semiconductor chips CP1 and CP2.

In the insulation film PA at the uppermost layer of the semiconductor chip, the step difference DS is formed due to the following: there is a void space in which no metal pattern is formed, and the void space is a portion with a large area; and the distance between the adjacent metal patterns is large there. This results in the formation of the step difference DS at the top surface of the insulation film PA. As compared with the case of the study example (FIGS. 34 and 35) in which the dummy wire DM is not formed at the uppermost-layer wiring layer, when the dummy wires DM are formed, the dummy wires DM are formed in a region in which the pad PD, the wire M4, and the coil wire CW are not formed; accordingly, the distance between the metal patterns at the uppermost-layer wiring layer can be reduced by that extent. Namely, the void space (the region in which no metal pattern is formed) at the uppermost-layer wiring layer can be reduced by the extent equivalent to the formed dummy wires DM. As a result, the distance between the metal patterns at the uppermost-layer wiring layer can be reduced. For this reason, it is possible to inhibit or prevent the formation of a step difference such as the step difference DS at the top surface of the insulation film PA.

The reason why the dummy wires DM are formed at the uppermost-layer wiring layer of each wiring structure of the semiconductor chips CP1 and CP2 is as follows: a step difference such as the step difference DS is inhibited or prevented from being formed at the top surface of the insulation film PA at each uppermost layer of the semiconductor chips CP1 and CP2. Then, the reason why a step difference such as the step difference DS is inhibited or prevented from being formed at the top surface of the insulation film PA is as follows: the void VD is prevented from being formed between the insulation sheet ZS and the insulation film PA at the position adjacent to the step difference DS; this prevents peeling of the insulation sheet ZS from the semiconductor chip (CP1 or CP2). Accordingly, the region of the top surface of the insulation film PA at each uppermost layer of the semiconductor chips (CP1 and CP2) in which a step difference such as the step difference DS is required to be inhibited or prevented from being formed is the region overlapping the insulation sheet ZS. In the region of the top surface of the insulation film PA at each uppermost layer of the semiconductor chips (CP1 and CP2) not overlapping the insulation sheet ZS, even when a step difference such as the step difference DS is formed, the formation of the void VD between the insulation sheet ZS and the insulation film PA is not caused; therefore, peeling of the insulation sheet ZS is not caused. Therefore, it is important to inhibit or prevent the formation of a step difference such as the step difference DS at the top surface of the insulation film PA in the region overlapping the insulation sheet ZS in each of the semiconductor chips CP1 and CP2.

For this reason, in each of the semiconductor chips CP1 and CP2, in order to inhibit or prevent the formation of a step difference such as the step difference DS at the top surface of the insulation film PA in the region overlapping the insulation sheet ZS, in the present embodiment, various ideas are implemented in relation to the dummy wire DM. More preferably, the following features are provided.

In the present embodiment, the dummy wires DM are formed at the uppermost-layer wiring layer. This inhibits or prevents the formation of a step difference such as the step difference DS at the top surface of the insulation film PA at each uppermost layer of the semiconductor chips (CP1 and CP2). From this viewpoint, in each of the semiconductor chips CP1 and CP2, in the region overlapping the insulation sheet ZS, the dummy wires DM are desirably formed so as to prevent the formation of a step difference with a size (height) equal to, or larger than ½ the thickness (height) T1 of the wire M4 at the top surface of the insulation film PA.

Namely, in the present embodiment, in each of the semiconductor chips CP1 and CP2, the dummy wires DM are formed at the uppermost-layer wiring layer. As a result, desirably, in each of the semiconductor chips CP1 and CP2, in the region overlapping the insulation sheet ZS, a step difference with a size (height) equal to, or larger than ½ the thickness (height) T1 of the wire M4 is not formed at the top surface of the insulation film PA.

Incidentally, the thickness (height) T1 of the wire M4, and the size (height) of the step difference at the top surface of the insulation film PA correspond to the dimensions in the thickness direction (the direction generally perpendicular to the main surface of the semiconductor substrate SB) of the wire M4 and the insulation film PA. The wire M4, the pad PD, the coil wire CW, and the dummy wire DM have roughly the same thickness. Accordingly, each thickness (height) of the pad PD, the coil wire CW, and the dummy wire DM is roughly equal to the thickness T1 of the wire M4. The thickness (height) T1 of the wire M4 is shown in FIG. 18, and is equal to the thickness (height) h2 of the metal pattern MP shown in FIG. 37B (T1=h2). The size (h1) of the step difference (DS) of the insulation film PA is shown in FIG. 37B. The size (height) of the step difference at the top surface of the insulation film PA corresponds to the difference in height of the step difference at the top surface of the insulation film PA.

Further, at the top surface of the insulation film PA, a step difference with a size (height) equal to, or larger than ½ the thickness (height) T1 of the wire M4 is not formed. This corresponds to the following: when the thickness T1 of the wire M4 is 3 μm, a step difference with a size (height) of 1.5 μm or more is not formed at the top surface of the insulation film PA; and when the thickness T1 of the wire M4 is 6 μm, a step difference with a size (height) of 3 μm or more is not formed at the top surface of the insulation film PA.

As distinct from the present embodiment, when the dummy wire DM is not formed as in the study example of FIGS. 34 and 35, a step difference DS having a size (height) h1 comparable to the thickness (height) h2 of the metal pattern MP, accordingly, a step difference DS having a size (height) h1 comparable to the thickness (height) T1 of the wire M4 is formed at the top surface of the insulation film PA. In contrast, in the present embodiment, the dummy wires DM were formed. This prevents the formation of a step difference DS having a size h1 comparable to the thickness T1 of the wire at the top surface of the insulation film PA in the region overlapping the insulation sheet ZS. This can result in that, in the region overlapping the insulation sheet ZS, a step difference having a size equal to, or larger than ½ the thickness T1 of the wire M4 is not formed at the top surface of the insulation film PA. This can inhibit or prevent the formation of a gap such as the void VD between the insulation sheet ZS and the insulation film PA. Accordingly, it is possible to inhibit or prevent peeling of the insulation sheet ZS from the semiconductor chips CP1 and CP2. Therefore, it is possible to improve the reliability of the semiconductor device (semiconductor package).

Alternatively, even when a fine step difference is formed at the top surface of the insulation film PA in the region overlapping the insulation sheet ZS, the gap between the insulation sheet ZS and the insulation film PA is less likely to be formed at the position adjacent to the step difference. Therefore, peeling of the insulation sheet ZS is less likely to be caused. For this reason, the reduction of the size (height) of the step difference formed at the top surface of the insulation film PA is also effective for inhibiting or preventing the phenomenon of peeling of the insulation sheet ZS from the semiconductor chips CP1 and CP2. In the present embodiment, by forming the dummy wires DM at the uppermost-layer wiring layer, it is possible to reduce the size (height) of the step difference formed at the top surface of the insulation film PA in the region overlapping the insulation sheet ZS. Preferably, it is possible to make the size (height) of the step difference formed at the top surface of the insulation film PA smaller than ½ the thickness (height) T1 of the wire M4. As a result, it is possible to inhibit or prevent the occurrence of the phenomenon of peeling of the insulation sheet ZS from the semiconductor chips CP1 and CP2. This can improve the reliability of the semiconductor device (semiconductor package).

Further, in the present embodiment, in each of the semiconductor chips CP1 and CP2, the dummy wires DM are desirably formed so as to prevent the formation of a step difference having a size of 2 μm or more at the top surface of the insulation film PA in the region overlapping the insulation sheet ZS. Namely, the dummy wires DM are desirably arranged so as to prevent the formation of a step difference with a size equal to, or larger than ½ the thickness (height) T1 of the wire M4, and to prevent the formation of a step difference with a size (height) of 2 μm r more at the top surface of the insulation film PA in the region overlapping the insulation sheet ZS. In other words, in the present embodiment, in each of the semiconductor chips CP1 and CP2, desirably, the formation of the dummy wires DM results in the following state: at the top surface of the insulation film PA in the region overlapping the insulation sheet ZS, a step difference with a size (height) equal to, or larger than ½ the thickness (height) T1 of the wire M4 is not formed, and a step difference with a size (height) of 2 μm or more is not formed. As a result, regardless of the thickness (height) T1 of the wire M4, it is possible to inhibit or prevent the occurrence of the phenomenon of peeling of the insulation sheet ZS from the semiconductor chips CP1 and CP2 with more precision. This can improve the reliability of the semiconductor device (semiconductor package) with more precision.

Whereas, in the present embodiment, at each uppermost-layer wiring layer of the semiconductor chips (CP1 and CP2), in the region inside the seal ring wire M4a (i.e., the region surrounded by the circulating seal ring wire M4a), the pad PD, the wires M4, the coil wires CW, and the dummy wires DM are arranged. For this reason, by forming the dummy wires DM, it is possible to inhibit or prevent the formation of a step difference such as the step difference DS at the top surface of the insulation film PA in the region inside the seal ring wire M4a in a plan view (i.e., the region surrounded by the circulating seal ring wire M4a in a plan view). From this viewpoint, in the present embodiment, in each of the semiconductor chips CP1 and CP2, the dummy wires DM are formed at the uppermost-layer wiring layer. As a result, desirably, in the region overlapping the insulation sheet ZS, and in the region inside the seal ring wire M4a in a plan view, a step difference with a size (height) equal to, or larger than ½ the thickness (height) T1 of the wire M4 is not formed at the top surface of the insulation film PA. Further, in each of the semiconductor chips CP1 and CP2, the dummy wires DM are formed at the uppermost-layer wiring layer. As a result, further desirably, in the region overlapping the insulation sheet ZS, and in the region inside the seal ring wire M4a in a plan view, at the top surface of the insulation film PA, a step difference having a size equal to, or larger than ½ the thickness T1 of the wire M4 is not formed, and a step difference with a size of 2 μm or more is not formed. As a result, in the region overlapping the insulation sheet ZS, and in the region inside the seal ring wire M4a in a plan view (i.e., the region surrounded by the circulating seal ring wire M4a in a plan view), a step difference such as the step difference DS can be inhibited or prevented from being formed at the top surface of the insulation film PA. This can inhibit or prevent the occurrence of the phenomenon of peeling of the insulation sheet ZS from the semiconductor chips CP1 and CP2. Therefore, it is possible to improve the reliability of the semiconductor device (semiconductor package).

Whereas, in the present embodiment, preferably, in each of the semiconductor chips CP1 and CP2, in the region overlapping the insulation sheet ZS, the dummy wires DM are evenly (uniformly) arranged in the region in which the wire M4 and the coil wire CW are not formed. Namely, in the present embodiment, when the uppermost-layer wiring layer in each of the semiconductor chips CP1 and CP2 includes a region in which the pad PD, the wire M4, and the coil wire CW are not formed, the dummy wires DM are preferably evenly arranged there. As a result, it becomes easy to prevent the formation of a step difference at the top surface of the insulation film PA.

Further, preferably, at the uppermost-layer wiring layer of each of the semiconductor chips CP1 and CP2, the dummy wires DM are arranged so that the distance between the adjacent metal patterns is 4 μm or less. Namely, when the uppermost-layer wiring layer includes a void space such that the distance between the adjacent metal patterns is larger than 4 μm, the dummy wires DM are preferably arranged there. From another viewpoint, the dummy wires DM are preferably arranged so as to prevent the formation of a spot such that the metal pattern is not formed at all within 4 μm from there (the spot) at the uppermost-layer wiring layer of each of the semiconductor chips CP1 and CP2. As a result, it becomes easy to prevent the formation of a step difference at the top surface of the insulation film PA. Herein, the metal patterns are each a pattern formed of the conductive film CD, and includes the pad PD, the wire M4, the coil wire CW, the seal ring wire M4a, and the dummy wire DM.

Figure 40:
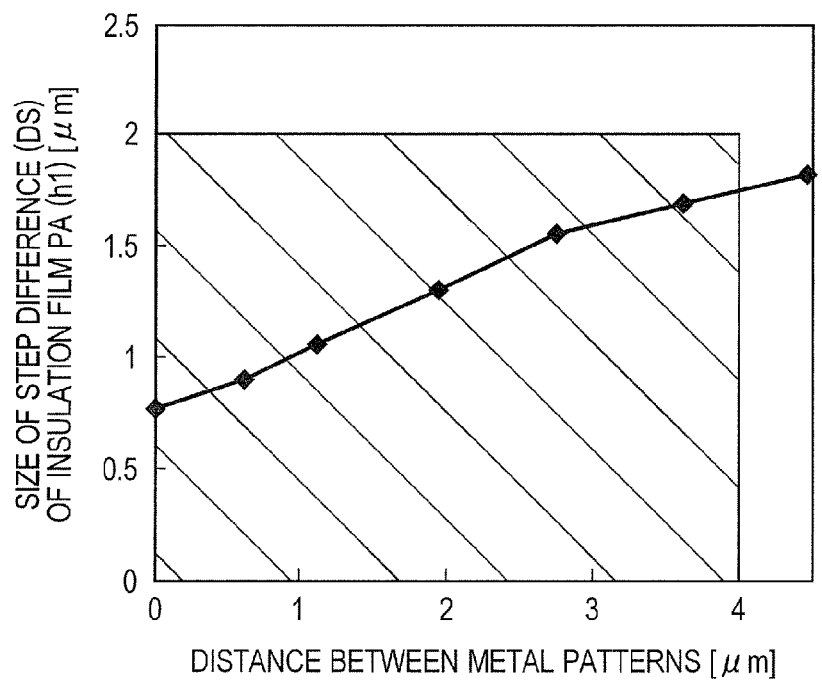
FIG. 40 is a graph showing one example of the correlation between the distance between metal patterns and the size of the step difference of the insulation film.

FIG. 40 is a graph showing one example of the correlation between the distance between metal patterns (i.e., the distance between the adjacent metal patterns) and the size (h1) of the step difference (DS) of the insulation film PA when peeling is not caused at the interface between the insulation film PA and the insulation sheet ZS. As shown in FIG. 40, with an increase in distance between metal patterns (i.e., the distance between the adjacent metal patterns), the size (h1) of the step difference (DS) of the insulation film PA increases. As described above, the size (h1) of the step difference (DS) of the insulation film PA is preferably 2 μm or less. Whereas, the distance between the adjacent metal patterns (i.e., distance between metal patterns) is preferably 4 μm or less. Accordingly, in the graph of FIG. 40, the hatched region is a particularly preferable region.

Whereas, spiral coil wires CW are formed at the uppermost-layer wiring layer. The dummy wire DM is preferably arranged inside each coil wire CW (see FIG. 19). This can inhibit or prevent the formation of a step difference such as the step difference DS at the top surface of the insulation film PA at a position inside the coil wire CW. Whereas, spiral coil wires CW are formed at the uppermost-layer wiring layer. The dummy wires DM are preferably arranged outside the coil wire CW in such a manner as to surround the coil wire CW (see FIG. 19). This can inhibit or prevent the formation of a step difference such as the step difference DS at the top surface of the insulation film PA at a position outside the coil wire CW.

In other words, the spiral coil wire CW is formed at the uppermost-layer wiring layer. Thus, preferably, the dummy wire DM is arranged inside the coil wire CW, and further, the dummy wires DM are arranged outside the coil wire CW in such a manner as to surround the coil wire CW. As a result, in the vicinity of the region including the coil wire CW formed therein, a step difference such as the step difference DS can be inhibited or prevented from being formed at the top surface of the insulation film PA.

When the step difference DS is formed at the top surface of the insulation film PA in the vicinity of the region including the coil wire CW formed therein, the void VD is formed between the insulation sheet ZS and the insulation film PA at a position adjacent to the step difference DS. Thus, peeling of the insulation sheet ZS occurs with the void VD as a starting point. This largely affects the breakdown voltage between the coil wire CW of the semiconductor chip CP1 and the coil wire CW of the semiconductor chip CP2. For this reason, at the uppermost-layer wiring layer, the dummy wire DM is arranged inside the coil wire CW, and further, the dummy wires DM are arranged outside the coil wire CW in such a manner as to surround the coil wire CW. This leads to the prevention of peeling of the insulation sheet ZS in the vicinity of the region including the coil wire CW formed therein. This is particularly effective for improving the breakdown voltage between the coil of the semiconductor chip CP1 and the coil of the semiconductor chip CP2.

Thus, various ideas are implemented in relation to the dummy wire DM. As a result, it is possible to more improve the reliability of the semiconductor device (semiconductor package).

As described above, the present inventors conducted the study as described in the section of the "Regarding the study by the present inventors". This has resultantly led to the introduction of the dummy wire DM. In general, the top surface of the semiconductor chip is not required to have flatness. For this reason, it is not necessary to form a dummy wire for ensuring the flatness of the uppermost-layer insulation film at the uppermost-layer wiring layer of the semiconductor chip. However, the present inventors conducted a study on the following technology: two semiconductor chips are stacked one over another with an insulation sheet interposed therebetween; and the coils respectively formed in the semiconductor chips are magnetically coupled with each other for transmitting signals. Thus, the present inventors have found the following: when the step difference DS is formed at the insulation film (PA) at the uppermost layer of the semiconductor chip, peeling of the insulation sheet (ZS) is caused, incurring a degradation of the reliability of the semiconductor device (semiconductor package). Only because the present inventors have found such a problem, they have noticed the following: it is important to prevent the formation of a step difference such as the step difference DS at the insulation film (PA) at the uppermost layer of the semiconductor chip. This has resultantly led to the formation of the dummy wires DM at the uppermost-layer wiring layer of the semiconductor chip. For this reason, it can be said that the introduction of the dummy wires DM was able to be achieved only because the present inventors noticed the problem.

Further, as distinct from the present embodiment, it is assumed that the primary coil and the secondary coil forming the signal transmitting transformer are formed in the same semiconductor chip. In this case, the potential difference between the primary coil and the secondary coil formed in the same semiconductor chip may be considerably large. Accordingly, a high voltage region and a low voltage region are present in the same semiconductor chip, so that the potential different between both regions may be considerably large. In this case, provision of dummy wires in the semiconductor chip is inadvisable for the following reason: provision thereof reduces the breakdown voltage between the high voltage region and the low voltage region present in the same semiconductor chip, leading to the degradation of the reliability of the semiconductor chip.

In contrast, in the present embodiment, the primary coil and the secondary coil forming a signal transmitting transformer are formed in different semiconductor chips. Accordingly, the primary coil and the secondary coil magnetically coupled with each other, and largely different in potential from each other are not present in the same semiconductor chip. For this reason, even when dummy wires DM are formed in the semiconductor chip, the degradation of the reliability of the semiconductor chip is not caused.

Whereas, in the present embodiment, the coil CL1a and the coil CL2a are formed in the semiconductor chip CP1, and the coil CL1b and the coil CL2b are formed in the semiconductor chip CP2. The coil CL1a of the semiconductor chip CP1 and the coil CL1b of the semiconductor chip CP2 are magnetically coupled with each other. The coil CL2a of the semiconductor chip CP1 and the coil CL2b of the semiconductor chip CP2 are magnetically coupled with each other. Namely, the signal transmission paths between the semiconductor chip CP1 and the semiconductor chip CP2 are only the paths through the magnetically coupled (inductively coupled) coils, and include two lines of the path through the coils CL1a and CL1b, and the path through the coils CL2a and CL2b.

However, the signal transmission path (the transmission paths through the magnetically coupled coils) between the semiconductor chip CP1 and the semiconductor chip CP2 are not limited to the two lines. For example, in the semiconductor chip CP1, the formation of the coil CL2a is omitted; and in the semiconductor chip CP2, the formation of the coil CL2b is omitted; thus, the coil CL1a of the semiconductor chip CP1 and the coil CL1b of the semiconductor chip CP2 are magnetically coupled with each other; as a result, signals are transmitted through the magnetically coupled coils CL1a and CL1b between the semiconductor chip CP1 and the semiconductor chip CP2. In this case, the signal transmission path (the transmission path through the magnetically coupled coils) between the semiconductor chip CP1 and the semiconductor chip CP2 is one line. Alternatively, the following is also possible: in the semiconductor chip CP1, three or more coils are formed; and in the semiconductor chip CP2, three or more coils are formed; thus, each coil in the semiconductor chip CP1 and each coil in the semiconductor chip CP2 are magnetically coupled with each other; as a result, signals are transmitted between the semiconductor chip CP1 and the semiconductor chip CP2 via the magnetically coupled coils. In this case, the signal transmission paths (the transmission paths through the magnetically coupled coils) between the semiconductor chip CP1 and the semiconductor chip CP2 include three or more lines.

Second Embodiment

Figure 41:
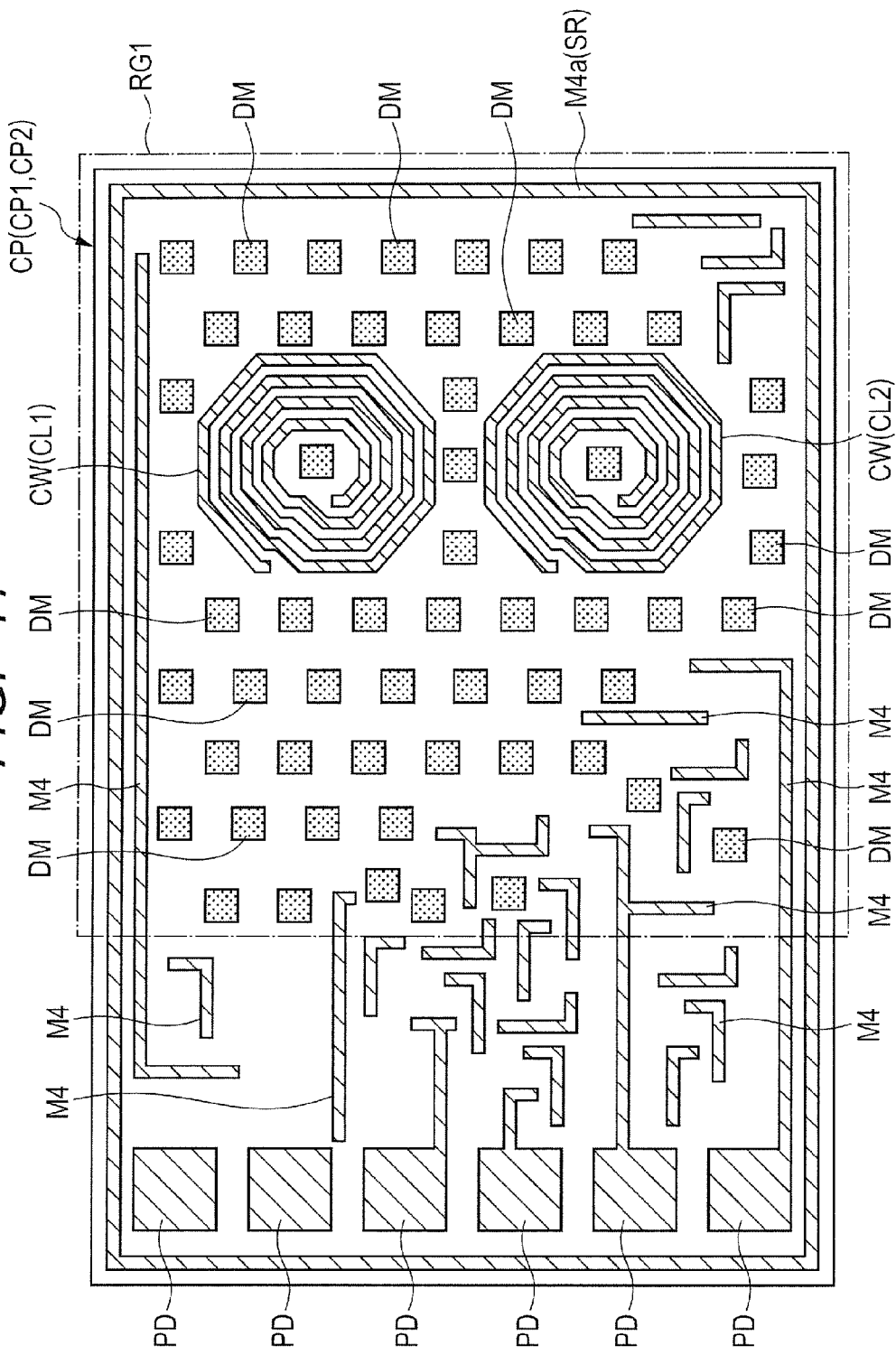
FIG. 41 is a plan view of a semiconductor chip of another embodiment.

FIG. 41 is a plan view of a semiconductor chip (semiconductor device) CP of the present Second Embodiment, and corresponds to FIG. 19 of First Embodiment. As in FIG. 19, FIG. 41 shows metal patterns at the uppermost-layer wiring layer in the semiconductor chip CP. For ease of understanding of the drawing, the metal patterns at the uppermost-layer wiring layer are hatched even in a plan view. However, as in FIG. 19, also in FIG. 41, in order to make the dummy wires DM distinguishable, of the metal patterns at the uppermost-layer wiring layer, only the dummy wires DM are shown with a dotted hatching, and others are given oblique hatching.

The present Second Embodiment is different from the First Embodiment in the following respects.

Namely, in the First Embodiment, as also shown in FIG. 19, at the uppermost-layer wiring layer of the semiconductor chip CP (accordingly, at each of respective uppermost-layer wiring layers of the semiconductor chips CP1 and CP2), the dummy wires DM were formed in both the region overlapping and the region not overlapping the insulation layer ZS in a plan view.

In contrast, in the present Second Embodiment, as also shown in FIG. 41, at the uppermost-layer wiring layer of the semiconductor chip CP (accordingly, at each of respective uppermost-layer wiring layers of the semiconductor chips CP1 and CP2), the dummy wires DM are formed in the region overlapping the insulation layer ZS in a plan view. However, the dummy wires DM are not formed in the region not overlapping the insulation layer ZS in a plan view. Namely, of the metal patterns at the uppermost-layer wiring layer shown in FIG. 19, the dummy wires DM arranged in the region not overlapping the insulation layer ZS in a plan view are eliminated. The resulting figure corresponds to FIG. 41.

Incidentally, in FIG. 41, of the semiconductor chip CP (semiconductor chip CP1 or CP2), the region RG1 overlapping the insulation sheet ZS is surrounded and indicated by an alternate long and short dash line. In FIG. 41, the dummy wires DM are arranged in the region RG1 overlapping the insulation sheet ZS. Whereas, the dummy wire DM is not arranged in the region not overlapping the insulation sheet ZS (i.e., other regions than the region RG1 overlapping the insulation sheet ZS).

Other than this, the present Second Embodiment is basically identical with the First Embodiment, and hence a repeated description thereon will be omitted.

In the present Second Embodiment, at each uppermost-layer wiring layer of the semiconductor chips CP (CP1 and CP2), while the dummy wires DM are formed in the region overlapping the insulation layer ZS in a plan view, the dummy wire DM is not formed in the region not overlapping the insulation layer ZS in a plan view. For this reason, in the present Second Embodiment, at the top surface of the insulation film PA at each uppermost layer of the semiconductor chips (CP1 and CP2), a step difference such as the step difference DS is formed in the region not overlapping the insulation sheet ZS. This however does not lead to the formation of the void VD between the insulation sheet ZS and the insulation film PA. Therefore, peeling of the insulation sheet ZS is not caused. Then, the dummy wires DM formed in the region overlapping the insulation layer ZS in a plan view at each uppermost-layer wiring layer of the semiconductor chips CP (CP1 and CP2) are common between the present Second Embodiment and the First Embodiment. For this reason, also in the present Second Embodiment, the dummy wires DM are formed in the semiconductor chips CP (semiconductor chips CP1 and CP2). As a result, as with the First Embodiment, it is possible to inhibit or prevent the formation of a step difference such as the step difference DS at the top surface of the insulation film PA in the region overlapping the insulation sheet ZS. This can provide roughly the same effects as in First Embodiment.

In the present Second Embodiment, in addition to the effects obtainable in the First Embodiment, the following effects can also be further obtained.

Namely, in the present Second Embodiment, at each uppermost-layer wiring layer of the semiconductor chips CP (CP1 and CP2), the dummy wires DM are not formed in the region not overlapping the insulation layer ZS in a plan view. For this reason, it is possible to reduce the parasitic capacitance formed at the pad PD or the wire M4 due to the dummy wire DM. The parasitic capacitance can be reduced, which can make delay of signal transmission less likely to be caused. As a result of this, and the like, it becomes possible to more improve the performances of the semiconductor device.

Third Embodiment

Figure 42:
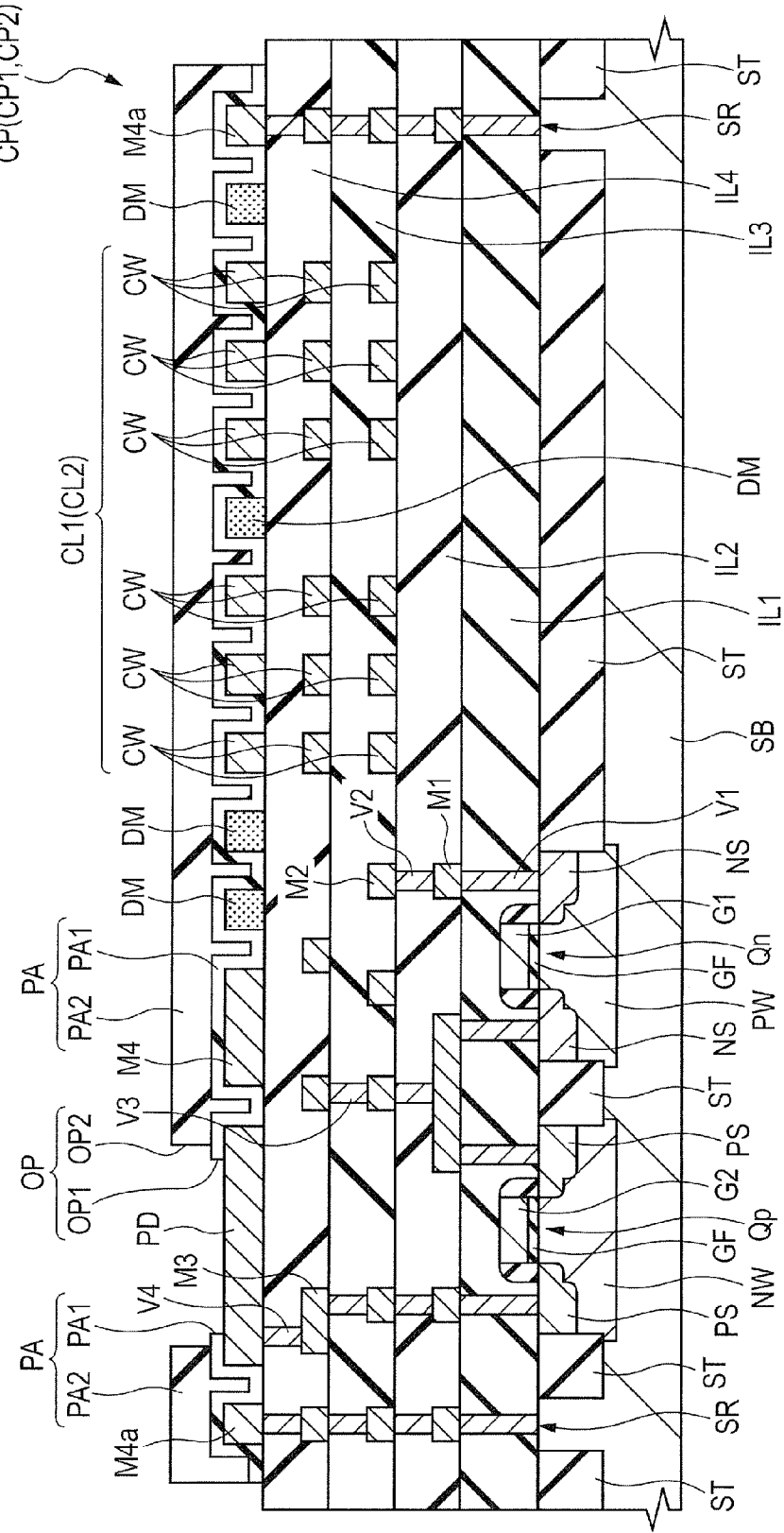
FIG. 42 is a cross sectional view of the semiconductor chip of the another embodiment.
Figure 43:
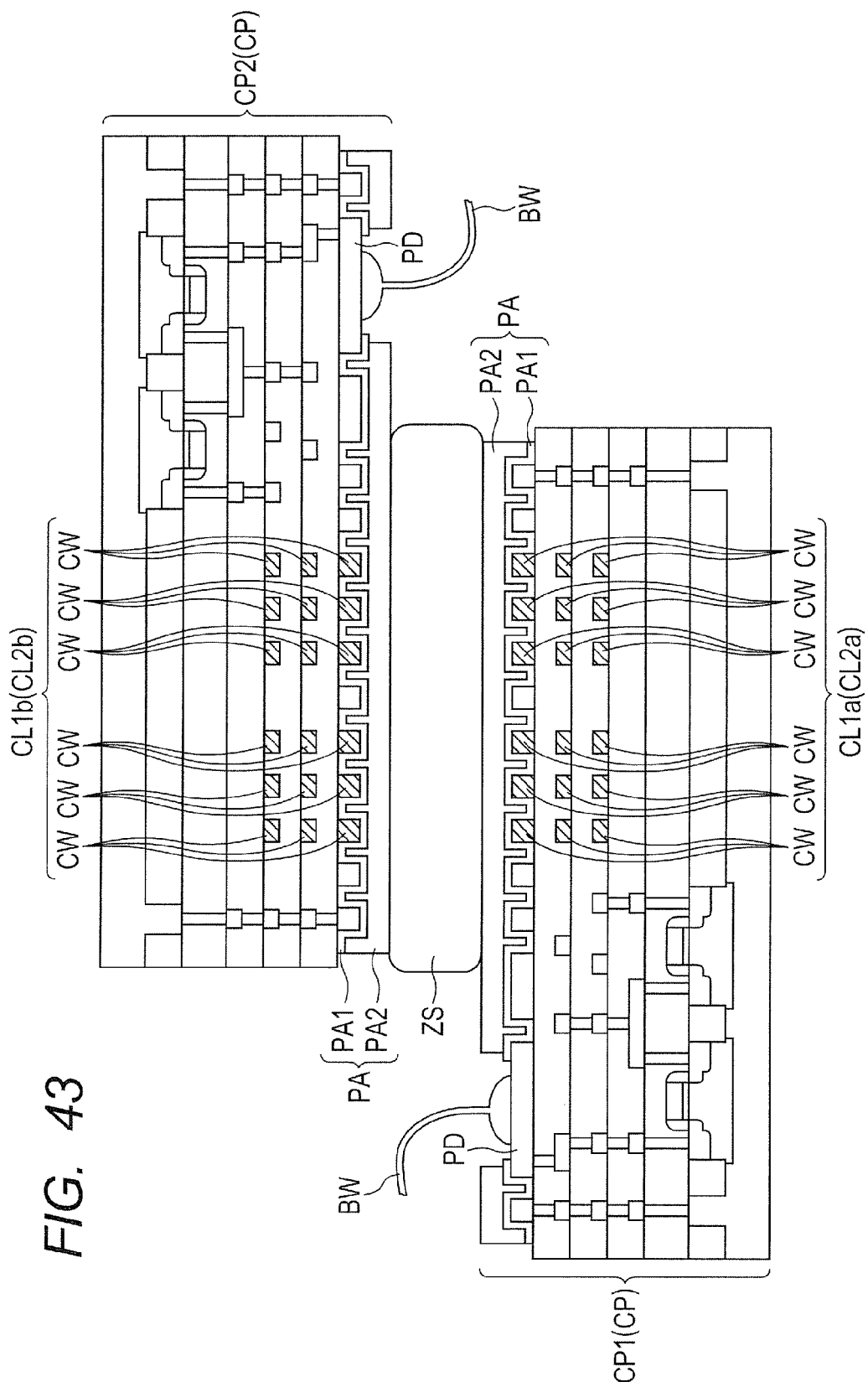
FIG. 43 is a partially enlarged cross sectional view showing a part of the semiconductor package on an enlarged scale when the semiconductor chip of FIG. 42 is applied to the semiconductor chip of the semiconductor package of FIG. 9.

FIG. 42 is a cross sectional view of a semiconductor chip (semiconductor device) CP of the present Third Embodiment, and corresponds to FIG. 18 of the First Embodiment. As in FIG. 18, also in FIG. 42, in order to make the dummy wires DM distinguishable, only the dummy wires DM are shown with a dotted hatching. FIG. 43 is a partially enlarged cross sectional view showing a part of the semiconductor package on an enlarged scale when the semiconductor chip CP of the present Third Embodiment shown in FIG. 42 is applied to the semiconductor chip of the semiconductor package PKG of FIG. 9, and corresponds to FIG. 33 of the First Embodiment. As shown in FIG. 43, two semiconductor chips CP1 and CP2 are stacked one over another with the insulation sheet ZS interposed therebetween. To each cross sectional structure of the semiconductor chips CP1 and CP2, the cross sectional structure of the semiconductor chip CP of the present Third Embodiment of FIG. 42 is applied. Incidentally, in FIG. 43, for ease of understanding of the drawing, each coil wire CW formed in the semiconductor chips CP1 and CP2 is indicated with a black solid fill, and other hatchings are omitted.

The present Third Embodiment is different from the First Embodiment in the following respects.

Namely, in the First Embodiment, as also shown in FIGS. 18 and 33, in each semiconductor chip CP (CP1 or CP2), the coil wire CW forming each coil (CL1 or CL2) was formed at the uppermost-layer wiring layer.

In contrast, in the present Third Embodiment, as also shown in FIGS. 42 and 43, in each semiconductor chip CP (CP1 or CP2), the coil wires CW forming the coil (CL1 or CL2) are formed at a plurality of wiring layers. In the case of FIGS. 42 and 43, the coil wires CW are formed at a total of three layers of wiring layers of the fourth wiring layer of the uppermost-layer wiring layer, the underlying third wiring layer, and the underlying second wiring layer, respectively. The three layers of coil wires CW form the coils CL1 and CL2, respectively. Incidentally, the three layers of coil wires CW can be coupled to one another through the via parts V4 and V3.

Namely, in the First Embodiment, in each semiconductor chip CP (CP1 or CP2), each of the coils CL1 and CL2 was formed of the wires (coil wires CW) formed at the uppermost-layer wiring layer. In contrast, in the present Third Embodiment, in each semiconductor chip CP (CP1 or CP2), each of the coils CL1 and CL2 is formed of the wires (coil wires CW) formed at a plurality of wiring layers.

Incidentally, in the present Third Embodiment, the number of wiring layers forming the coil wires CW is not limited to three, and may be desirably two or more. Further, the number of wiring layers formed over the semiconductor substrate SB is not limited to four.

Accordingly, each semiconductor chip CP (CP1 or CP2) has a wiring structure (multilayer wiring structure) including a plurality of wiring layers. However, in the present Third Embodiment, each of the coils CL1 and CL2 is formed of the patterns (coil wires CW) at two or more layers of wiring layers of the plurality of wiring layers forming the wiring structure of each semiconductor chip CP (CP1 or CP2).

Other than this, the present Third Embodiment is basically identical with the First Embodiment, and hence a repeated description thereon will be omitted.

Also in the present Third Embodiment, as with the First Embodiment, with the provision of the dummy wires DM, roughly the same effects as those in the First Embodiment can be obtained.

In the present Third Embodiment, in addition to the effects obtainable in the First Embodiment, the following effects can also be further obtained.

Namely, in the present Third Embodiment, the coil (CL1 or CL2) is formed of the wires (coil wires CW) formed at two or more layers of wiring layers. For this reason, as compared with the case where the coil is formed of the wires (coil wires CW) formed at one layer of wiring layer, the number of turns of the coil can be increased. As a result, it becomes possible to more improve the performances of the semiconductor device. Whereas, when the numbers of turns of the coils are the same, it is possible to reduce the area required for arranging the coils. For this reason, it is possible to achieve the reduction of size (reduction of area) of the semiconductor chip. Further, it is possible to achieve the reduction of size of the semiconductor package. Still further, it is possible to reduce the manufacturing cost of the semiconductor chip, which can further reduce the manufacturing cost of the semiconductor package.

Alternatively, the present Third Embodiment can also be combined with the Second Embodiment.

Fourth Embodiment

Figure 44:
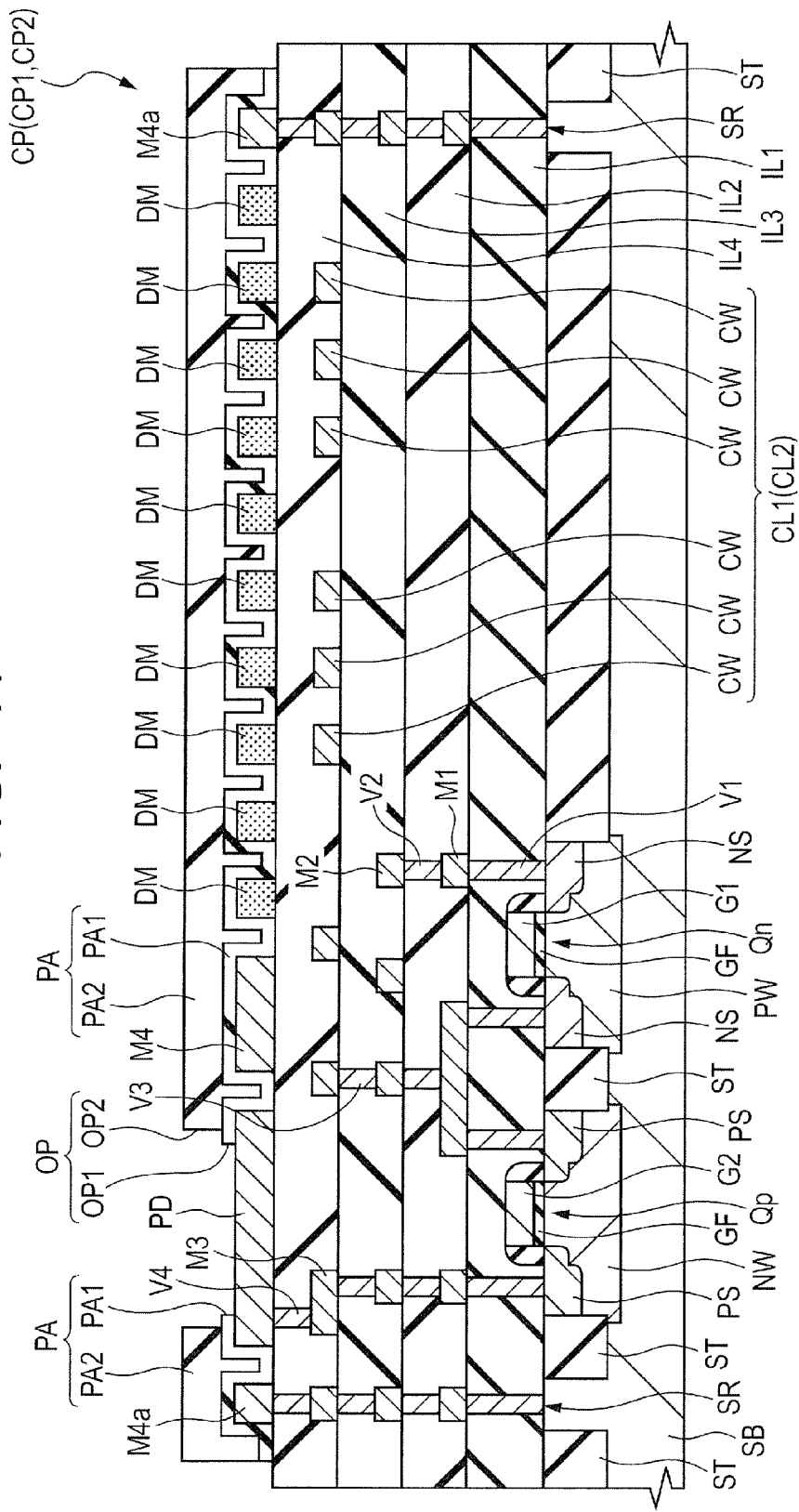
FIG. 44 is a cross sectional view of a semiconductor chip of a still other embodiment.
Figure 45:
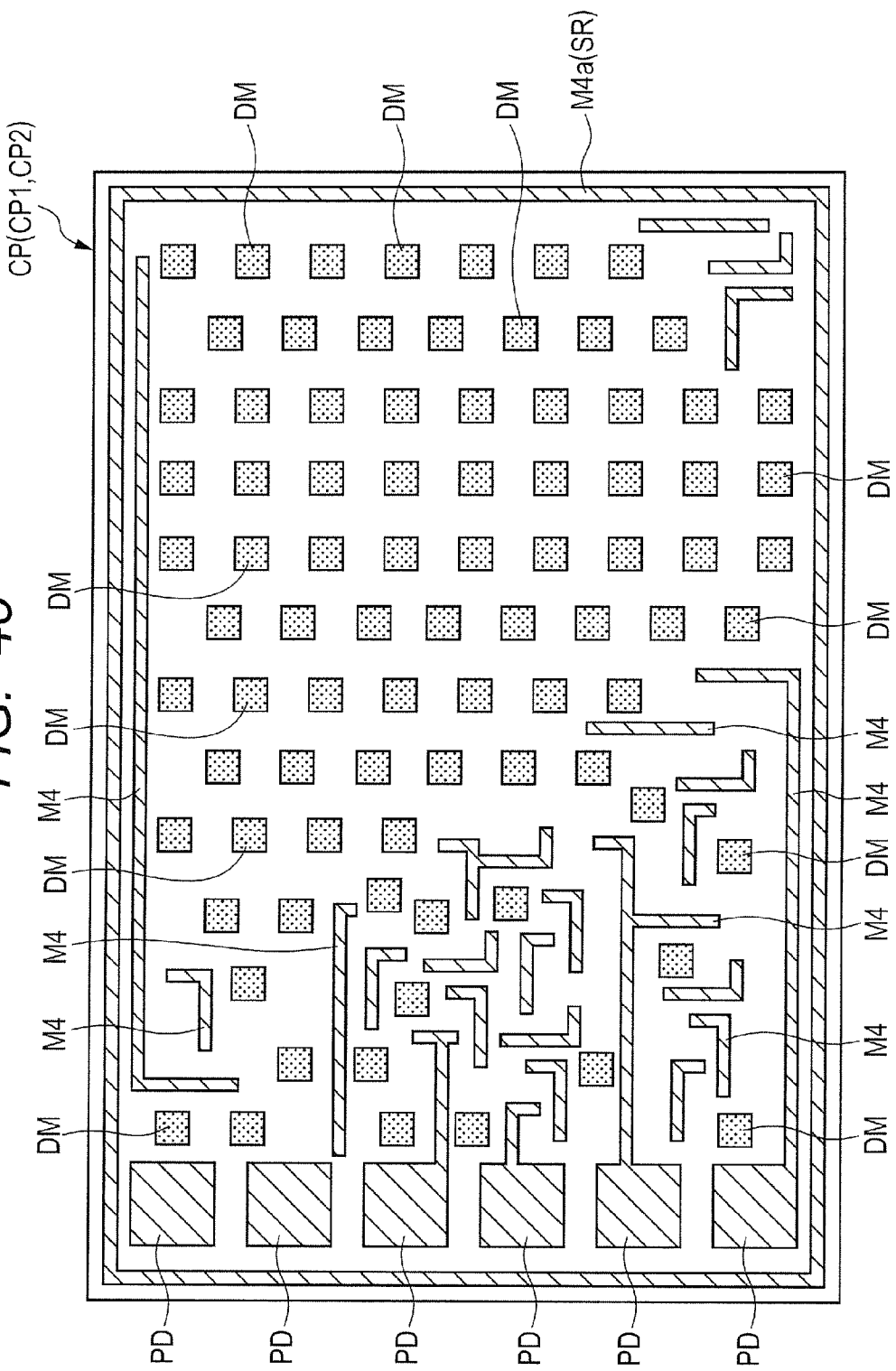
FIG. 45 is a plan view of the semiconductor chip of the the still other embodiment.

FIG. 44 is a cross sectional view of a semiconductor chip (semiconductor device) CP of the present Fourth Embodiment, and corresponds to FIG. 18 of the First Embodiment. FIG. 45 is a plan view of the semiconductor chip CP of the present Fourth Embodiment, and corresponds to FIG. 19 of the First Embodiment. As in FIG. 18, also in FIG. 44, in order to make the dummy wires DM distinguishable, only the dummy wires DM are indicated with a dotted hatching. Further, as with FIG. 19, FIG. 45 shows the metal patterns at the uppermost-layer wiring layer in the semiconductor chip CP. For ease of understanding of the drawing, the metal patterns at the uppermost-layer wiring layer are hatched even in a plan view. However, as in FIG. 19, also in FIG. 45, in order to make the dummy wires DM distinguishable, of the metal patterns at the uppermost-layer wiring layer, only the dummy wires DM are indicated with a dotted hatching, and others are given oblique hatching.

The present Fourth Embodiment is different from the First Embodiment in the following respects.

Namely, in the First Embodiment, as also shown in FIGS. 18 and 19, in each semiconductor chip CP (CP1 or CP2), the coils CL1 and CL2 (the coil wires forming the coils CL1 and CL2) were formed at the uppermost-layer wiring layer.

In contrast, in the present Fourth Embodiment, the semiconductor chip CP (CP1 or CP2) has a wiring structure (multilayer wiring structure) including a plurality of wiring layers. As also indicated from FIGS. 44 and 45, in the semiconductor chip CP (CP1 or CP2), the coils CL1 and CL2 (the coil wires CW forming the coils CL1 and CL2) are formed at a wiring layer below the uppermost-layer wiring layer. Namely, in the present Fourth Embodiment, in the wiring structure (multilayer wiring structure) in the semiconductor chip CP (CP1 or CP2), the coils CL1 and CL2 (coil wires CW) are formed at a layer below the uppermost-layer wiring layer.

In the case of FIG. 44, the coils CL1 and CL2 (coil wires CW) are formed at a wiring layer one layer lower than the uppermost-layer wiring layer (herein, the third wiring layer), but can also be formed at a wiring layer lower than the uppermost-layer wiring layer by two or more layers.

In the present Fourth Embodiment, the coils CL1 and CL2 (coil wires CW) are formed at the wiring layer below the uppermost-layer wiring layer. Accordingly, the coil wires CW are not formed at the uppermost-layer wiring layer as in FIG. 45. Instead, at the uppermost-layer wiring layer, the dummy wires DM are also preferably formed at the position over the coils CL1 and CL2 (the coil wires CW). Namely, the coil wires CW as shown in FIG. 19 are formed at a wiring layer below the uppermost-layer wiring layer in the present Fourth Embodiment. In the region including the coil wires CW formed therein in FIG. 19, the dummy wires DM are formed in the case of FIG. 45.

Other than this, the present Fourth Embodiment is basically identical with the First Embodiment, and hence a repeated description thereon will be omitted.

Also in the present Fourth Embodiment, as with the First Embodiment, with the provision of the dummy wires DM, roughly the same effects as those in the First Embodiment can be obtained.

Further, as in the First Embodiment, when the coils CL1 and CL2 (coil wires CW) are formed at the uppermost-layer wiring layer in the semiconductor chip CP (CP1 or CP2), each thickness of the coils CL1 and CL2 (coil wires CW) can be increased. This can provide an advantage that the resistances of the coils CL1 and CL2 (coil wires CW) can be reduced. This is due to the fact that the thickness of the wire (metal pattern) at the uppermost-layer wiring layer is larger than the thickness of the wire at the wiring layer below the uppermost-layer wiring layer.

On the other hand, when the coils CL1 and CL2 (coil wires CW) are formed at a wiring layer below the uppermost-layer wiring layer in the semiconductor chip CP (CP1 or CP2) as in the present Fourth Embodiment, an advantage can be provided that the breakdown voltage between the coil in the semiconductor chip CP1 and the coil in the semiconductor chip CP2 can be further increased.

Further, the present Fourth Embodiment can also be combined with any one or both of the Second and Third Embodiments.

Up to this point, the invention completed by the present inventors was specifically described by way of embodiments thereof. However, it is naturally understood that the present invention is not limited to the embodiments, and can be variously changed within the scope not departing from the gist thereof.

What is claimed is:
1. A semiconductor device, comprising:
   a first semiconductor chip, comprising:
      a first wiring structure including one or more layers of wiring layers;
      a first coil formed in the first wiring structure; and
      a first insulation film formed over the first wiring structure;

a second semiconductor chip, comprising:
- a second wiring structure including one or more layers of wiring layers;
- a second coil formed in the second wiring structure; and
- a second insulation film formed over the second wiring structure; and an insulation sheet interposed between the first insulation film of the first semiconductor chip and the second insulation film of the second semiconductor chip, wherein the first semiconductor chip and the second semiconductor chip are stacked one over another via the insulation sheet with the first insulation film of the first semiconductor chip and the second insulation film of the second semiconductor chip facing each other, wherein the first coil and the second coil are magnetically coupled with each other, wherein first wires and first dummy wires are formed at a first uppermost-layer wiring layer of an uppermost-layer wiring layer of the first wiring structure, wherein second wires and second dummy wires are formed at a second uppermost-layer wiring layer of an uppermost-layer wiring layer of the second wiring structure, and wherein the first dummy wires are located within and around the first coil, and the second dummy wires are located within and around the second coil.

2. The semiconductor device according to claim 1, wherein a step difference with a size of ½ or more a thickness of a first wire of the first wires is not formed at a top surface of the first insulation film in a region overlapping the insulation sheet, and wherein a step difference with a size of ½ or more a thickness of a second wire of the second wires is not formed at a top surface of the second insulation film in a region overlapping the insulation sheet.

3. The semiconductor device according to claim 2, wherein a step difference with a size of 2 μm or more is not formed at the top surface of the first insulation film in a region overlapping the insulation sheet, and wherein a step difference with a size of 2 μm or more is not faulted at the top surface of the second insulation film in a region overlapping the insulation sheet.

4. The semiconductor device according to claim 1, wherein the first coil and the second coil overlap each other in a plan view.

5. The semiconductor device according to claim 1, wherein the first coil is formed at the first uppermost-layer wiring layer, and wherein the second coil is formed at the second uppermost-layer wiring layer.

6. The semiconductor device according to claim 1, wherein the first dummy wires and the second dummy wires include isolated patterns, respectively.

7. The semiconductor device according to claim 1, wherein the first dummy wires and the second dummy wires include floating potential patterns, respectively.

8. The semiconductor device according to claim 1, wherein the first semiconductor chip includes a first non-facing region not facing the second semiconductor chip, and not overlapping the insulation sheet, and wherein the second semiconductor chip includes a second non-facing region not facing the first semiconductor chip, and not overlapping the insulation sheet.

9. The semiconductor device according to claim 8, wherein a first pad is formed at the first uppermost-layer wiring layer, wherein a second pad is formed at the second uppermost-layer wiring layer, wherein the first pad is arranged in the first non-facing region of the first semiconductor chip, and wherein the second pad is arranged in the second non-facing region of the second semiconductor chip.

10. The semiconductor device according to claim 9, wherein the first dummy wires are arranged in a region overlapping the insulation sheet and in a region not overlapping the insulation sheet at the first uppermost-layer wiring layer, and wherein the second dummy wires are arranged in a region overlapping the insulation sheet and in a region not overlapping the insulation sheet at the second uppermost-layer wiring layer.

11. The semiconductor device according to claim 9, wherein the first dummy wires are arranged in a region overlapping the insulation sheet and are not arranged in a region not overlapping the insulation sheet at the first uppermost-layer wiring layer, and wherein the second dummy wires are arranged in a region overlapping the insulation sheet and are not arranged in a region not overlapping the insulation sheet at the second uppermost-layer wiring layer.

12. The semiconductor device according to claim 9, further comprising:
- a chip mounting part for mounting the first semiconductor chip thereover;
- a first lead and a second lead;
- a first conductive coupling member for electrically coupling the first lead and the first pad of the first semiconductor chip;
- a second conductive coupling member for electrically coupling the second lead and the second pad of the second semiconductor chip; and
- a sealing part for sealing the first semiconductor chip, the second semiconductor chip, the insulation sheet, the chip mounting part, the first conductive coupling member, the second conductive coupling member, a part of the first lead, and a part of the second lead.

13. The semiconductor device according to claim 1, wherein the first dummy wires are evenly arranged in a region not including the first coil and the first wire formed therein in a region overlapping the insulation sheet at the first uppermost-layer wiring layer, and wherein the second dummy wires are evenly arranged in a region not including the second coil and the second wire formed therein in a region overlapping the insulation sheet at the first uppermost-layer wiring layer.

14. The semiconductor device according to claim 1, wherein each of the first insulation film and the second insulation film includes a lamination insulation film.

15. The semiconductor device according to claim 14, wherein each film of respective uppermost layers of the first insulation film and the second insulation film comprises a resin material.

16. The semiconductor device according to claim 15, wherein each of the first insulation film and the second insulation film includes a lamination film of a silicon nitride film and a resin film over the silicon nitride film.

17. The semiconductor device according to claim 1, wherein the first wiring structure includes a plurality of wiring layers, wherein the first coil includes coil wires formed at two or more layers of wiring layers of the plurality of wiring layers forming the first wiring structure, wherein the second wiring structure includes a plurality of wiring layers, and wherein the second coil includes coil wires formed at two or more layers of wiring layers of the plurality of wiring layers forming the second wiring structure.

18. The semiconductor device according to claim 1, wherein the first wiring structure includes a plurality of wiring layers, wherein the first coil is formed at a layer below the first uppermost-layer wiring layer in the first wiring structure, wherein the second wiring structure includes a plurality of wiring layers, and wherein the second coil is formed at a layer below the second uppermost-layer wiring layer in the second wiring structure.

19. The semiconductor device according to claim 1, wherein a signal is transmitted between the first semiconductor chip and the second semiconductor chip via the first coil and the second coil magnetically coupled with each other.

20. The semiconductor device according to claim 1, wherein a bottom surface of the first insulation film is disposed on upper surfaces of the first dummy wires.

* * * * *